United States Patent [19]
Hirose et al.

[11] Patent Number: 5,506,162
[45] Date of Patent: Apr. 9, 1996

[54] METHOD OF PRODUCING A SEMICONDUCTOR INTEGRATED CIRCUIT DEVICE USING A MASTER SLICE APPROACH

[75] Inventors: Yoshio Hirose; Koichi Yamashita; Shigeki Kawahara, all of Kawasaki; Shinji Sato, Atsugi; Takeshi Sasaki, Kawasaki; Ataru Kumagai, Kawasaki, all of Japan

[73] Assignee: Fujitsu Limited, Kawasaki, Japan

[21] Appl. No.: 441,011

[22] Filed: May 15, 1995

Related U.S. Application Data

[63] Continuation of Ser. No. 944,721, Sep. 14, 1992, abandoned, which is a continuation of Ser. No. 797,348, Nov. 25, 1991, abandoned, which is a continuation of Ser. No. 340,543, Apr. 19, 1989, abandoned.

[30] Foreign Application Priority Data

Apr. 22, 1988 [JP] Japan .................................. 63-100631
Jul. 20, 1988 [JP] Japan .................................. 63-180953
Jul. 20, 1988 [JP] Japan .................................. 63-180954

[51] Int. Cl.⁶ .............................................. H01L 21/8238
[52] U.S. Cl. .................................. 437/51; 437/50; 437/195
[58] Field of Search ............................ 437/40, 48, 50, 437/51, 56, 195; 257/202, 210, 211; 364/488, 490, 491

[56] References Cited

U.S. PATENT DOCUMENTS 3,702,025 11/1972 Ancher ........................................ 437/51
3,835,530 9/1974 Kilby .......................................... 437/51
3,861,023 1/1975 Bennett ....................................... 437/8
4,516,312 5/1985 Tomita ........................................ 437/51

(List continued on next page.)

FOREIGN PATENT DOCUMENTS 0314376 5/1989 European Pat. Off. .
2508255 12/1982 France .
3238311 4/1984 Germany .
0051538 3/1983 Japan .
0051537 3/1983 Japan .................................... 437/45

(List continued on next page.)

OTHER PUBLICATIONS

Powell et al., "1.25 Micron CMOSISOS Double level Metal Automated Universal Arrays". IEEE VLSI Multilevel Interconnection conference, 1984 pp. 275–282.
Patent Abstracts of Japan, vol. 10, No. 104 (E–397)(2161) Apr. 19, 1986 corresponding to JP–A–60 242 639 (Fujitsu Ltd.) Dec. 2, 1985.
Patent Abstracts of Japan, vol. 9, No. 65 (E–304)(1788) Mar. 26, 1985 corresponding to JP–A–59 204 254 (Sumitomo Denki Kogyo K.K.) Nov. 19, 1984.
Patent Abstracts of Japan, vol. 10, No. 184 (E–415)(2240) Jun. 27, 1986 corresponding to JP–A–61 030 050 (NEC Corp) Feb. 12, 1986.

Primary Examiner—Tom Thomas
Attorney, Agent, or Firm—Staas & Halsey

[57] ABSTRACT

A semiconductor integrated circuit device provides; a master chip including a basic cell region having a plurality of basic cell arrays arranged thereon, for forming various kinds of circuits. An input/output cell region provides a plurality of input/output cells arranged along the periphery of the basic cell region. A first wiring layer is formed on the basic cell region and the input/output cell region via a first insulation layer and has contact holes at predetermined positions. The first wiring layer includes fixed wirings irrespective of the kind of circuit to be formed. A second wiring layer is formed on the first wiring layer via a second insulation layer having through holes at predetermined positions. The second wiring layer includes programmed wirings to specify the kind of circuit to be formed. Only the wiring pattern of the second wiring layer is suitably changed in accordance with the kind of circuits to be formed and connected among the input/ output cell region, basic cell regions in regions corresponding to the input/output cell regions and the basic cell region, thereby greatly reducing a turnaround time of the device.

12 Claims, 57 Drawing Sheets

U.S. PATENT DOCUMENTS

| | | | |
|---|---|---|---|
| 4,613,941 | 2/1986 | Smith et al. | 364/188 |
| 4,617,193 | 10/1986 | Wu | 437/195 |
| 4,701,777 | 10/1987 | Takayama et al. | 357/45 |
| 4,783,692 | 11/1988 | Uralani . | |
| 4,868,630 | 9/1989 | Tamizuwa | 357/45 |
| 4,893,168 | 1/1990 | Takahashi et al. | 357/68 |
| 4,893,173 | 1/1990 | Tokuda et al. | 357/45 |
| 5,185,283 | 2/1993 | Fukui et al. | 437/51 |

FOREIGN PATENT DOCUMENTS

| | | | |
|---|---|---|---|
| 0200570 | 11/1983 | Japan . | |
| 0220940 | 10/1984 | Japan . | |
| 0022337 | 2/1985 | Japan . | |
| 0144956 | 7/1985 | Japan | 437/45 |
| 2247943 | 12/1985 | Japan . | |
| 0275138 | 11/1988 | Japan . | |
| 2122809 | 1/1984 | United Kingdom . | |
| 2137413 | 10/1984 | United Kingdom . | |

METHOD OF PRODUCING A SEMICONDUCTOR INTEGRATED CIRCUIT DEVICE USING A MASTER SLICE APPROACH

This application is a continuation, of application Ser. No. 07/944,721, filed Sep. 14, 1992, now abandoned, which is a continuation of application Ser. No. 07/797,348, filed Nov. 25, 1991, now abandoned, which is a continuation of application Ser. No. 07/340,543, filed Apr. 19, 1989, now abandoned.

BACKGROUND OF THE INVENTION

1. Field of the Invention

The present invention relates to a technique of utilizing a master slice approach and, more particularly, to a semiconductor integrated circuit device and a method of producing the device using the master slice approach.

A semiconductor integrated circuit or large scale integrated circuit device produced through the master slice approach is hereinafter referred to as a master slice type LSI device.

2. Description of the Related Art

The master slice approach generally comprises a first process of forming a master chip and a second process of forming a desired wiring pattern on the master chip. In the first process, a basic cell region including a plurality of basic cells, each consisting of a predetermined number of transistors, is formed together with an input/output (I/O) cell region on a chip using a common and fixed pattern mask. The second process is carried out in accordance with a specification or conditions demanded by a user and includes a plurality of steps.

In this case, the second process normally includes four steps of: forming contact holes in a first insulation layer formed on the master chip; forming thereon a first wiring Layer; forming through holes in a second insulation layer formed thereon; and forming thereon a second wiring layer so as to contact the first wiring layer via through holes. Therefore, four pattern masks corresponding to the contact hole, first wiring layer, through hole and second wiring layer are required to constitute a given circuit in the basic cell region.

To cope with the above drawbacks, a so-called one custom mask approach has been recently adopted in the wiring patterning process. This one custom mask approach is a method of forming a wiring pattern on the master chip using one layer custom mask (wiring pattern mask according to user's specification). According to the one custom mask approach, since the wiring: pattern mask can be made common to a plurality of master slice type LSI devices, it becomes possible to easily realize the reduction of the turnaround time and the simplification of the process.

SUMMARY OF THE INVENTION

A primary object of the present invention is to provide a master slice type LSI device and a method of producing the device which can greatly reduce a turnaround time.

Another object of the present invention is to apply one custom mask approach to an I/O cell region of a master chip, thereby producing a desired master slice type LSI device easily and in a short period.

Still another object of the present invention is to apply one custom mask approach to a basic cell region of a master chip and utilize an unused region on the basic cell region so as to form a wiring pattern for bypassing a wiring obstruction pattern, thereby producing a desired master slice type LSI device easily and in a short period.

According to a first aspect of the present invention, there is provided a semiconductor integrated circuit device including: a master chip including a plurality of basic cells arrayed thereon, each having a plurality of wiring channels extending along a first direction and a second direction perpendicular to the first direction and including: a pair of electrodes extending in parallel along the second direction; a separation region formed in a region corresponding to a central portion of the electrodes; a p-type impurity region formed on one side of the separation region with respect to the first direction, having a first, second and third regions formed on one side of the electrodes with respect to the second direction, on another side thereof and therebetween, respectively; an n-type impurity region formed on another side of the separation region, having a fourth, fifth and sixth regions formed on one side of the electrodes with respect to the second direction, on another side thereof and therebetween, respectively; and six lead portions formed by a portion of the pair of electrodes, having four lead portions formed in each end portion thereof and two lead portions formed in each central portion thereof; a first insulation layer formed on the master chip, having contact holes positioned on the wiring channels and electrically connected to the four end lead portions and the p-type and n-type impurity regions; a first wiring layer formed on the first insulation layer, including fixed wirings formed along the wiring channels and electrically connected to the contact holes; a second insulation layer formed on the first wiring layer, having through holes positioned on the wiring channels and electrically connected to the fixed wirings; and a second wiring layer formed on the second insulation layer, including wirings programmed along the wiring channels in accordance with demanded conditions of a given circuit and electrically connected to the through holes, Also, according to a second aspect of the present invention, there is provided a semiconductor integrated circuit device comprising: a master chip including a basic cell region having a plurality of basic cell arrays arranged thereon, and an input/output cell region having a plurality of input/output cells arranged along the periphery of the basic cell region; a first wiring layer formed on the basic cell region and the input/output cell region via a first insulation layer having contact holes at predetermined positions; and a second wiring layer formed on the first wiring layer via a second insulation layer having through holes at predetermined positions; wherein the first wiring layer includes fixed wirings in a region corresponding to the input/output cell region, and the second wiring layer includes wirings programmed in accordance with conditions of a given circuit applied to the input/output cell region in a region corresponding to the input/output cell region.

Also, according to a third aspect of the present invention, there is provided a semiconductor integrated circuit device including: a master chip including a basic cell region having a plurality of basic cell arrays arranged thereon and extending along a first direction at a constant space therebetween, and an input/output cell region having a plurality of input/output cells arranged along the periphery of the basic cell region; a first wiring layer formed on the basic cell region and the input/output cell region via a first insulation layer having contact holes at predetermined positions; and a second wiring layer formed on the first wiring layer via a second insulation layer having through holes at predetermined positions; wherein the first wiring layer includes fixed wirings in a region corresponding to the basic cell region, and a bypass wiring region having a predetermined wiring pattern and formed between adjacent basic cells disposed along the first direction in each of the basic cell arrays, and the second wiring layer includes wirings programmed in accordance with conditions of a given circuit applied to the basic cell region in a region corresponding to the basic cell region.

Also, according to the present invention, there is provided a method of producing the device according to each aspect of the present invention.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Figure 1:
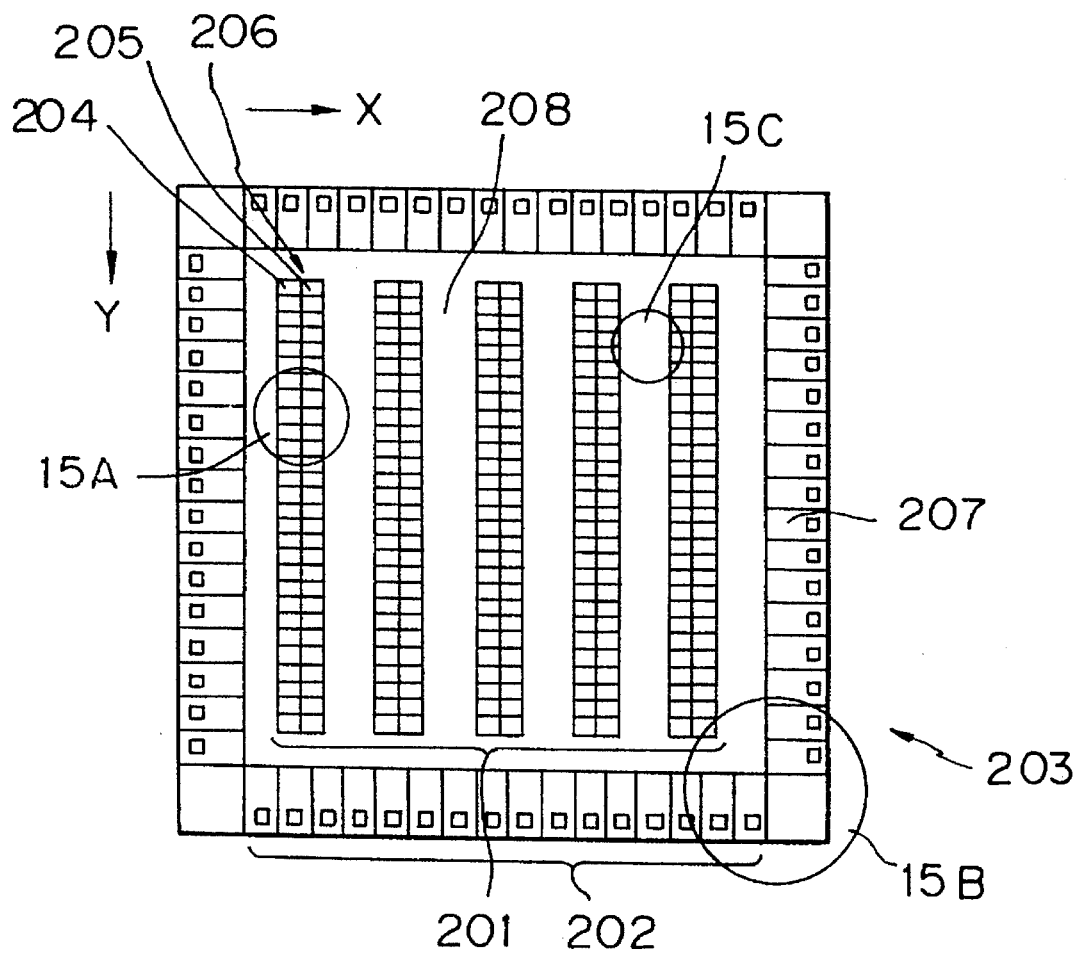
FIGS. 1 is a plan view schematically illustrating a whole constitution of a master chip in the master slice type LSI device of the present invention.

FIG. 1 schematically illustrates a whole constitution of a master chip in the master slice type LSI device of the present invention.

In FIG. 1, reference 201 denotes a basic cell region, which is formed on the central region of a master chip 203 and includes a plurality of basic cell arrays 206 extending along Y direction at a predetermined space therebetween. Each of the basic cell arrays 206 includes a plurality of pairs of basic cells 204, 205, and each pair of basic cells are parallelly disposed along X direction perpendicular to Y direction. Namely, a plurality of basic cells 204, 205 are arranged in the form of a so-called double column structure on the master chip. Reference 202 denotes an I/O cell region, which is formed along the periphery of the master chip 203 and includes a plurality of I/O cells 207. A concrete constitution of each I/O cell will be described later. Reference 208 denotes a wiring channel region formed between adjacent basic cell arrays 206.

Figure 2:
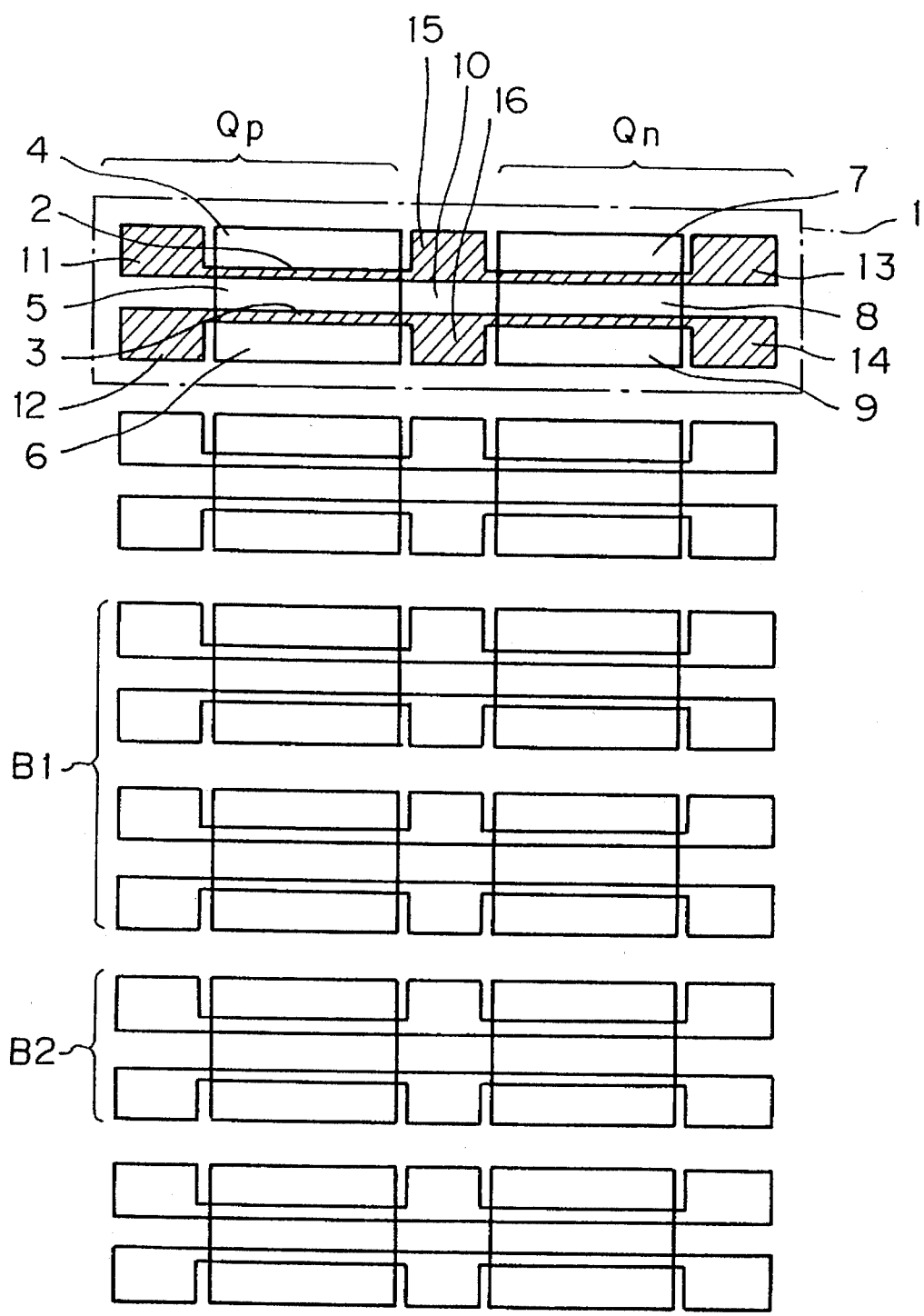
FIG. 2 is a view for explaining a basic cell.

FIG. 2 illustrates a portion of the basic cell array shown in FIG. 1. As shown in FIG. 2, each basic cell 1 (corresponding to the basic cell 204 or 205 in FIG. 1) is constituted by a pair of p-channel transistors Qp connected in series and a pair of n-channel transistors Qn connected in series. One of the p-channel transistors is constituted by a gate electrode 2 and p-type impurity regions 4, 5 serving as a source/drain, and another is constituted by a gate electrode 3 and p-type impurity regions 5, 6 serving as a source/drain. Also, one of the n-channel transistors is constituted by a gate electrode 2 and n-type impurity regions 7, 8 serving as a source/drain, and another is constituted by a gate electrode 3 and p-type impurity regions 8, 9 serving as a source/drain.

Reference 10 denotes a separation region for separating a region on which p-channel transistors are formed from a region on which n-channel transistors are formed. References 11 to 16 denote lead portions used for connecting gate electrodes 2, 3 to each portion of a given logic circuit or gate, which are constituted by a portion of the gate electrodes and formed in each end portion and each central portion, respectively. The lead portions 11 to 16 are hereinafter referred to as gate electrode lead portions. The gate electrode lead portions 11 to 16 and the gate electrodes 2, 3 are composed of, for example, polysilicon. Also, reference B1 indicates a basic block in which the logic circuit or gate is formed, and which is constituted by a pair of basic cells 1 parallelly disposed along a longitudinal (Y) direction. Reference B2 indicates a basic block as well, which is constituted by a single basic cell 1.

Next, preferred embodiments according to the first aspect of the present invention will be explained with reference to FIGS. 3 to 14D.

Figure 3:
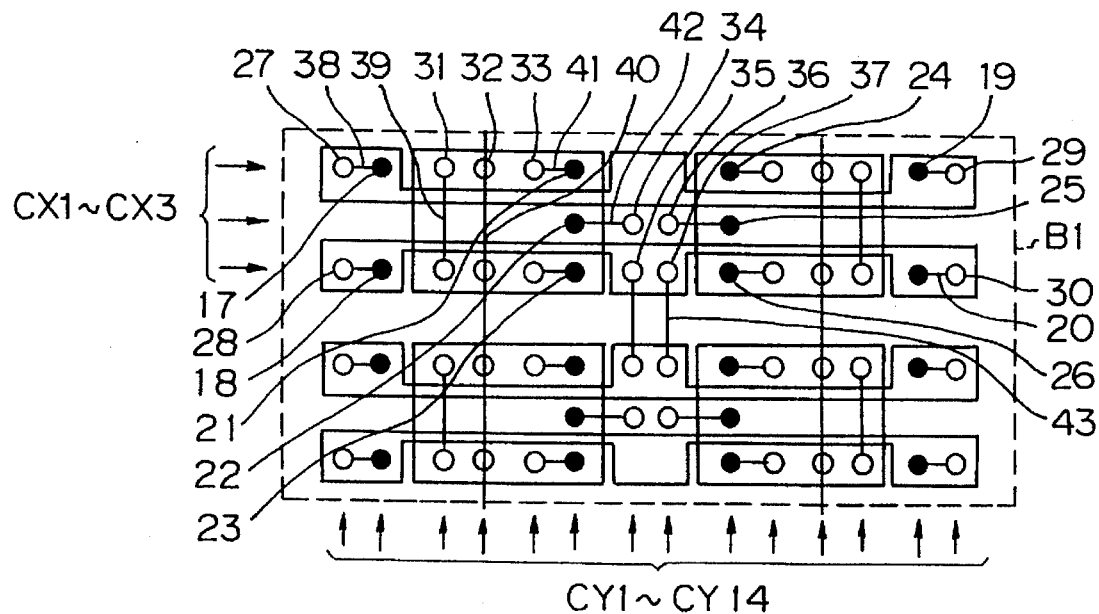
FIG. 3 is a view illustrating a common pattern employed in a first embodiment of the first aspect of the present invention.
Figure 4A:
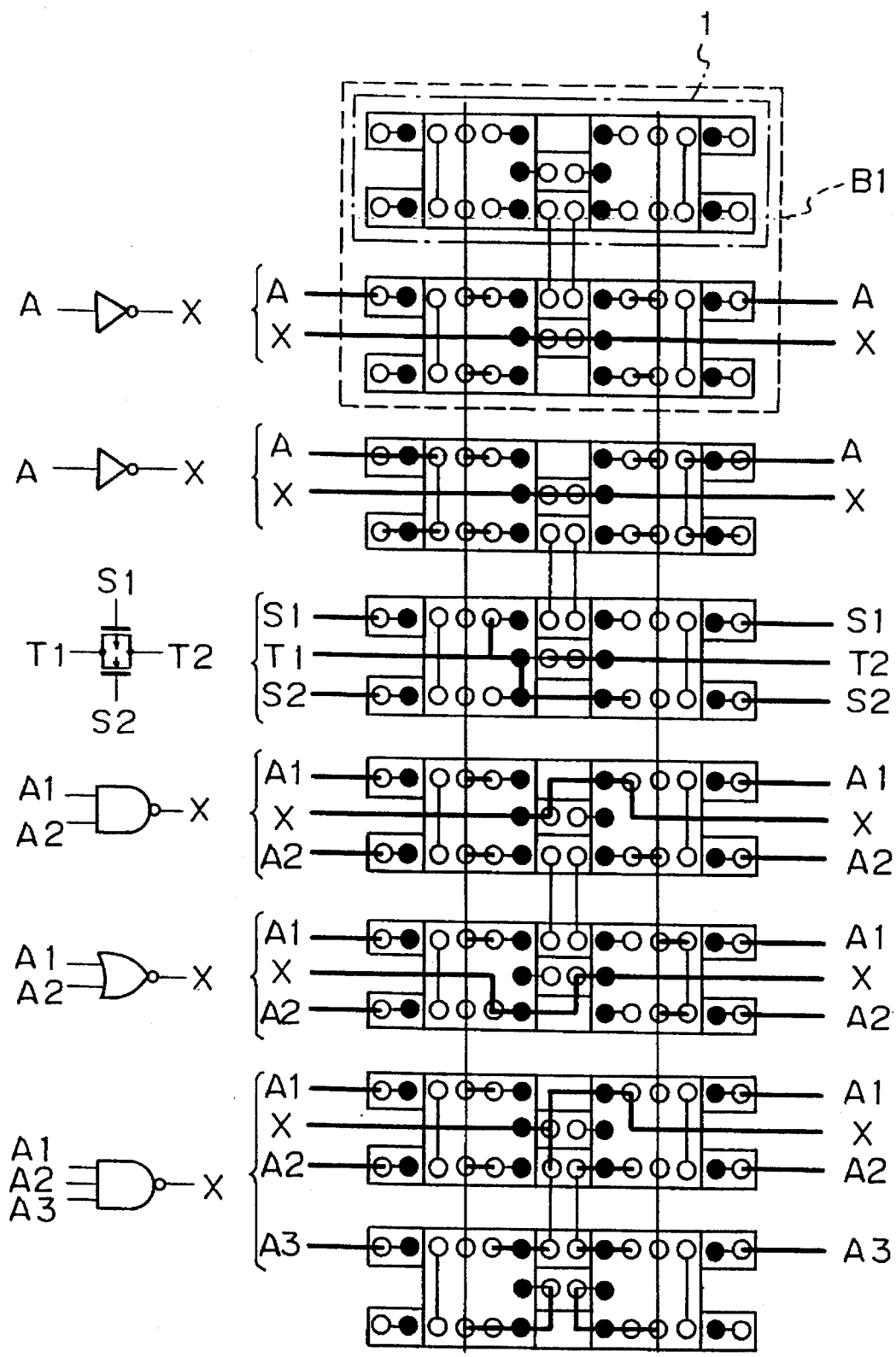
FIGS. 4A to 4C are views illustrating examples of a second wiring layer pattern applied to the common pattern shown in FIG. 3.
Figure 4B:
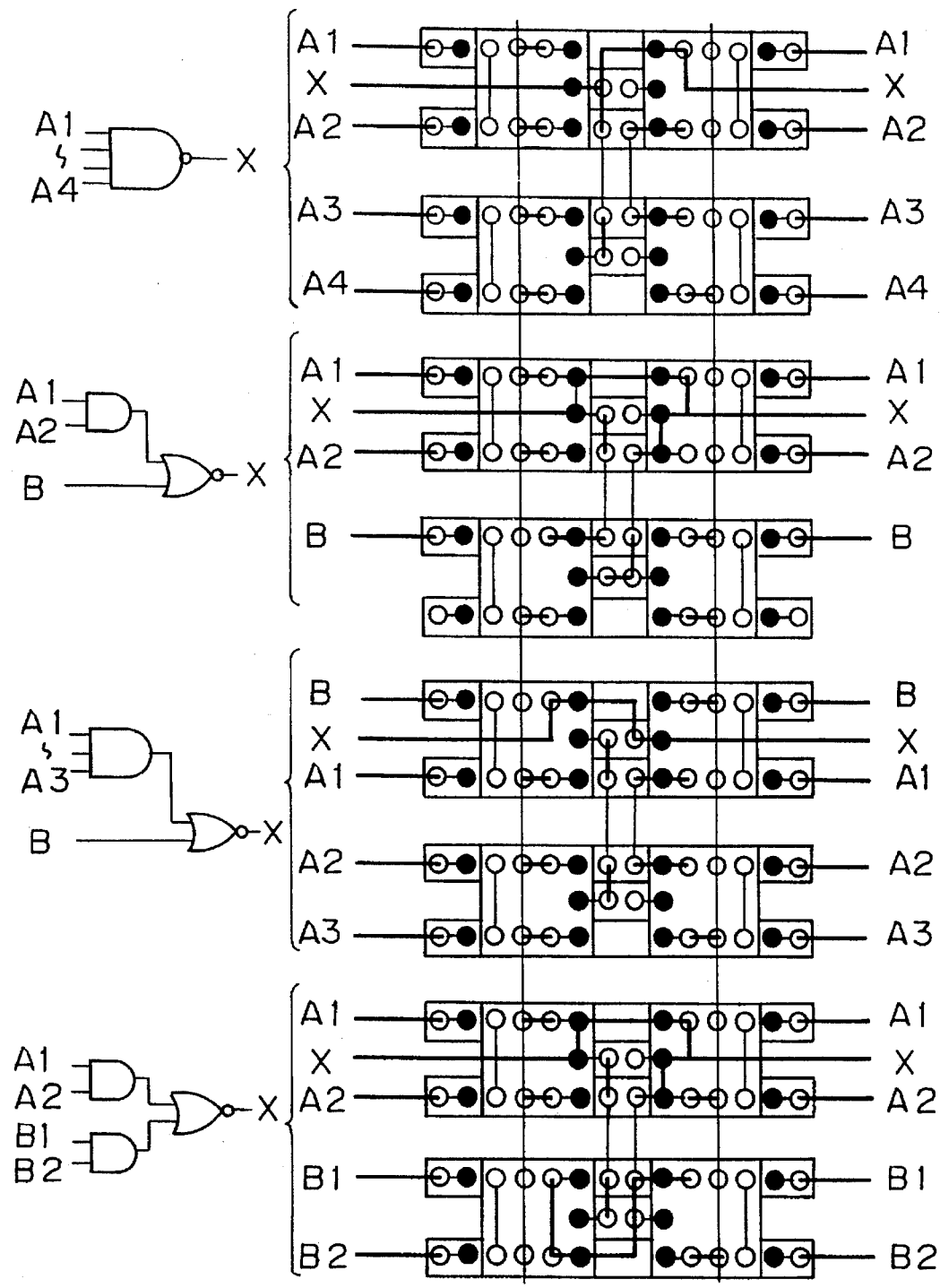
Figure 4C:
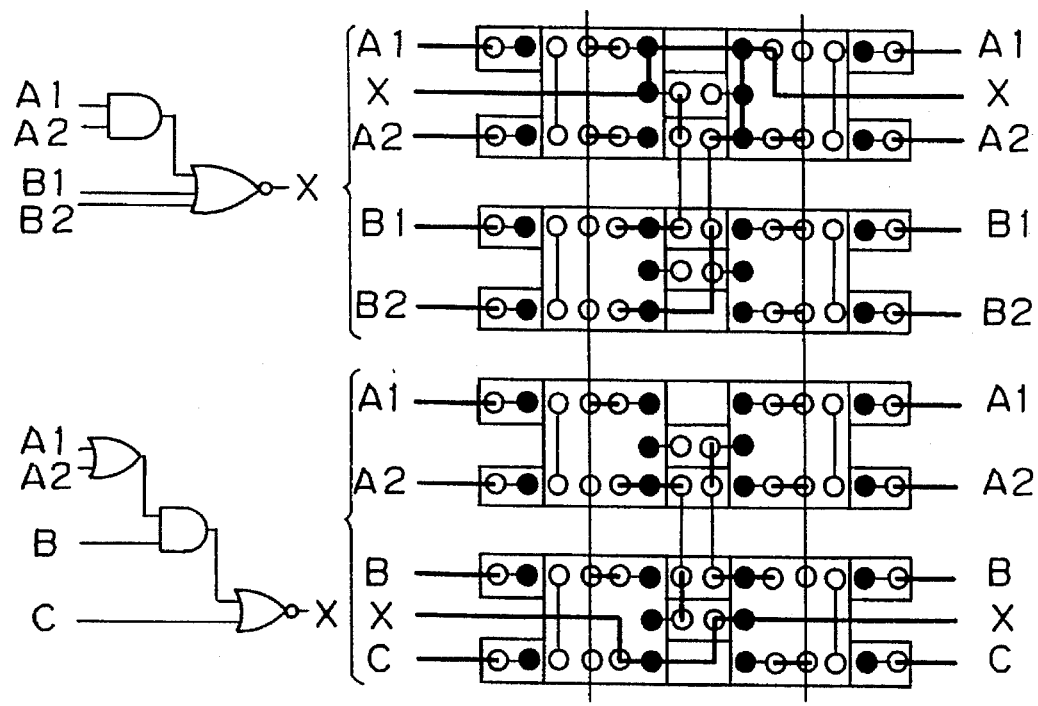

(1) First Embodiment (see FIGS. 3 to 4C)

FIG. 3 illustrates a common pattern employed in the first embodiment of the first aspect. In FIG. 3, solid round marks indicate contact holes formed in the first insulation layer; (thin) solid lines indicate fixed wirings formed in the first wiring layer; and empty round marks indicate through holes formed in the second insulation layer. In the present embodiment, a given logic circuit or gate is constituted with a unit of the basic block B1 consisting of a pair of basic cells.

Note, the manner of each indication of the contact holes, first wiring layer(wirings) and through holes is common to other embodiments and applications described later.

In a wafer process, the common pattern of FIG. 3 is formed by: forming the basic cell array as shown in FIG. 2; forming thereon the first insulation layer consisting of, for example, silicon oxide, by chemical vapor deposition; forming contact holes at predetermined positions of the first insulation layer; forming thereon the first wiring layer including predetermined fixed wirings; forming thereon the second insulation layer consisting of, for example, phosphosilicate glass, by chemical vapor deposition; and forming through holes at predetermined positions of the second insulation layer. Next, the arrangement of each pattern of the contact holes, first wiring layer(wirings) and through holes will be explained.

Referring to FIG. 3, each basic cell is formed on a region defined by three wiring channels CX1~CX3 parallelly extending in parallel along a horizontal (X) direction at a constant space therebetween, hereinafter referred to as horizontal wiring channels, and fourteen wiring channels CY1~CY14 parallelly extending along a vertical (Y) direction at a constant space therebetween, hereinafter referred to as vertical wiring channels. The contact holes, first wiring layer(wirings) and through holes are formed at predetermined positions defined by horizontal wiring channels and vertical wining channels.

As shown in FIG. 3, each pattern of the contact holes, first wiring layer(wirings) and through holes is formed in the symmetrical arrangement with respect to the center of the basic block B1.

Namely, the first insulation layer includes one contact hole 17~26 in each region corresponding to the gate electrode lead portions 11~14 and the impurity regions 4~9, and the second insulation layer includes, one through hole 27~30 in each region corresponding to the gate electrode lead portions 11~14, three through holes 31~33 in each region corresponding to the impurity regions 4, 6, 7, 9, and four through holes 34~37 in a region corresponding to the separation region 10.

Also, the first wiring layer includes: wirings 38, each connecting a contact hole to a through hole in each region corresponding to the gate electrode lead portions 11~14; wirings 39, each connecting a pair of through holes between each region corresponding to the impurity regions 4 and 6, between each region corresponding to the impurity regions 7 and 9, respectively; wirings 40, each connecting another pair of through holes between each region corresponding to the impurity regions 4, 6, between each region corresponding to the impurity regions 7, 9, respectively, and extending along one of the vertical wiring channels CY1~CY14, and mainly serving as a power supply line; wirings 41, each connecting a contact hole to a through hole in each region corresponding to the impurity regions 4, 6, 7, 9; wirings 42, each connecting a contact hole in each region corresponding to the impurity regions 5, 8, respectively, to a corresponding through hole in a region corresponding to the separation region 10; and wirings 43, each connecting another through hole in a region corresponding to the separation region to a corresponding through hole provided in a region corresponding to a separation region included in the adjacent basic cell.

FIGS. 4A to 4C illustrate various examples of the second wiring layer pattern constituting a logic circuit or gate based on the common pattern shown in FIG. 3, together with an equivalent circuit diagram symbolically shown. In each drawing, (thick) solid lines indicate wirings formed in the second wiring layer.

Note, the manner of the indication of the second wiring layer(wirings) is common to other embodiments and applications described later.

As explained above, according to the first embodiment, it is possible to easily realize a desired logic circuit or gate by suitably changing only the second wiring layer pattern in accordance with demanded conditions of a given circuit. Accordingly, the turnaround time of the master slice type LSI device can be greatly reduced.

Figure 5:
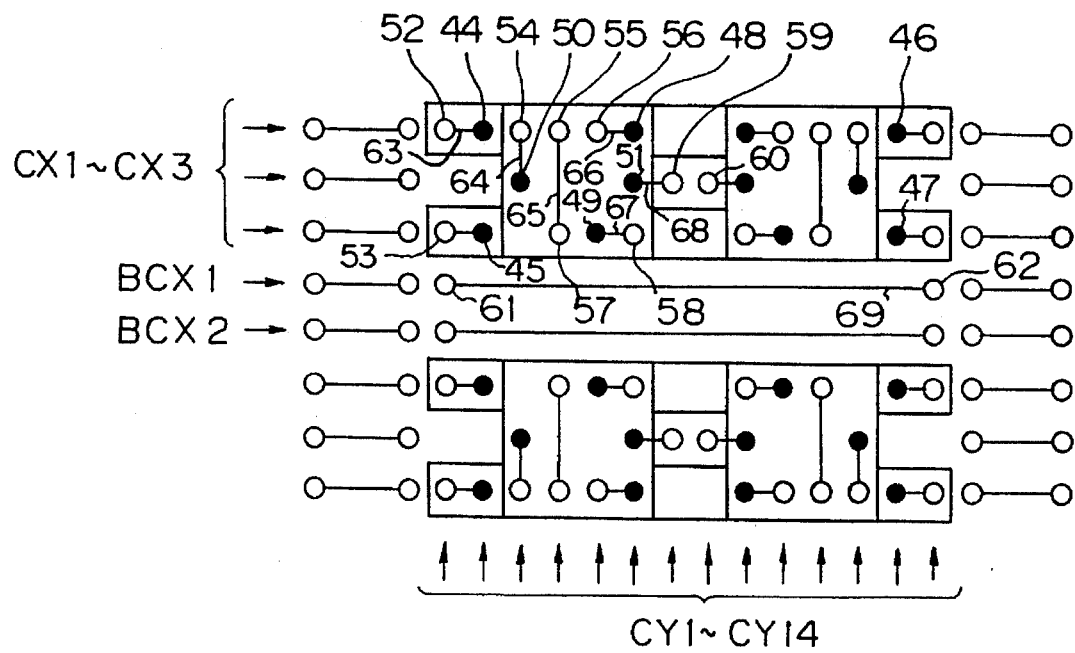
FIG. 5 is a view illustrating a common pattern employed in a second embodiment of the first aspect.
Figure 6A:
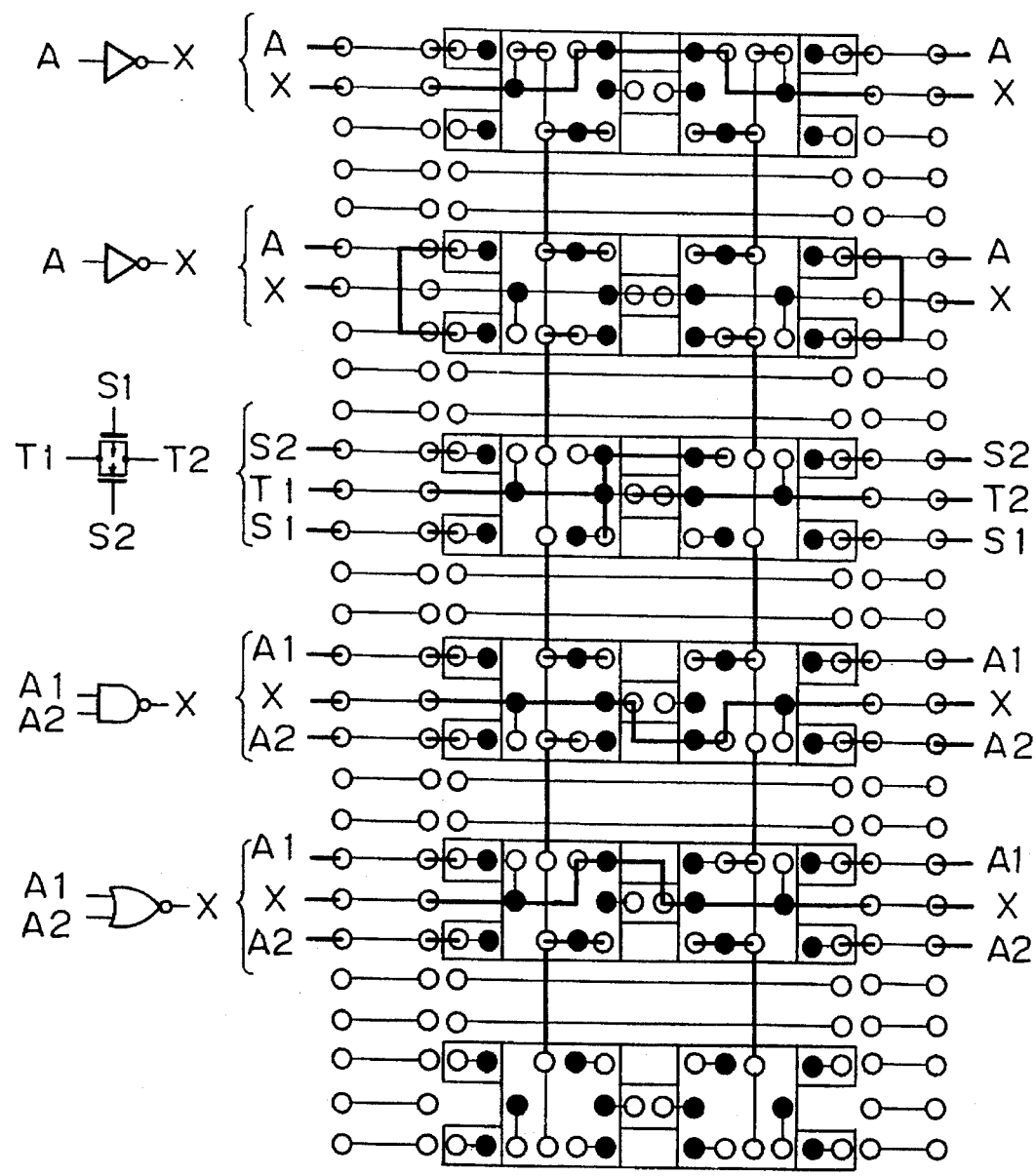
FIGS. 6A to 6D are views illustrating examples of a second wiring layer pattern applied to the common pattern shown in FIG. 5.
Figure 6B:
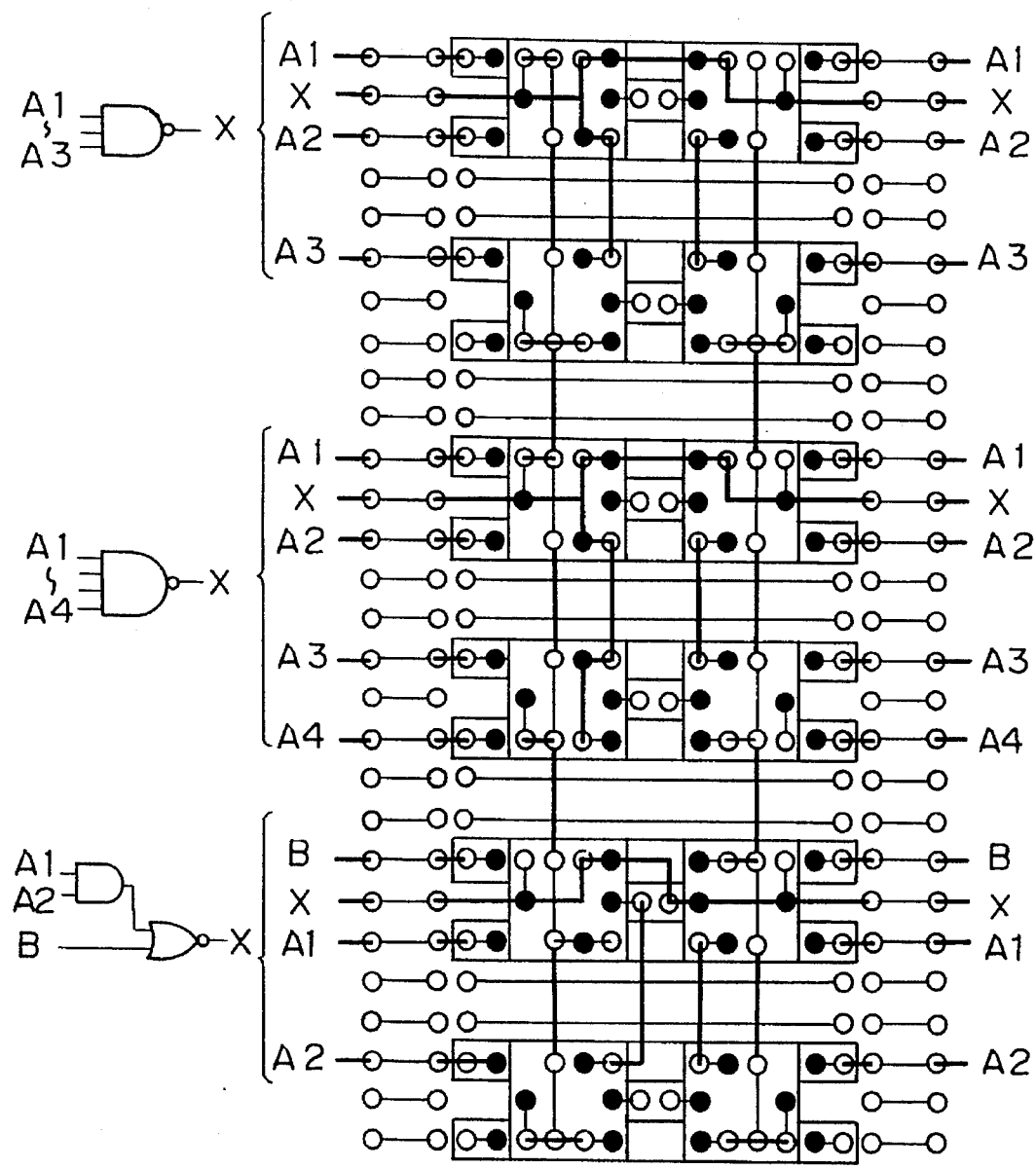
Figure 6C:
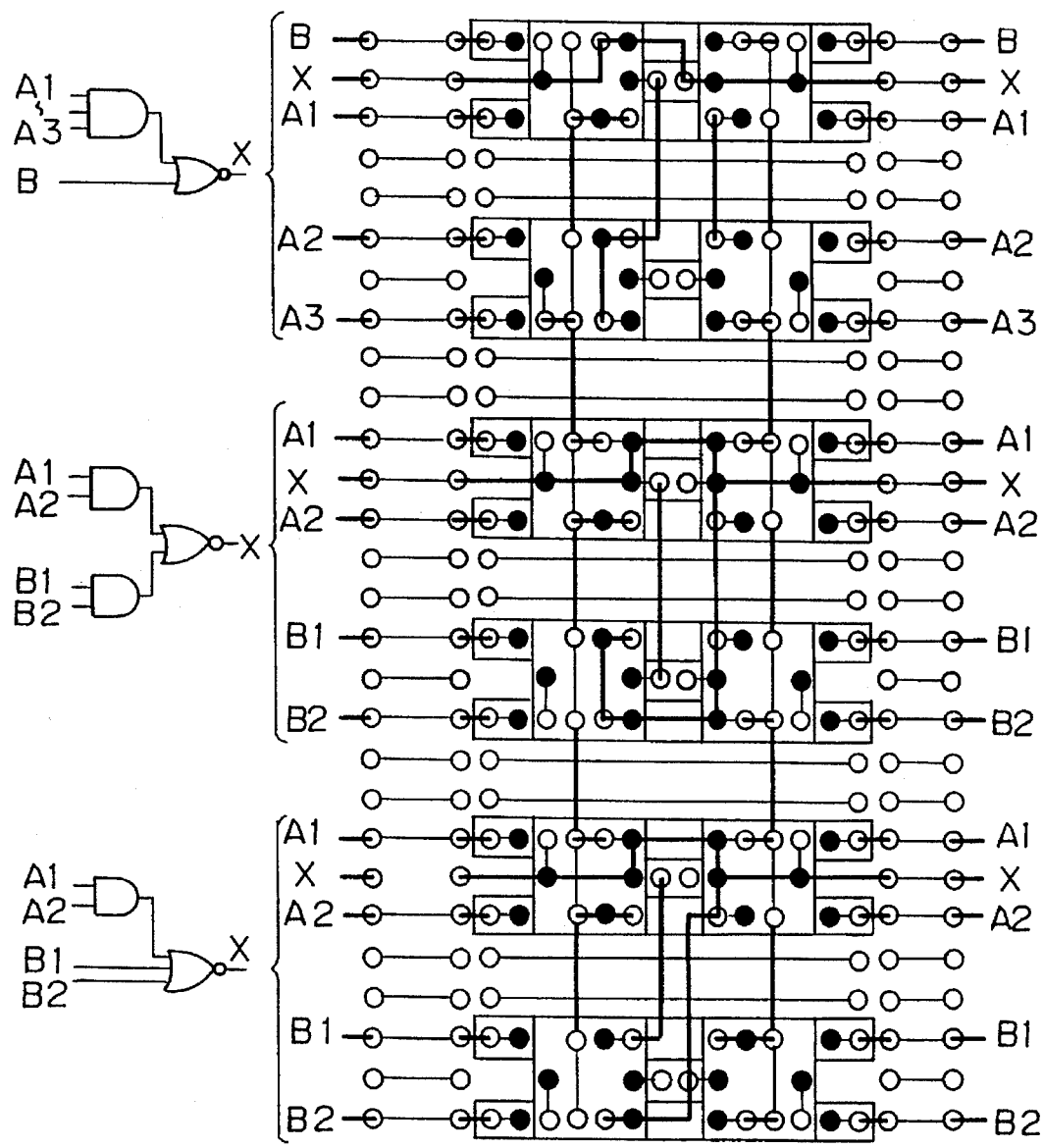
Figure 6D:
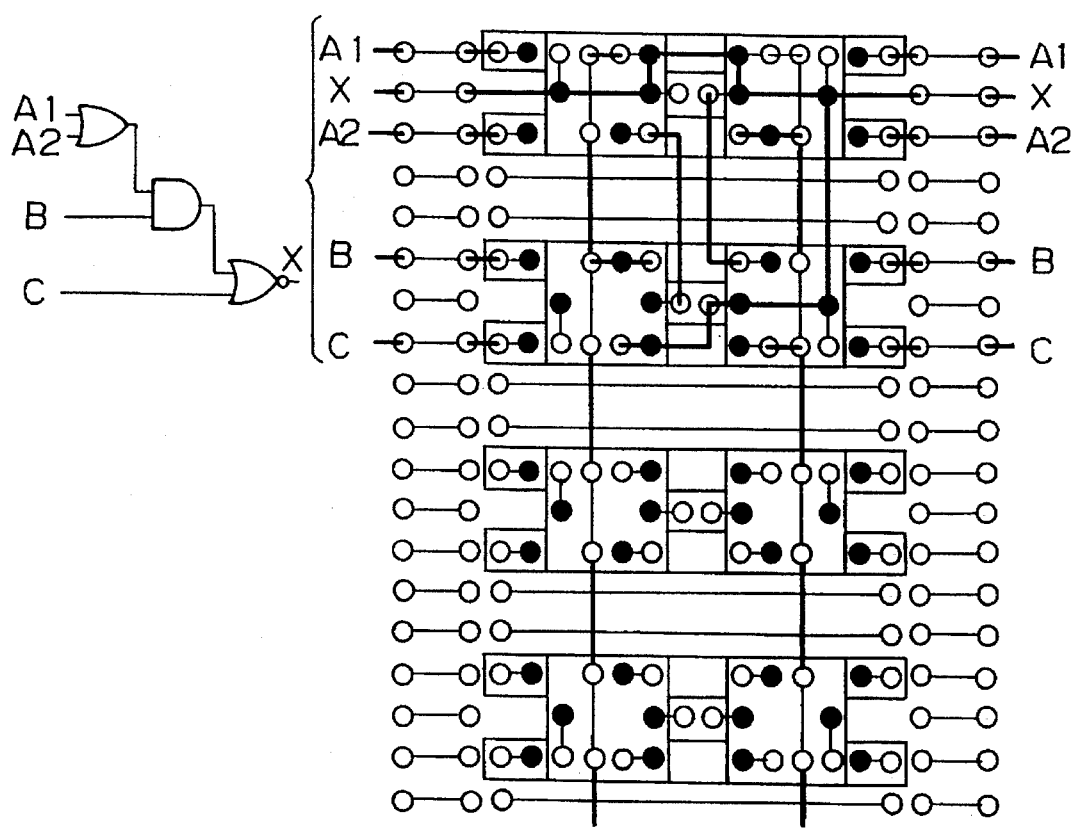

(2) Second Embodiment (see FIGS. 5 to 6D)

FIG. 5 illustrates a common pattern employed in the second embodiment of the first aspect. In the present embodiment, a given logic circuit or gate is constituted with a unit of the basic block B1 as in the first embodiment, and each basic cell is formed on a region defined by three horizontal wiring channels CX1~CX3 and fourteen vertical wiring channels CY1~CY14. The process of forming the illustrated common pattern is the same as that of the first embodiment and, accordingly, the explanation thereof is omitted.

As shown in FIG. 5, each pattern of the contact holes, first wiring layer(wirings) and through holes is formed in a symmetrical arrangement with respect to the center of the basic block B1. Namely, the first insulation layer includes one contact hole 44~49 in each region corresponding to the gate electrode lead portions 11~14 and the impurity regions 4, 6, 7, 9, and two contact holes 50, 51 in each region corresponding to the impurity regions 5, 8. The second insulation layer includes: one through hole 52, 53 in each region corresponding to the gate electrode lead portions 11~14; three through holes 54~56 in each region corresponding to one of the impurity regions 4, 6 and one of the impurity regions 7, 9; two through holes 57, 58 in each region corresponding to another of the impurity regions 4, 6 and another of the impurity regions 7, 9; two through holes 59, 60 in a region corresponding to the separation region 10; and two through holes 61, 62 in a region corresponding to each cell-to-cell wiring channel BCX1, BCX2.

Also, the first wiring layer includes: wirings 63, each connecting a contact hole to a through hole in each region corresponding to the gate electrode lead portions 11~14; wirings 64, each connecting a contact hole in each region corresponding to the impurity regions 5, 8, respectively, to a corresponding through hole in each region corresponding to one of the impurity regions 4, 6 and one of the impurity regions 7, 9; wirings 65, each connecting a pair of through holes between each region corresponding to the impurity regions 4, 6, between each region corresponding to the impurity regions 7, 9, respectively, and extending along one of the vertical wiring channels. CY1~CY14, and mainly serving as a power supply line; wirings 66, 67, each connecting a contact hole to a through hole in each region corresponding to the impurity regions 4, 6, 7, 9; wirings 68, each connecting a contact hole in each region corresponding to the impurity regions 5, 8, respectively, to a corresponding through hole in a region corresponding to the separation region 10; and wirings 69, each connecting two through holes provided in a region corresponding to each cell-to-cell wiring channel.

FIGS. 6A to 6D illustrate various examples of the second wiring layer pattern constituting a logic circuit or gate based on the common pattern shown in FIG. 5, together with an equivalent circuit diagram symbolically shown.

The second embodiment has the same advantage as in the first embodiment, i.e., reduction of the turnaround time, plus the following advantages:

Since the cell-to-cell wiring channels BCX1, BCX2 extending parallelly to the horizontal wiring channels CX1~CX3 are provided between adjacent basic cells, and two through holes 61, 62 and the wiring 69 are provided along each cell-to-cell wiring channel, the wiring 69 can be utilized as a signal line extending in the horizontal direction. As a result, it is possible to easily effect a connection between basic cells disposed in the horizontal direction. This enables formation of a large scale circuit.

Figure 7:
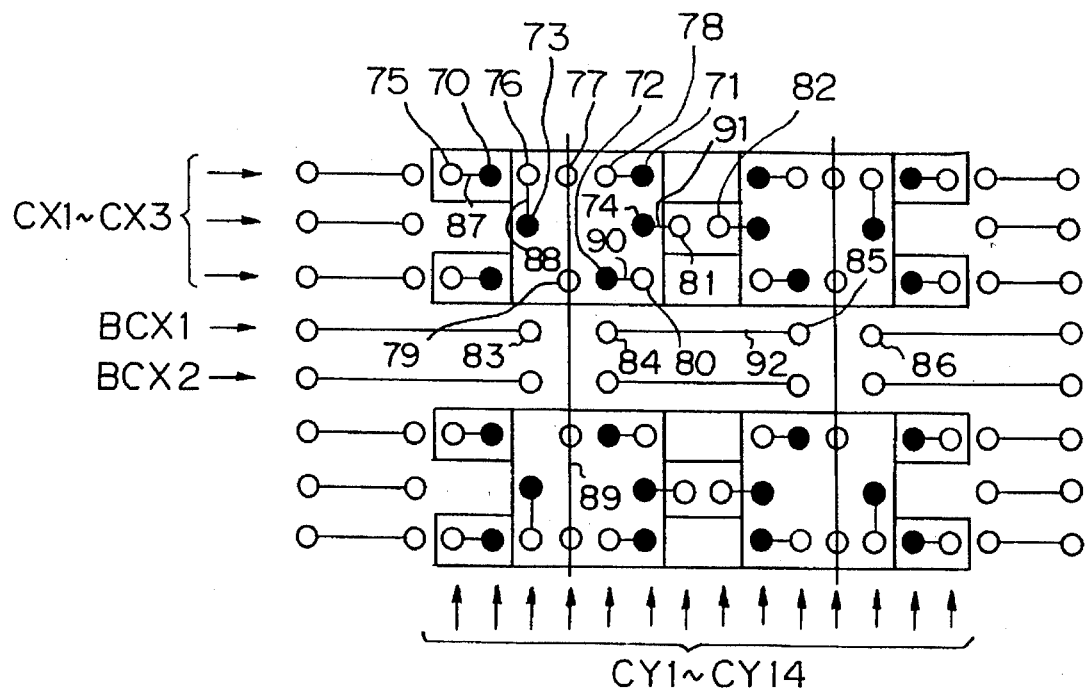
FIG. 7 is a view illustrating a common pattern employed in a third embodiment of the first aspect.
Figure 8A:
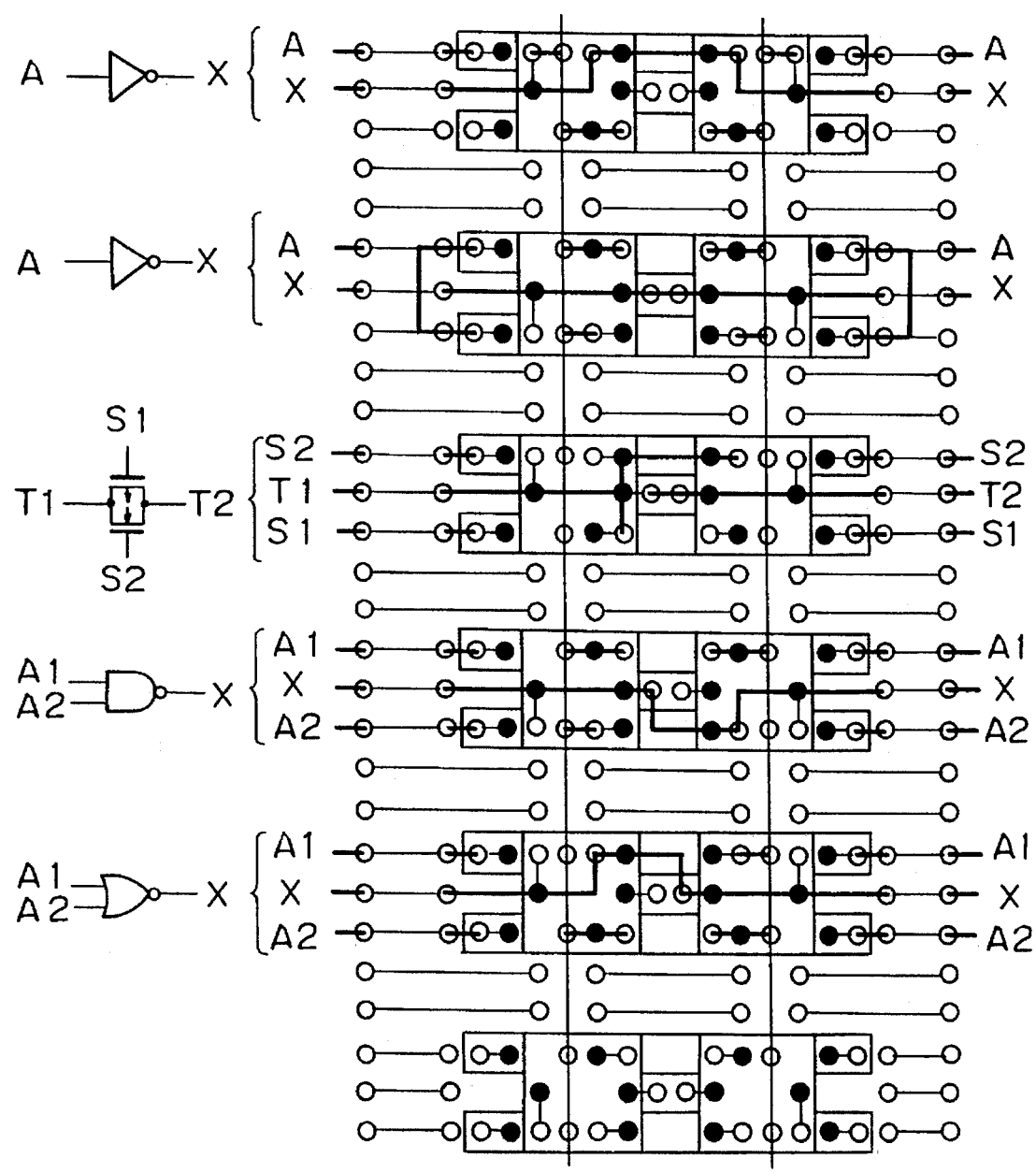
FIGS. 8A to 8D are views illustrating examples of a second wiring layer pattern applied to the common pattern shown in FIG. 7.
Figure 8B:
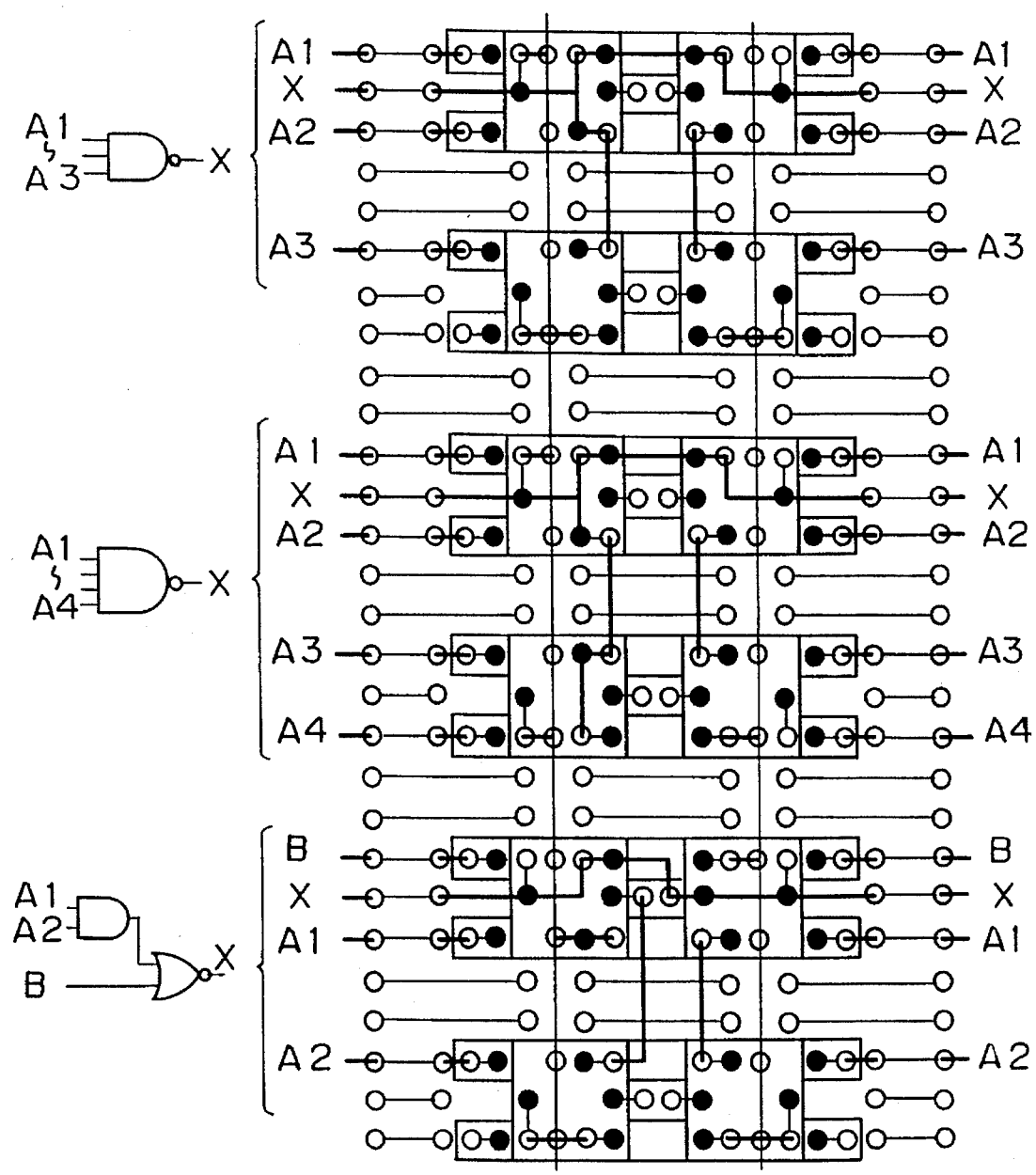
Figure 8C:
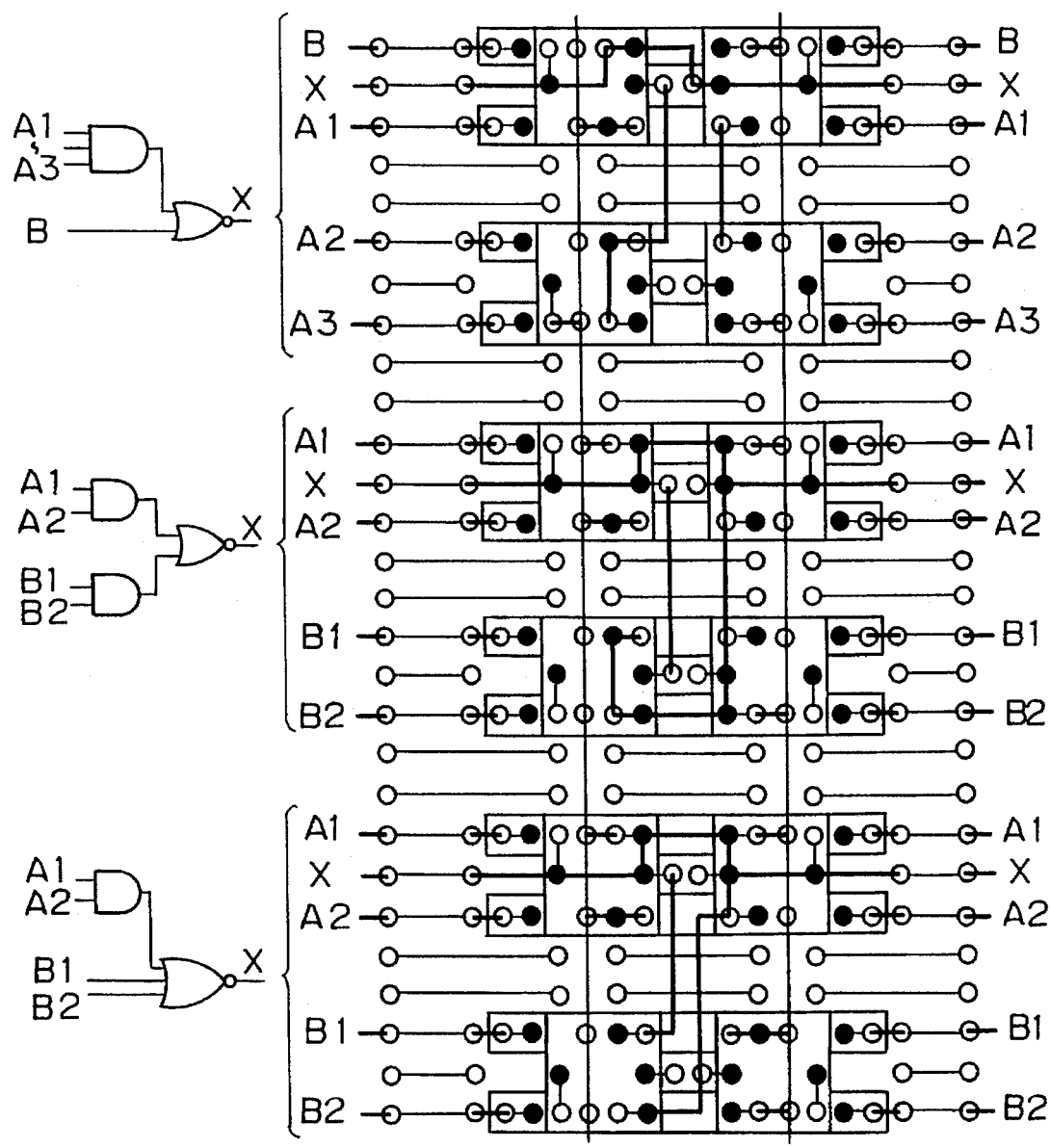
Figure 8D:
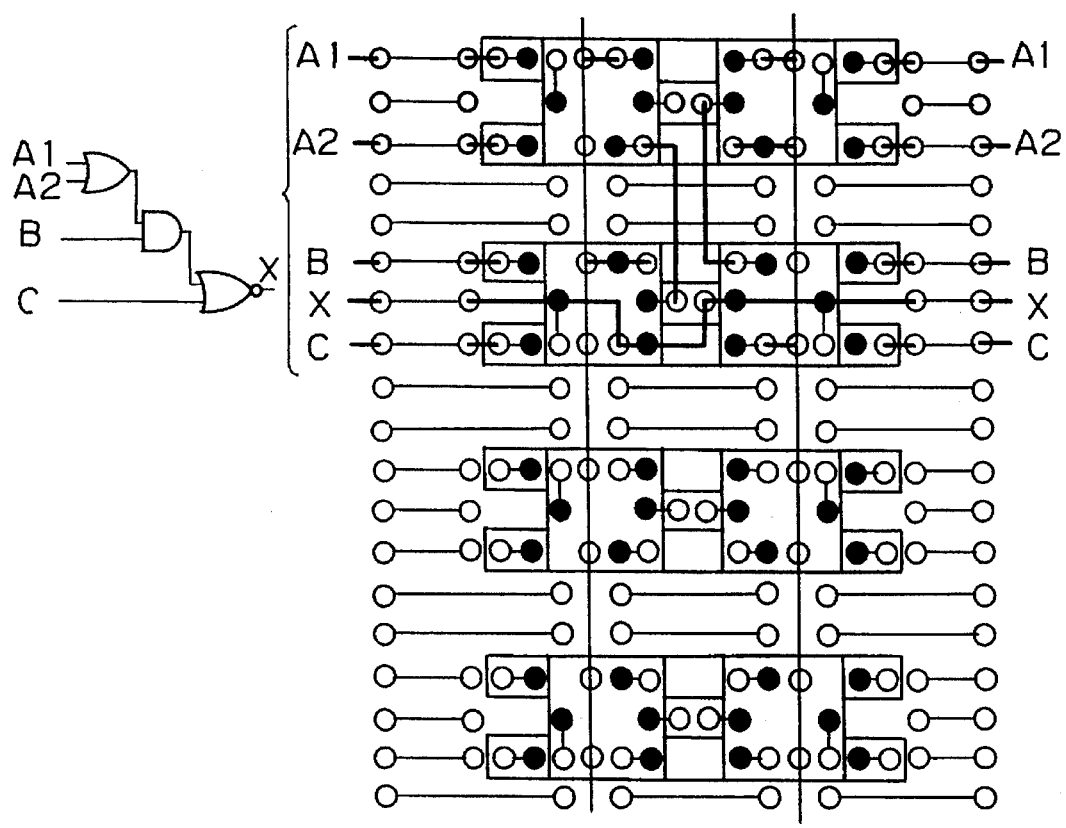

(3) Third Embodiment (see FIGS. 7 to 8D)

FIG. 7 illustrates a common pattern employed in the third embodiment of the first aspect. In the present embodiment, a given logic circuit or gate is constituted with a unit of the basic block B1 as in the first embodiment, and each basic cell is formed on a region defined by three horizontal wiring channels CX1~CX3 and fourteen vertical wiring channels CY1~CY14. The process of forming the illustrated common pattern is the same as that of the first embodiment and, accordingly, the explanation thereof is omitted.

As shown in FIG. 7, each pattern of the contact holes, first wiring layer(wirings) and through holes is formed in the symmetrical arrangement with respect to the center of the basic block B1. Namely, the first insulation layer includes one contact hole 70~72 in each region corresponding to the gate electrode lead portions 11~14 and the impurity regions 4, 6, 7, 9, and two contact holes 73, 74 in each region corresponding to the impurity regions 5, 8, and the second insulation layer includes: one through hole 75 in each region corresponding to the gate electrode lead portions 11~14; three through holes 76~78 in each region corresponding to one of the impurity regions 4, 6 and one of the impurity regions 7, 9; two through holes 79, 80 in each region corresponding to another of the impurity regions 4, 6 and another of the impurity regions 7, 9; two through holes 81, 82 in a region corresponding to the separation region 10; and four through holes 83~86 in a region corresponding to each cell-to-cell wiring channel BCX1, BCX2.

Also, the first wiring layer includes: wirings 87, each connecting a contact hole to a through hole in each region corresponding to the gate electrode lead portions 11~14; wirings 88, each connecting a contact hole in each region corresponding to said the impurity regions 5, 8, respectively, to a corresponding through hole in each region corresponding to one of the impurity regions 4, 6 and one of the impurity regions 7, 9; wirings 89, each connecting a pair through holes between each region corresponding to the impurity regions 4, 6, between each region corresponding to the impurity regions 7, 9, respectively, and extending along one of the vertical wiring channels CY1~CY14, and mainly serving as a power supply line; wirings 90, each connecting a contact hole to a through hole in each region corresponding to the impurity regions 4, 6, 7, 9; wirings 91, each connecting a contact hole in each region corresponding to the impurity regions 5, 8, respectively, to a corresponding through hole in a region corresponding to the separation region 10; and wirings 92, each intermittently connecting each through hole provided in a region corresponding to each cell-to-cell wiring channel so that it is out of contact with the power supply line, i.e., the wiring 89.

FIGS. 8A to 8D illustrate various examples of the second wiring layer pattern constituting a logic circuit or gate based on the common pattern shown in FIG. 7, together with an equivalent circuit diagram symbolically shown.

The third embodiment has the same advantage as in the first embodiment, i.e., reduction of the turnaround time, plus the following advantages:

Since each wiring 92 provided along each cell-to-cell wiring channel intermittently connects each through hole 83~86 provided thereon so that it is not short-circuited to the wiring 89 serving as the power supply line, the wiring 89 can be continuously formed along the vertical direction without using contact holes. Accordingly, it is possible to decrease the voltage drop caused when currents flow through the the power supply line 89. This contributes to an increase in the speed of the circuit operation.

Figure 9:
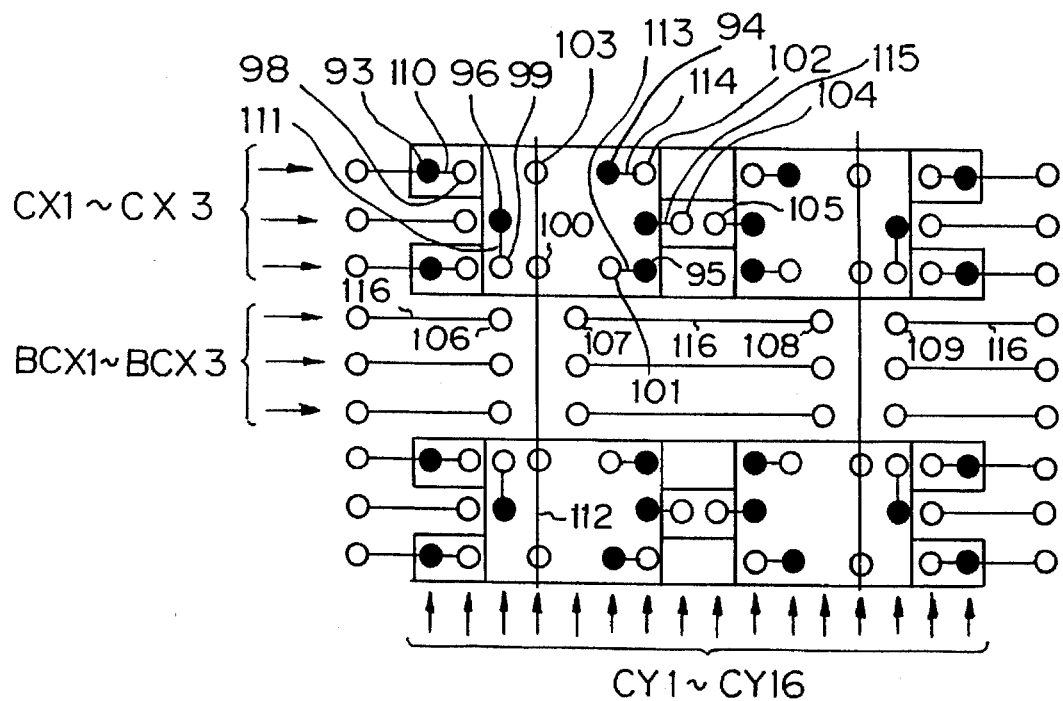
FIG. 9 is a view illustrating a common pattern employed in a fourth embodiment of the first aspect.
Figure 10A:
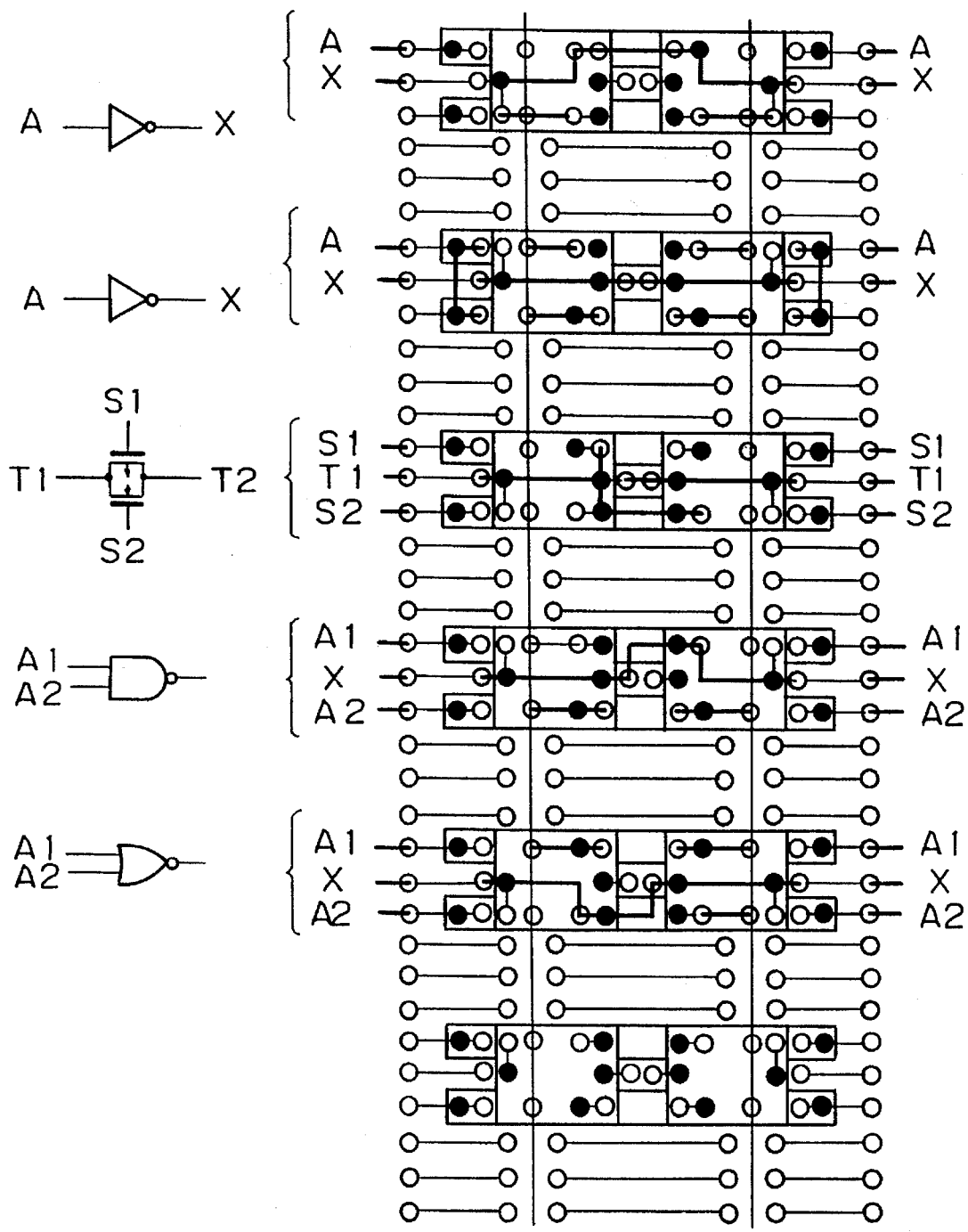
FIGS. 10A to 10D are views illustrating examples of a second wiring layer pattern applied to the common pattern shown in FIG. 9.
Figure 10B:
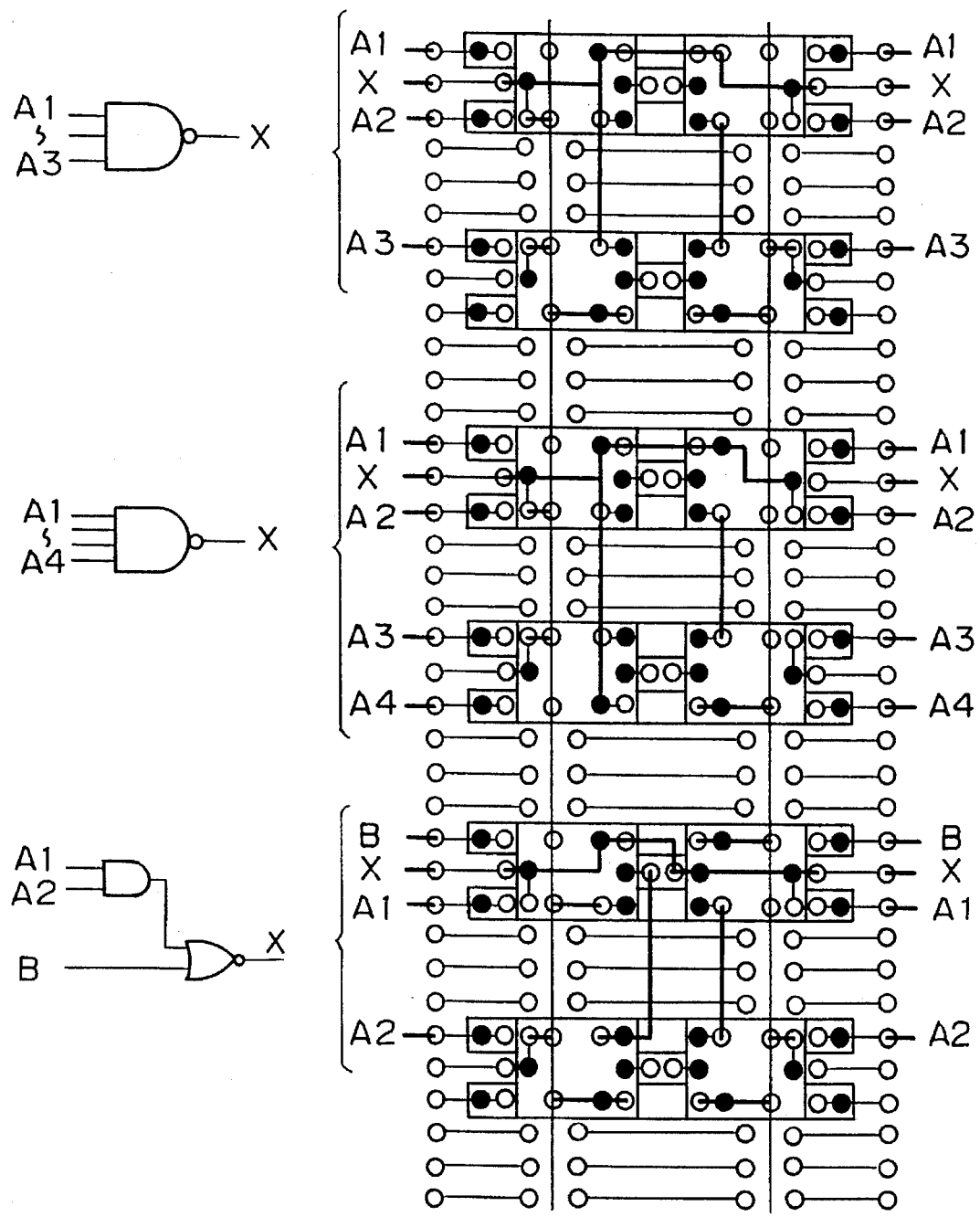
Figure 10C:
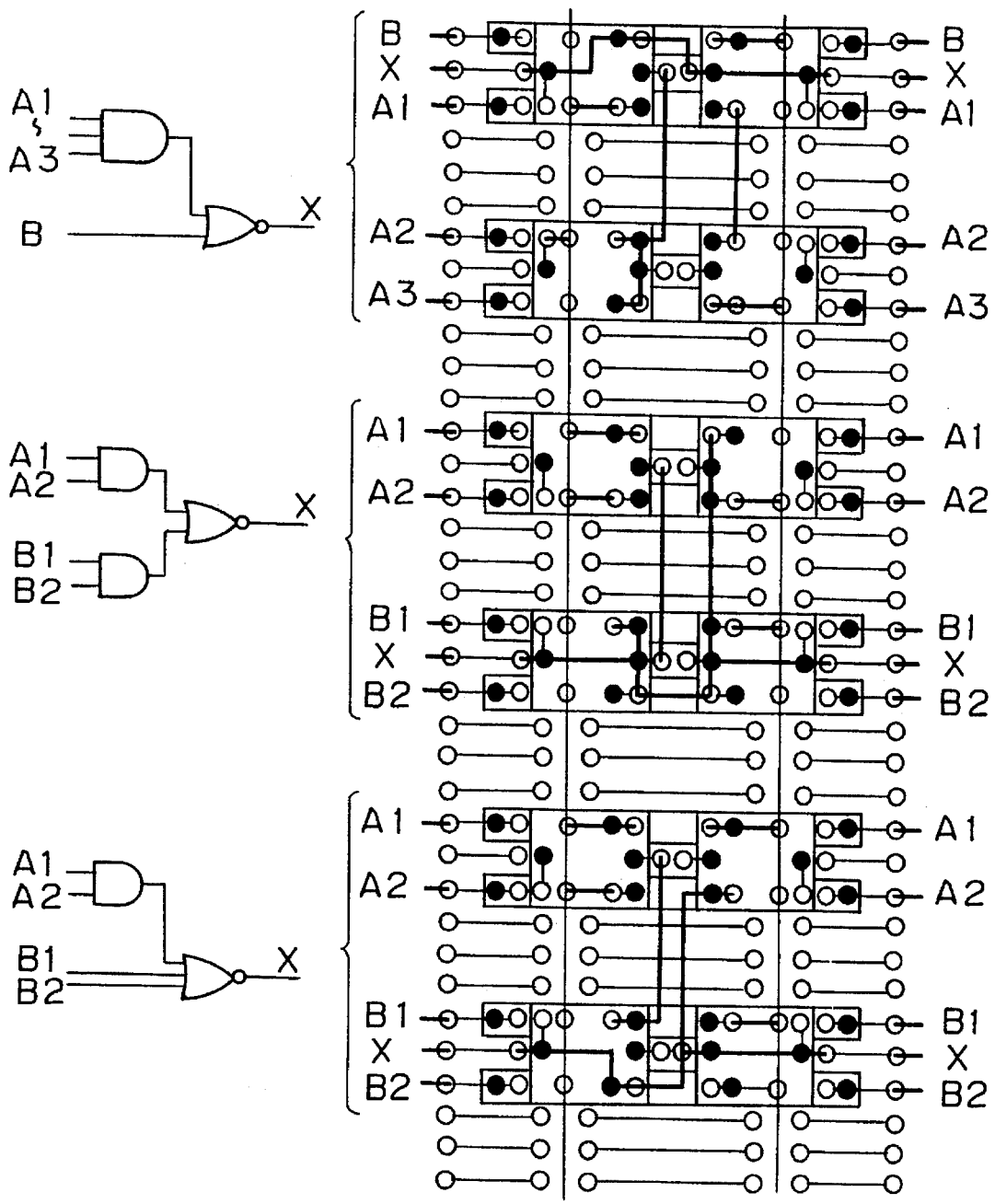
Figure 10D:
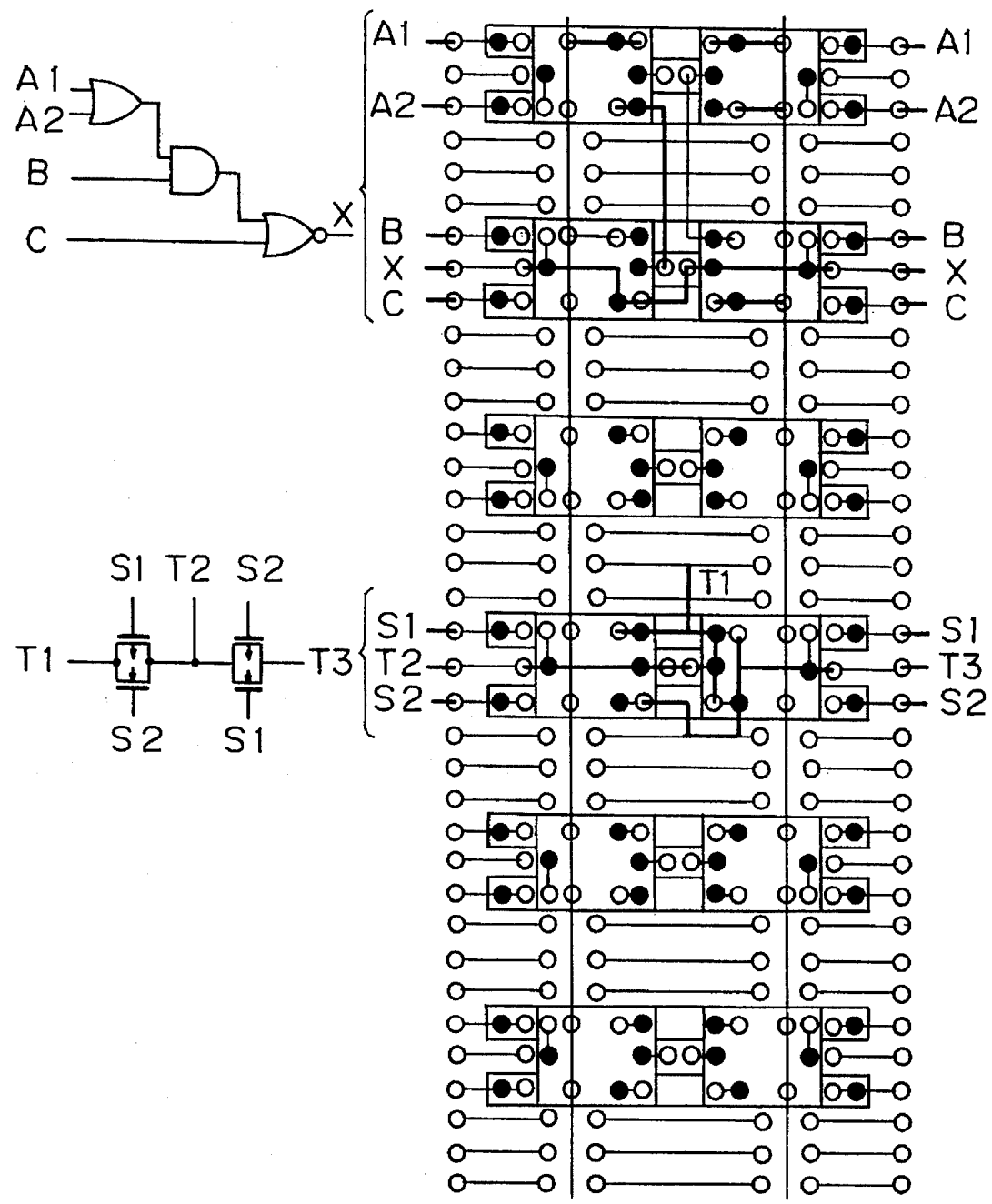

(4) Fourth Embodiment (see FIGS. 9 to 10D)

FIG. 9 illustrates a common pattern employed in the fourth embodiment of the first aspect. In the present embodiment, a given logic circuit or gate is constituted with a unit of the basic block B1 as in the first embodiment, and each basic cell is formed on a region defined by three horizontal wiring channels CX1~CX3 and sixteen vertical wiring channels CY1~CY16. The process of forming the illustrated common pattern is the same as that of the first embodiment and, accordingly, the explanation thereof is omitted.

As shown in FIG. 9, each pattern of the contact holes, first wiring layer(wirings) and through holes is formed in the symmetrical arrangement with respect to the center of the basic block B1. Namely, the first insulation layer includes one contact hole 93~95 in each region corresponding to the gate electrode lead portions 11~14 and the impurity regions 4, 6, 7, 9, and two contact holes 96, 97 in each region corresponding to the impurity regions 5, 8, and the second insulation layer includes: one through hole 98 in each region corresponding to the gate electrode lead portions 11~14; three through holes 99~101 in each region corresponding to one of the impurity regions 4, 6 and one of the impurity regions 7, 9; two through holes 102, 103 in each region corresponding to another of the impurity regions 4, 6 and another of the impurity regions 7, 9; two through holes 104, 105 in a region corresponding to the separation region 10; and four through holes 106~109 in a region corresponding to each cell-to-cell wiring channel BCX1~BCX3.

Also, the first wiring layer includes; wirings 110, each connecting a contact hole to a through hole in each region corresponding to the gate electrode lead portions 11~14; wirings 111, each connecting a contact hole in each region corresponding to said the impurity regions 5, 8, respectively, to a corresponding through hole in each region corresponding to one of the impurity regions 4, 6 and one of the impurity regions 7, 9; wirings 112, each connecting a pair through holes between each region corresponding to the impurity regions 4, 6, between each region corresponding to the impurity regions 7, 9, respectively, and extending along one of the vertical wiring channels CY1~CY16, and mainly serving as a power supply line; wirings 113, 114, each connecting a contact hole to a through hole in each region corresponding to the impurity regions 4, 6, 7, 9; wirings 115, each connecting a contact hole in each region corresponding to the impurity regions 5, 8, respectively, to a corresponding through hole in a region corresponding to the separation region 10; and wirings 116, each intermittently connecting each through hole provided in a region corresponding to each cell-to-cell wiring channel so that it is out of contact with the power supply line, i.e., the wiring 112.

FIGS. 10A to 10D illustrate various examples of the second wiring layer pattern constituting a logic circuit or gate based on the common pattern shown in FIG. 9, together with an equivalent circuit diagram symbolically shown.

The fourth embodiment has the same advantage as in the first embodiment, i.e., reduction of the turnaround time, plus the following advantages:

Since the number of the vertical wiring channels is increased to sixteen (CY1~CY16) compared with the third embodiment, the position of the through hole 107 provided on the cell-to-cell wiring channel can be shifted by a distance corresponding to a space between wiring channels from that of the through hole 101 provided on the basic cell. Accordingly, it is possible to form a pair of series-connected transmission gates on one basic cell, i.e., on half of the region of the basic block, as shown in FIG. 10D. This contributes to reduction in the formation area of the pattern. Especially, where a circuit including two series-connected transmission gates as a constituent element, e.g., a flipflop circuit, counter circuit or the like, is formed, the present embodiment is advantageous in that it is possible to realize a high degree of integration of the circuit.

Figure 11:
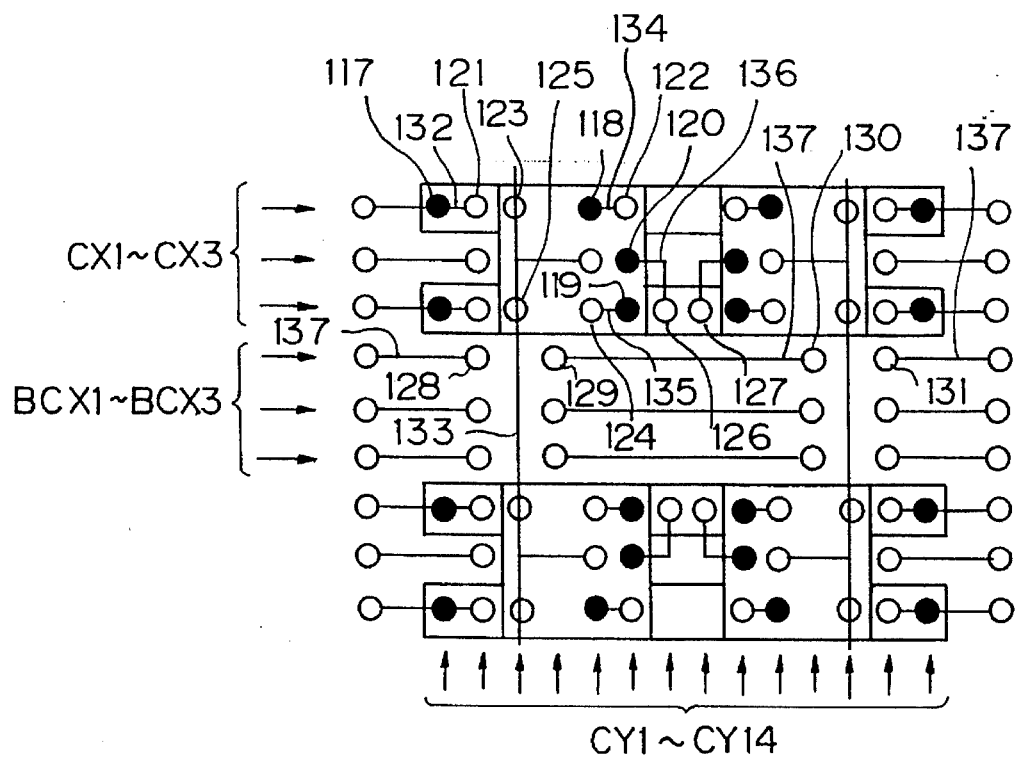
FIGS. 11 is a view illustrating a common pattern employed in a fifth embodiment of the first aspect.
Figure 12A:
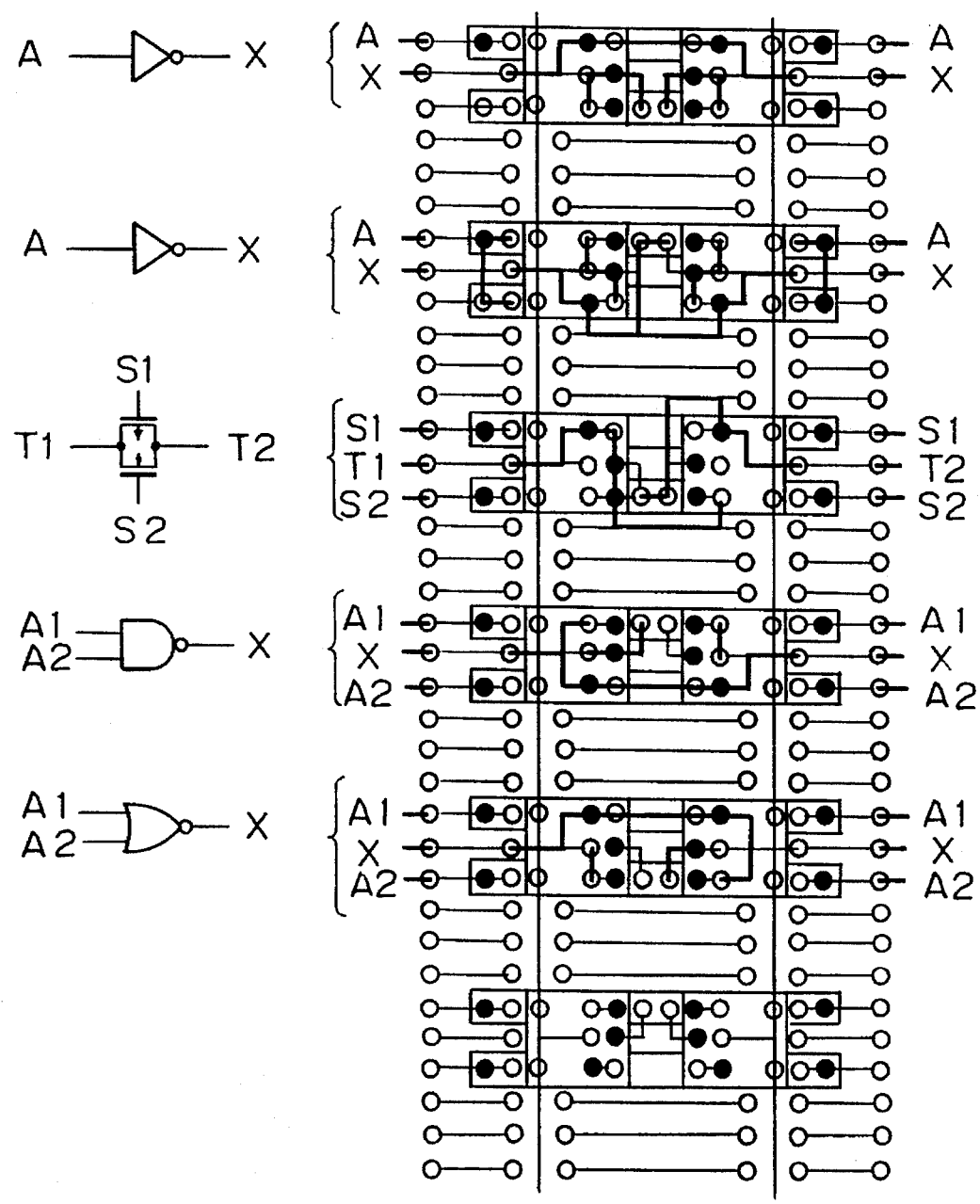
FIGS. 12A to 12D are views illustrating examples of a second wiring layer pattern applied to the common pattern shown in FIG. 11.
Figure 12B:
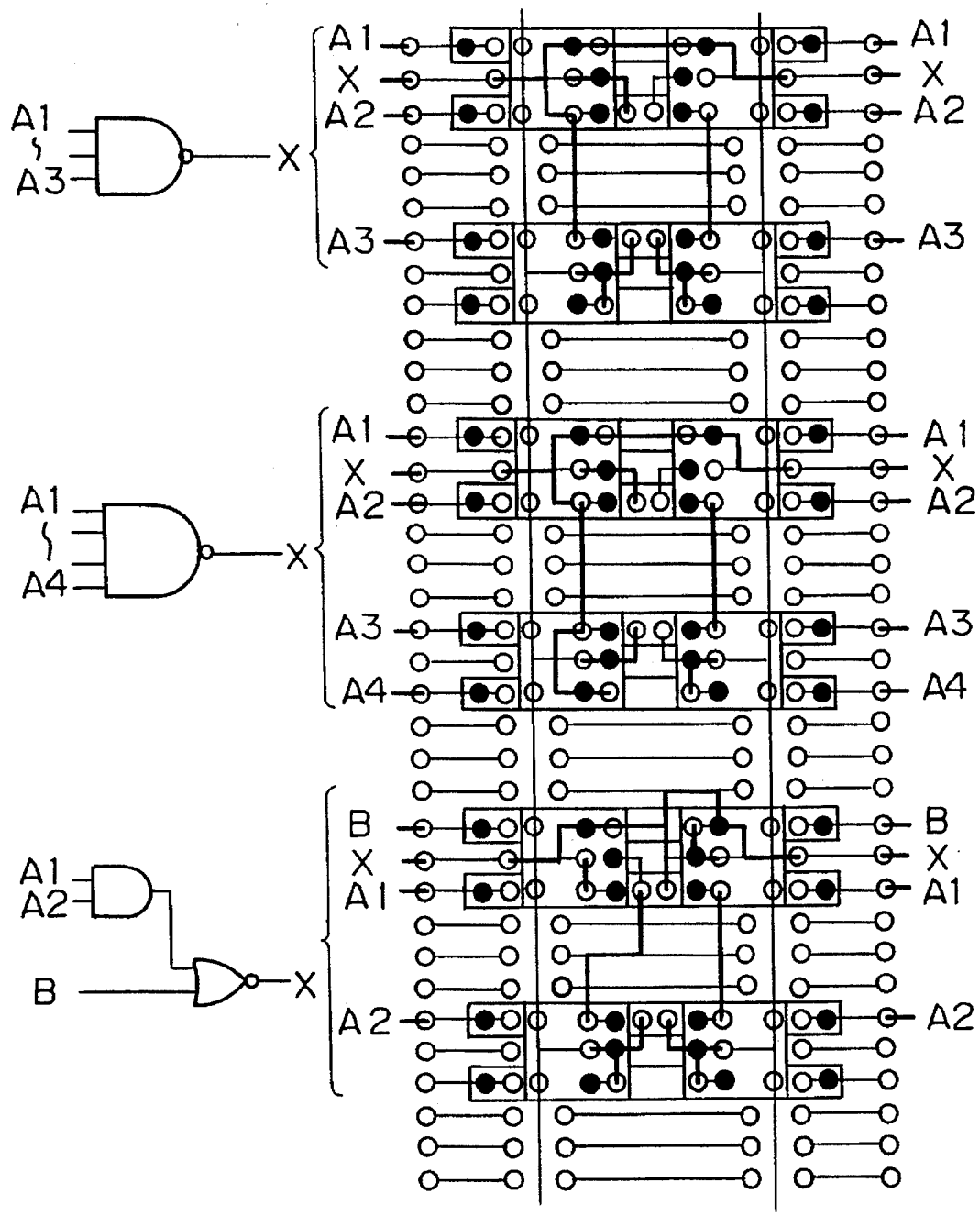
Figure 12C:
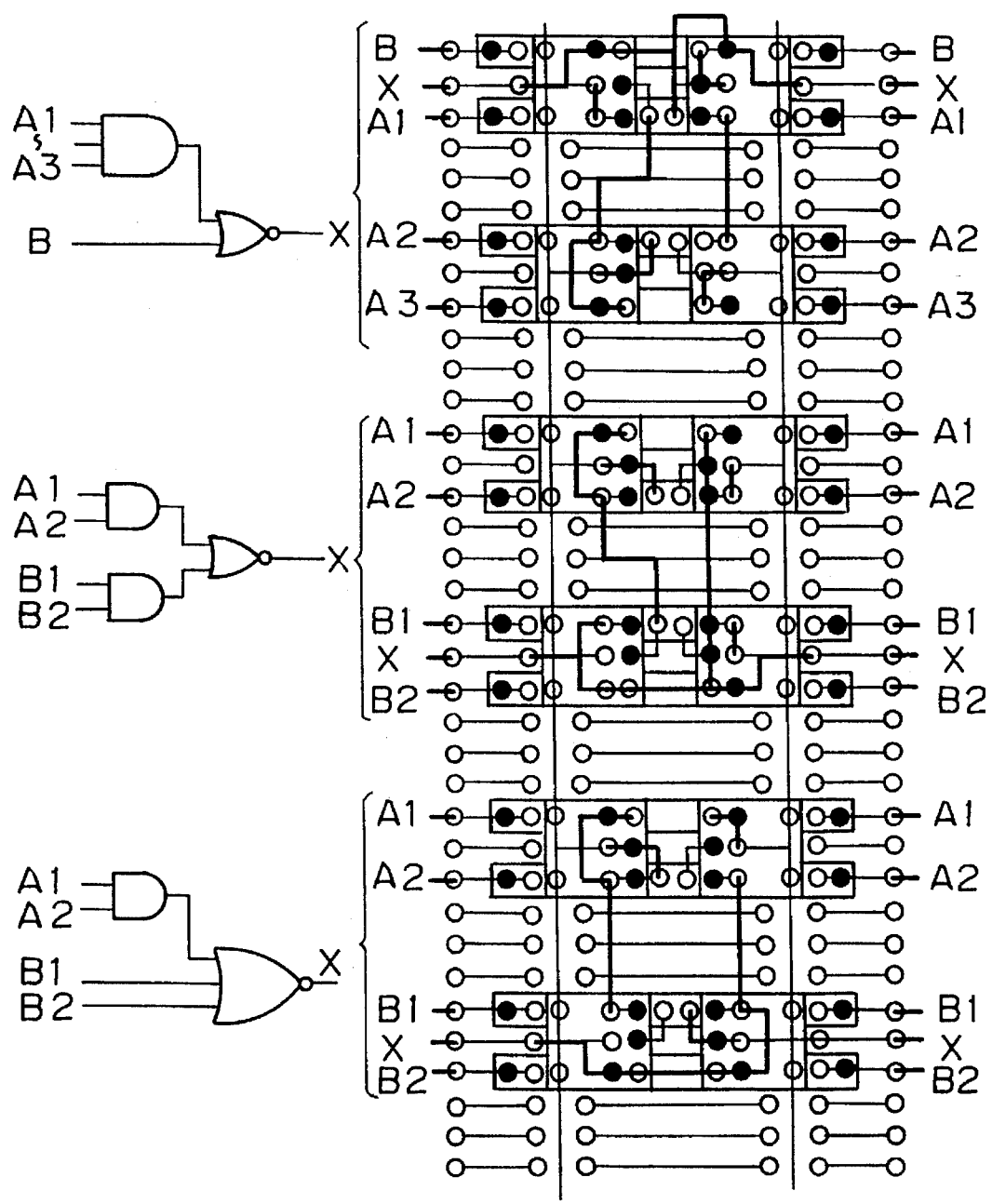
Figure 12D:
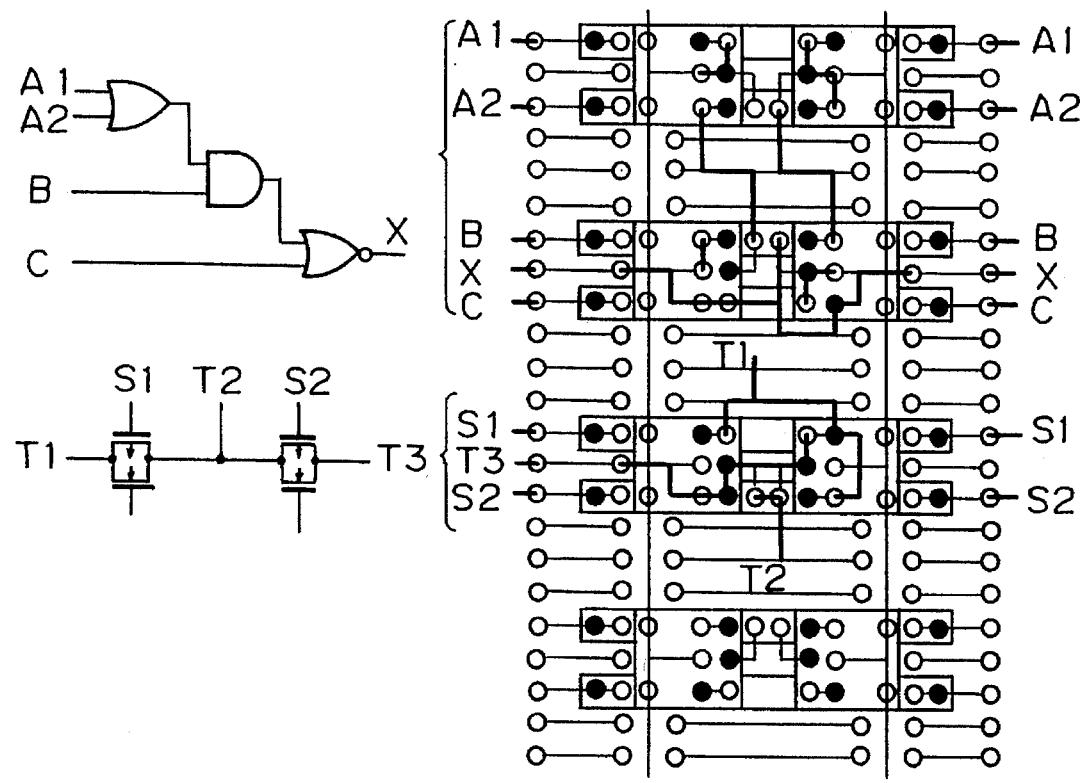

(5) Fifth Embodiment (see FIGS. 11 to 12D)

FIG. 11 illustrates a common pattern employed in the fifth embodiment of the first aspect. In the present embodiment, a given logic circuit or gate is constituted with a unit of the basic block B1 as in the first embodiment, and each basic cell is formed on a region defined by three horizontal wiring channels CX1~CX3 and fourteen vertical wiring channels CY1~CY14. The process of forming the illustrated common pattern is the same as that of the first embodiment and, accordingly, the explanation thereof is omitted.

As shown in FIG. 11, each pattern of the contact holes, first wiring layer(wirings) and through holes is formed in the symmetrical arrangement with respect to the center of the basic block B1. Namely, the first insulation layer includes one contact hole 117~120 in each region corresponding to the gate electrode lead portions 11~14 and the impurity regions 4~9, and the second insulation layer includes: one through hole 121 in each region corresponding to the gate electrode lead portions 11~14 and the impurity regions 5, 8; two through holes 122~125 in each region corresponding to the impurity regions 4, 6, 7, 9; two through holes 126, 127 in a region corresponding to the separation region 10; and four through holes 128~131 in a region corresponding to each cell-to-cell wiring channel BCX1~BCX3.

Also, the first wiring layer includes: wirings 132, each connecting a contact hole to a through hole in each region corresponding to the gate electrode lead portions 11~14; wirings 133, each connecting a pair of through holes between each region corresponding to the impurity regions 4, 6, between each region corresponding to the impurity regions 7, 9, respectively, and extending along one of the vertical wiring channels CY1~CY14, and mainly serving as a power supply line; wirings 134, 135, each connecting a contact hole to a through hole in each region corresponding to the impurity regions 4, 6, 7, 9; wirings 136, each connecting a contact hole in each region corresponding to the impurity regions 5, 8, respectively, to a corresponding through hole in a region corresponding to the separation region 10; and wirings 137, each intermittently connecting each through hole provided in a region corresponding to each cell-to-cell wiring channel so that it is out of contact with the power supply line, i.e., the wiring 133.

FIGS. 12A to 12D illustrate various examples of the second wiring layer pattern constituting a logic circuit or gate based on the common pattern shown in FIG. 11, together with an equivalent circuit diagram symbolically shown.

The fifth embodiment has the same advantage as in the first embodiment, i.e., reduction of the turnaround time, plus the following advantages:

According to the present embodiment, it is possible to form two series-connected transmission gates on one basic cell as shown in FIG. 12D, as in the fourth embodiment (see FIG. 10D). In this case, since the number of the vertical wiring channels is decreased to fourteen(CY1~CY14) compared with the fourth embodiment, it is possible to realize a further high degree of integration of the circuit.

Figure 13:
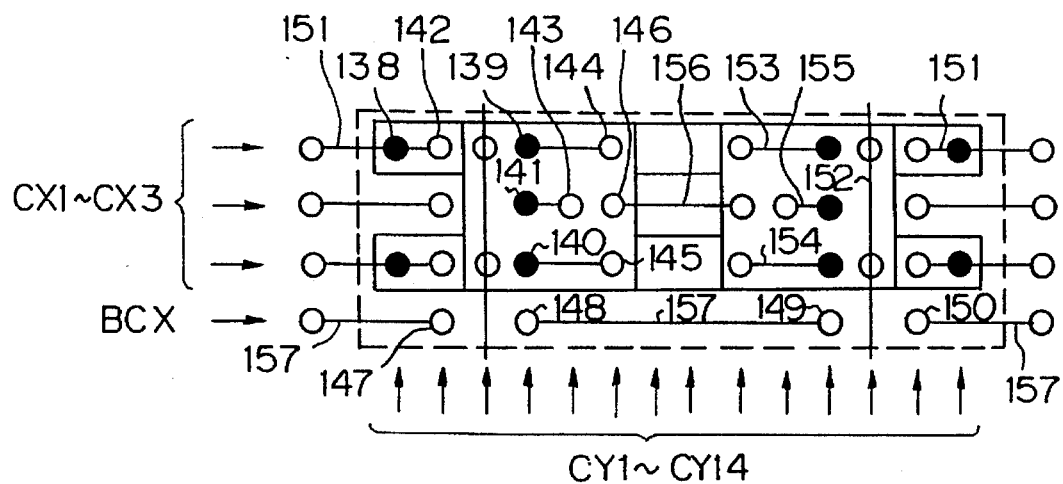
FIG. 13 is a view illustrating a common pattern employed in a sixth embodiment of the first aspect.
Figure 14A:
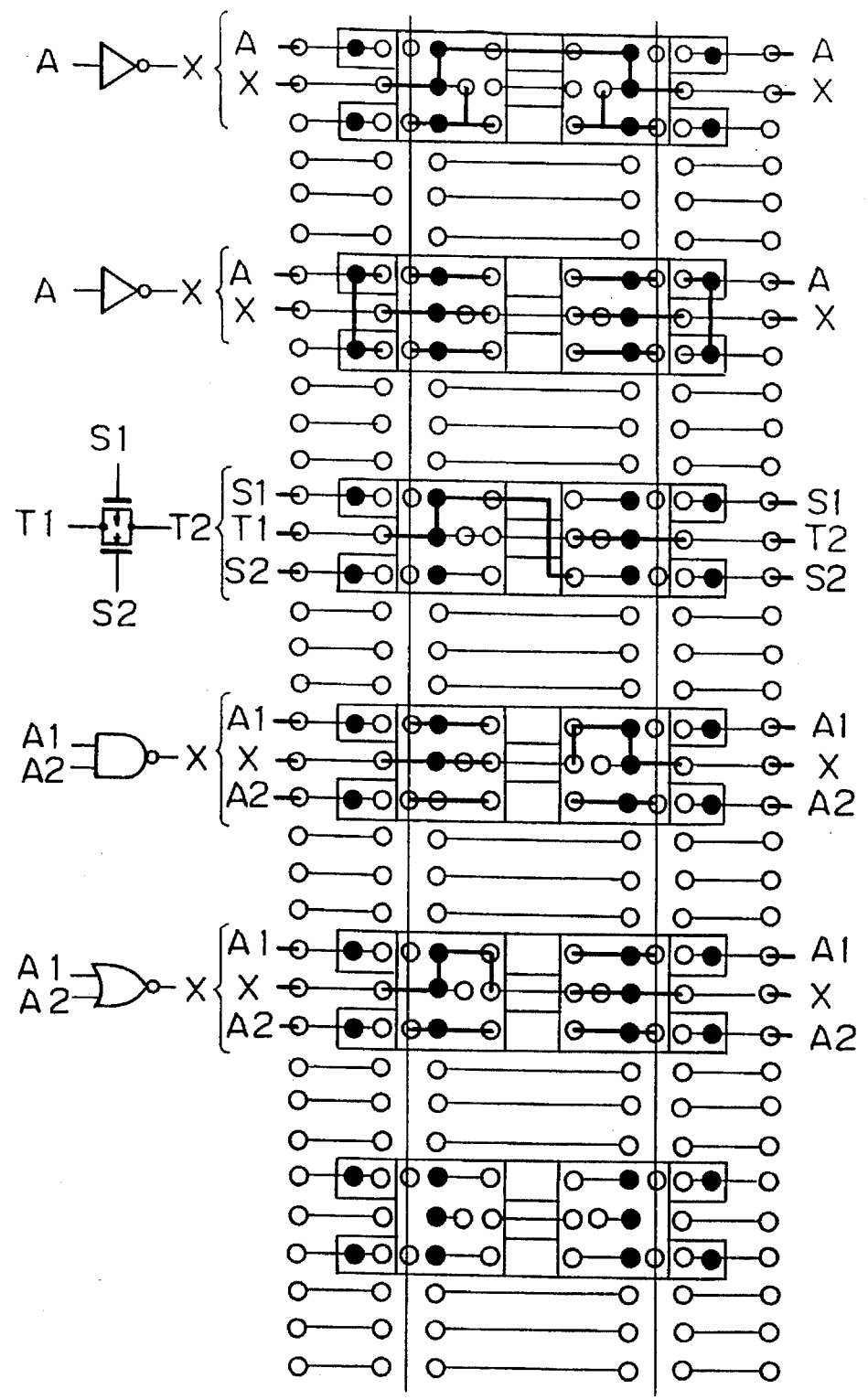
FIGS. 14A to 14D are views illustrating examples of a second wiring layer pattern applied to the common pattern shown in FIG. 13.
Figure 14B:
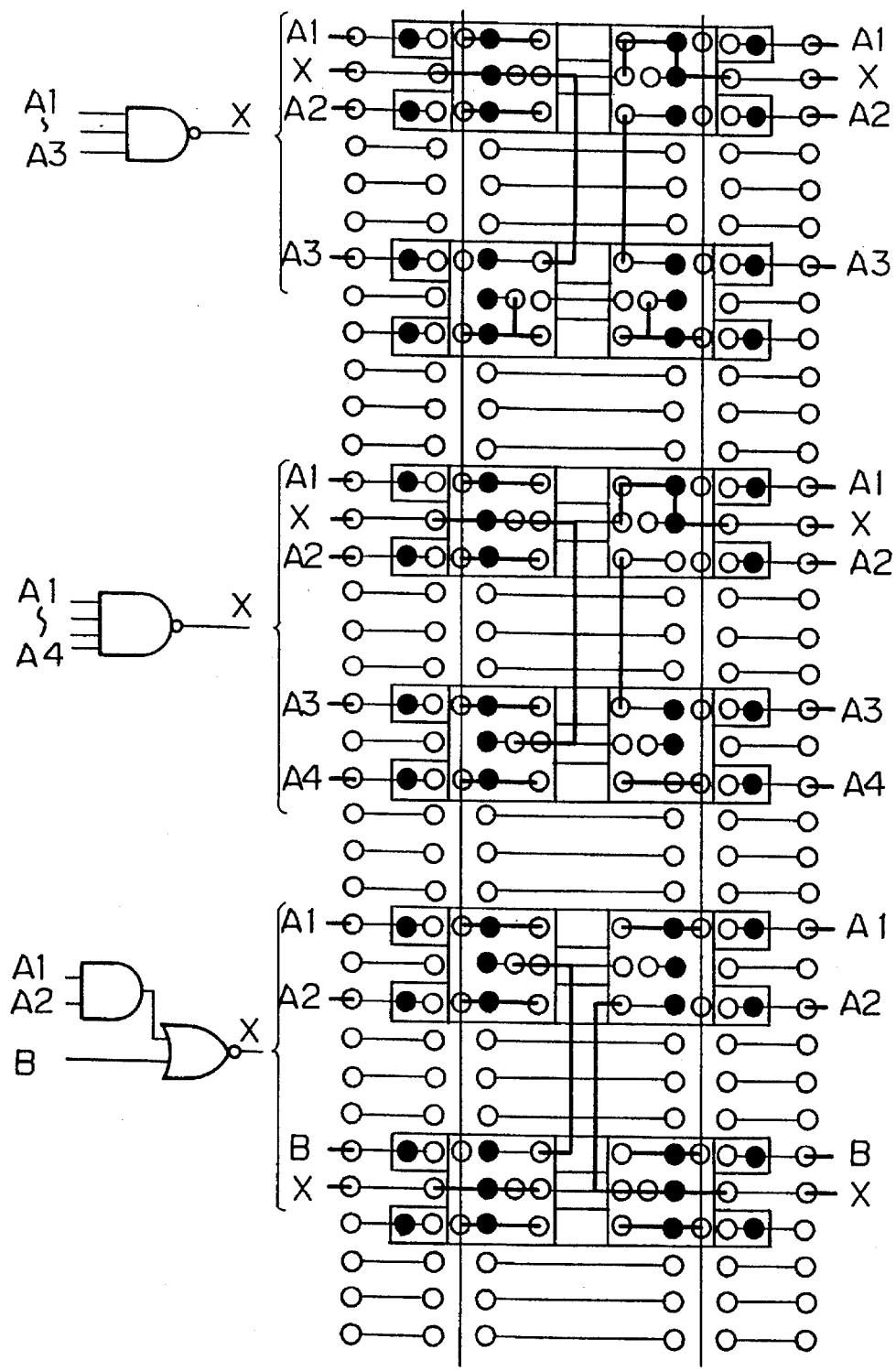
Figure 14C:
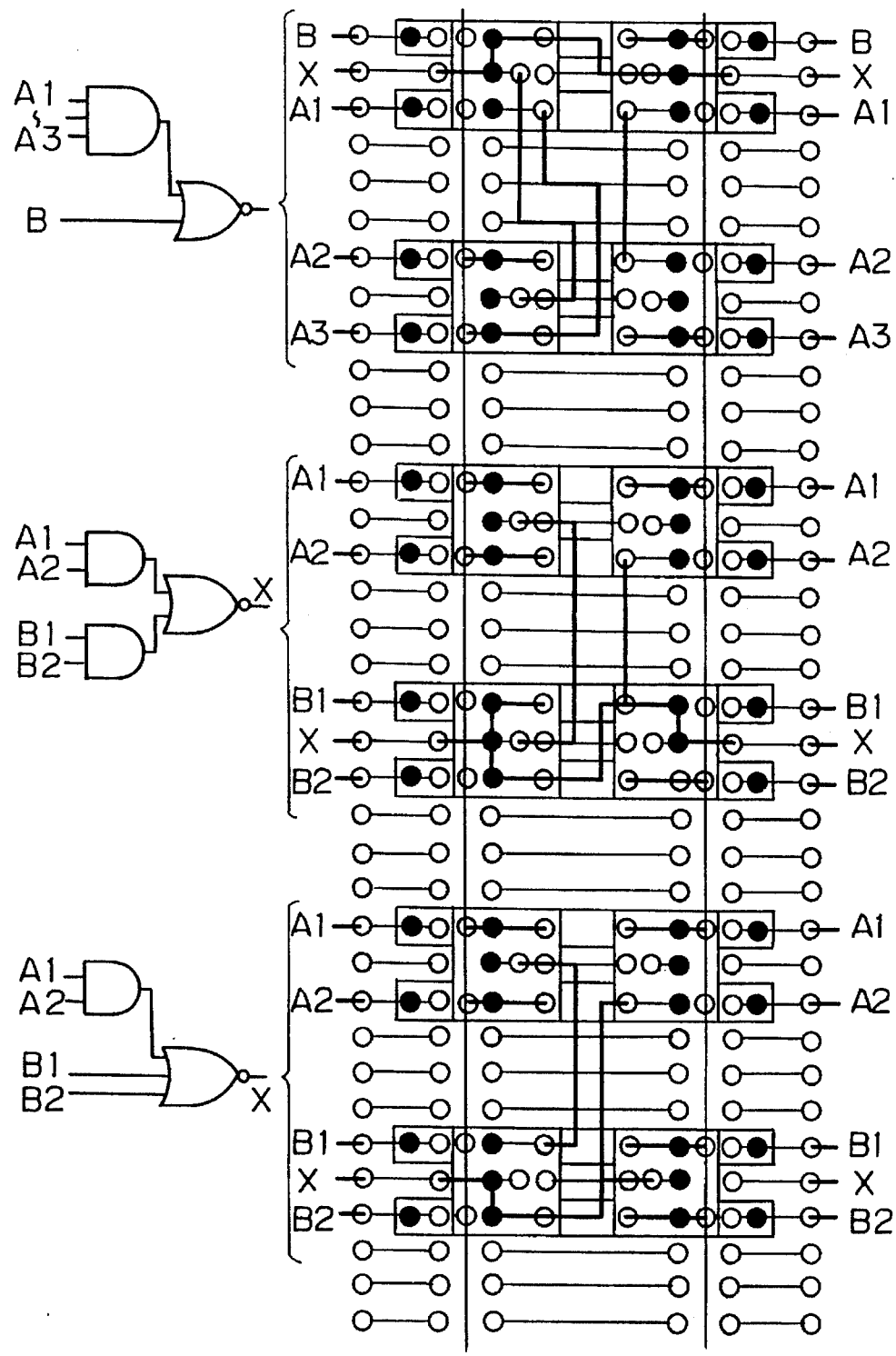
Figure 14D:
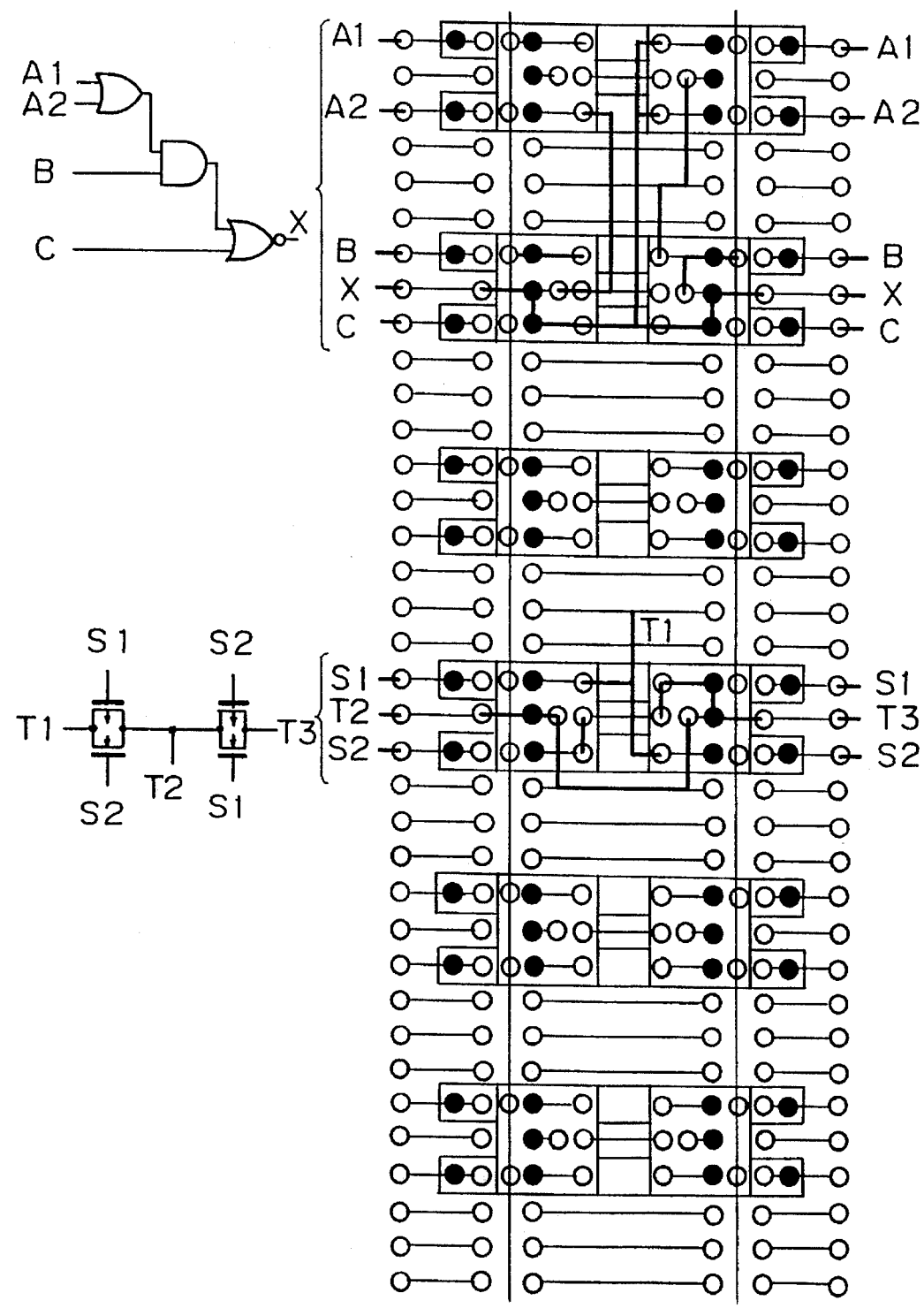

(6) Sixth Embodiment (see FIGS. 13 to 14D)

FIG. 13 illustrates a common pattern employed in the sixth embodiment of the first aspect. In the present embodiment, a given logic circuit or gate is constituted with a unit of the basic block B2 consisting of a single basic cell, and each basic cell is formed on a region defined by three horizontal wiring channels CX1~CX3 and fourteen vertical wiring channels CY1~CY14. The process of forming the illustrated common pattern is the same as that of the first embodiment and, accordingly, the explanation thereof is omitted.

As shown in FIG. 13, each pattern of the contact holes, first wiring layer(wirings) and through holes is formed in the symmetrical arrangement with respect to the center of the basic cell. Namely, the first insulation layer includes one contact hole 138~141 in each region corresponding to the gate electrode lead portions 11~14 and the impurity regions 4~9, and the second insulation layer includes: one through hole 142 in each region corresponding to the gate electrode lead portions 11~14; two through holes 143~146 in each region corresponding to the impurity regions 4~9; four through holes 147~150 in a region corresponding to a cell-to-cell wiring channel BCX.

Also, the first wiring layer includes: wirings 151, each connecting a contact hole to a through hole in each region corresponding to the gate electrode lead portions 11~14; wirings 152, each connecting a pair of through holes between each region corresponding to the impurity regions 4, 6, between each region corresponding to the impurity regions 7, 9, respectively, and extending along one of the vertical wiring channels CY1~CY14, and mainly serving as a power supply line; wirings 153~155, each connecting a contact hole to a through hole in each region corresponding to the impurity regions 4~9; one wiring 156 connecting a through hole in a region corresponding to the impurity region 5 to a corresponding through hole in a region corresponding to the impurity region 8; and wirings 157, each intermittently connecting each through hole provided in a region corresponding to the cell-to-cell wiring channel so that it is out of contact with the power supply line, i.e., the wiring 152.

FIGS. 14A to 14D illustrate various examples of the second wiring layer pattern constituting a logic circuit or gate based on the con, on pattern shown in FIG. 13, together with an equivalent circuit diagram symbolically shown.

The sixth embodiment has the same advantage as in the first embodiment, i.e., reduction of the turnaround time, plus the following advantages:

Referring to the first to fifth embodiments, since the basic block for forming a logic circuit is constituted by a pair of basic cells, there arises a disadvantage in that, where the logic circuit is formed using one of the pair of basic cells, another thereof is left unused and becomes unavailing, and vice versa. According to the present embodiment, even if any one of basic cells is used for forming a given logic circuit, it is possible to prevent any of basic cells from becoming unavailing, because the basic block is constituted by a single basic cell, and the first wiring layer(wirings) is symmetrically formed with respect to the center of the basic block. Therefore, it is possible to heighten the efficiency in use of the basic cells and thus realize a high degree of integration of the circuit.

Although only the logic circuits or gates having a fundamental function are illustrated in FIGS. 3 to 14D, it is apparent to those skilled in the art that other embodiments and modifications are possible by suitably changing only the second wiring layer pattern.

Next, preferred embodiments according to the second aspect of the present invention will be explained with reference to FIGS. 15A to 34.

Figure 15A:
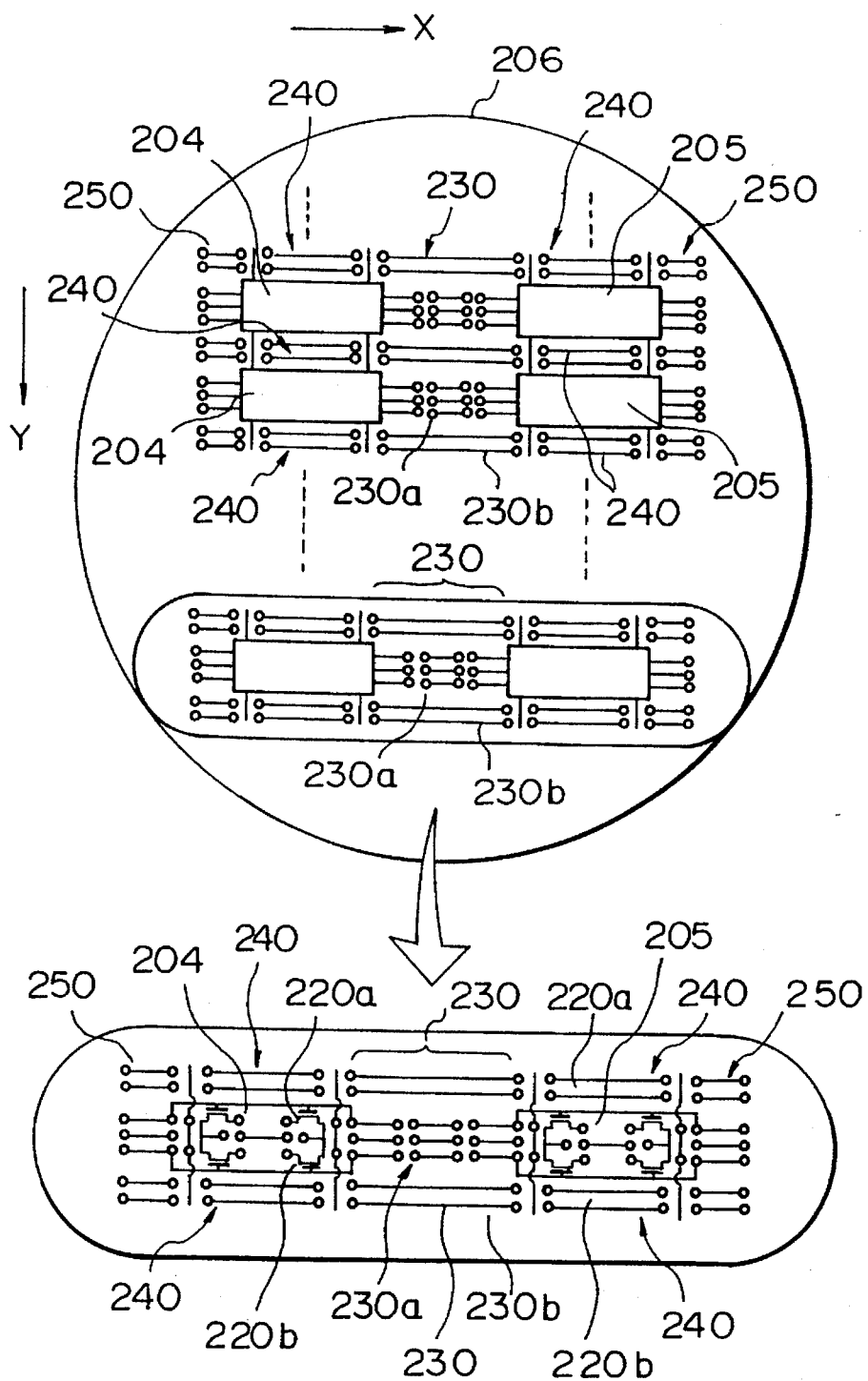
FIGS. 15A to 15C are enlarged views illustrating constitutions of main parts of the master chip of FIG. 1.
Figure 15B:
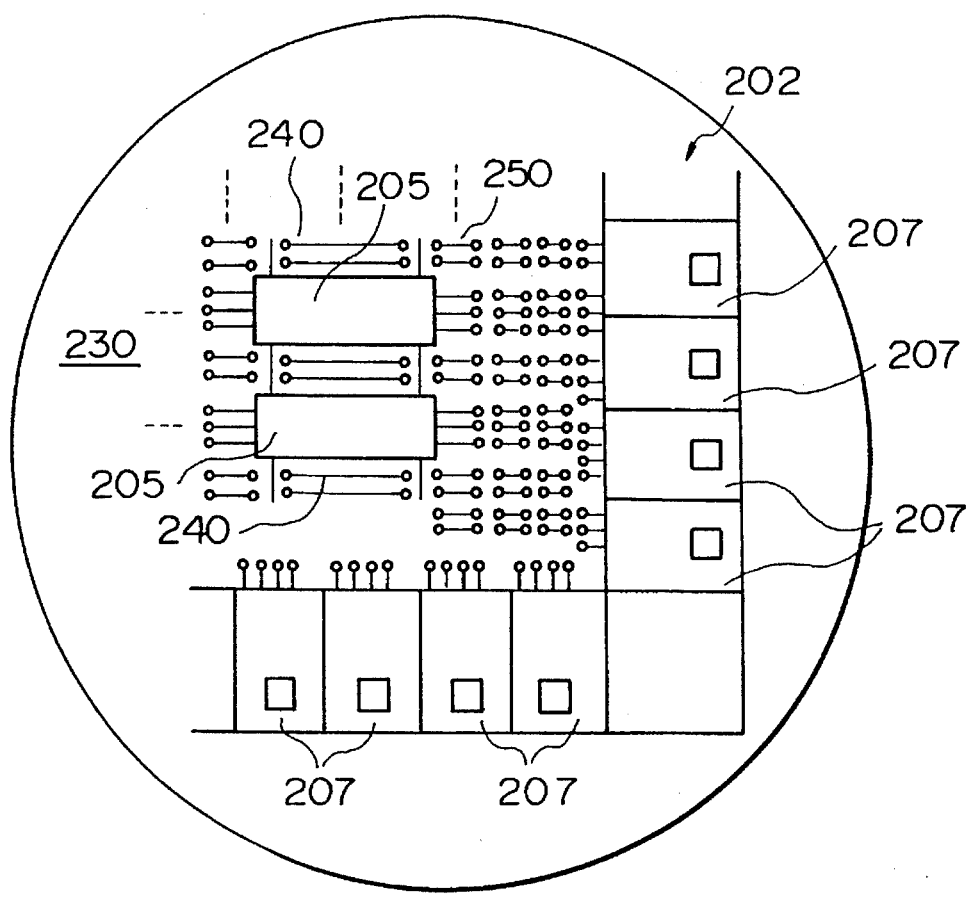
Figure 15C:
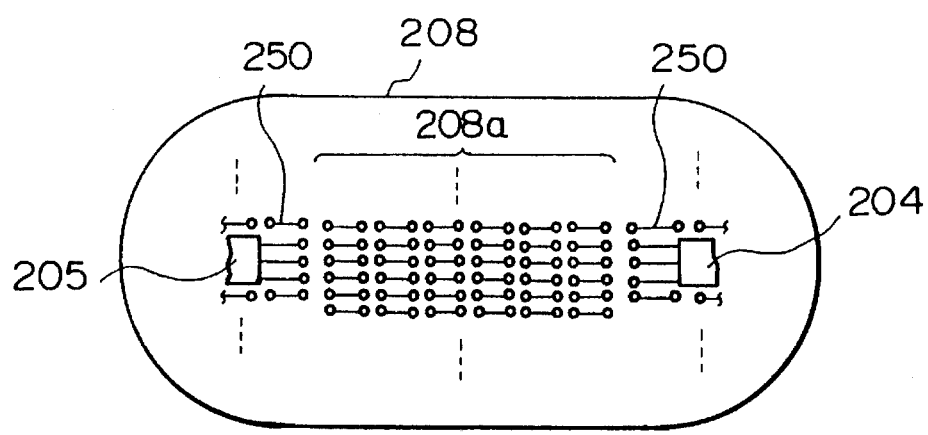

FIGS. 15A to 15C illustrate constitutions of main parts of the master chip shown in FIG. 1.

In FIGS. 15A to 15C, references 220a, 220b denote transistors of CMOS structure and correspond to the p-channel transistor Qp and n-channel transistor Qn shown in FIG. 2, respectively. Accordingly, each of the basic cells 204, 205 is constituted by two pairs of CMOS transistors 220a, 220b. Reference 230 denotes a cell-to-cell wiring region, which is extending along Y direction between adjacent basic cells 204, 205 disposed along X direction. A portion of the cell-to-cell wiring region 230 is included in the wiring channel region 208 (see FIG. 1). Reference 240 denotes a bypass wiring region, which is formed between adjacent basic cells 204(205) disposed along Y direction, and extending along X direction. Namely, the bypass wiring region 240 and the basic cell 204(205) are alternatingly arranged along Y direction. Reference 250 denotes an end portion wiring region, which is formed in an end portion of the basic cell array 206 and extending along Y direction. Namely, a pair of end portion wiring regions 250 are formed with respect to one basic cell array 206. The cell-to-cell wiring region 230, bypass wiring region 240 and end portion wiring region 250 include a plurality of wirings of a predetermined length, respectively, and a connection of wirings between each region is not effected.

The cell-to-cell wiring region 230 comprises a short wiring region 230a and a long wiring region 230b. The short wiring region 230a includes a plurality of short wirings extending along X direction, which are divided into a plurality of portions along X direction in a region between adjacent basic cells 204, 205 disposed along X direction, and arranged at a predetermined space in Y direction. The long wiring region 230b includes a plurality of long wirings, which are continuously extending along X direction in a region between adjacent bypass wiring regions 240 disposed along X direction. The number of the wirings in the long wiring region 230b is the same as that in the bypass wiring region 240. Each of the long wirings is formed such that an end portion thereof faces that of each of the wirings in the bypass wiring region 240 and extends internally from an end portion of the basic cell 204, 205.

The wiring channel region 208 includes a plurality of wirings 208a of a predetermined length extending along X direction, which are divided into a plurality of portions along X direction and arranged at a predetermined space in Y direction. The wiring channel region 208 is formed so as to be wider than the cell-to-cell wiring region 230 (in the present example, twice or more). The distance between each contact hole provided in the region of the wirings 208a is selected such that one vertical wiring formed in the second wiring layer can pass therethrough.

Figure 16A:
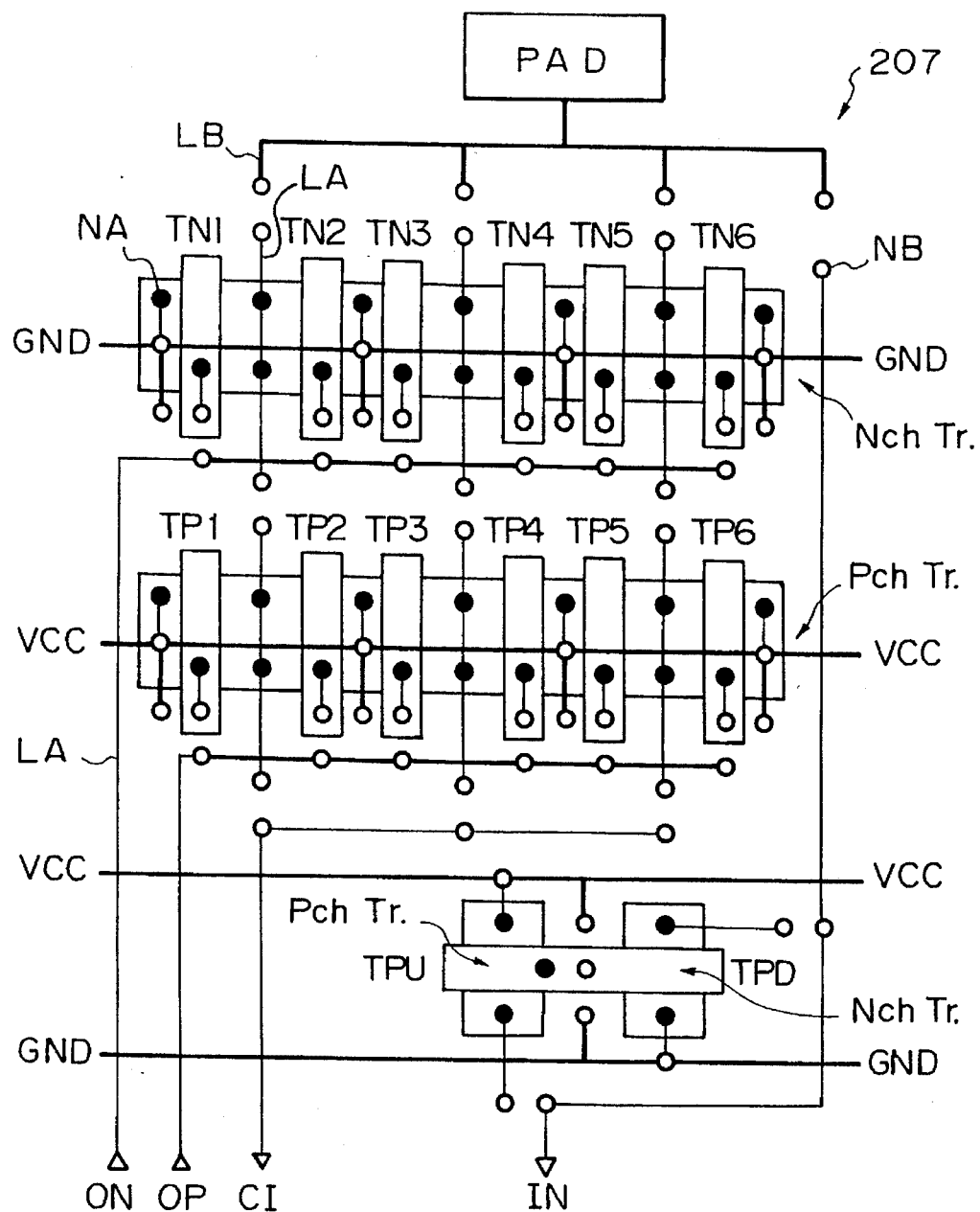
FIGS. 16A and 16B are views illustrating a mounting pattern of the I/O cell shown in FIG. 15B, with relation to the second aspect of the present invention.
Figure 16B:
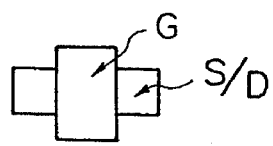

FIGS. 16A and 16B illustrate the mounting pattern of each of the I/O cells 207 shown in FIG. 15B.

As shown in FIG. 16A, the I/O cell 207, roughly classifying, includes three diffusion regions for MOS transistors. These diffusion regions are constituted by the following constituent elements: n-channel MOS transistors TN1~TN6, e.g., for an output buffer; p-channel MOS transistors TP1~TP6, e.g., for an output buffer; a p-channel MOS transistor TPU functioning as an input pull-up resistor; and an n-channel MOS transistor TPD functioning as an input pull-down resistor. Each transistor is constituted by a gate G and a source/drain S/D, as shown in FIG. 16B.

The gate and source/drain of each transistor is connected via the contact hole NA to the first wiring layer(wirings) LA, and the first wiring layer(wirings) LA is connected via the through hole NB to the second wiring layer(wirings) LB. Note, the second wiring layer(wirings) LB is formed using a custom pattern mask according to the user's specification, in another process different from the process of forming basic cell regions.

Also, reference PAD denotes a bonding pad; reference Vcc a power supply line; reference GND a ground line; reference IN an input buffer internal terminal; reference CI a clock buffer internal terminal; reference OP an output buffer internal terminal for p-channel MOS transistors; and reference ON an output buffer internal terminal for n-channel MOS transistors. Since the relation of connection between each element is apparent from FIG. 16A, its explanation is omitted.

Figure 17:
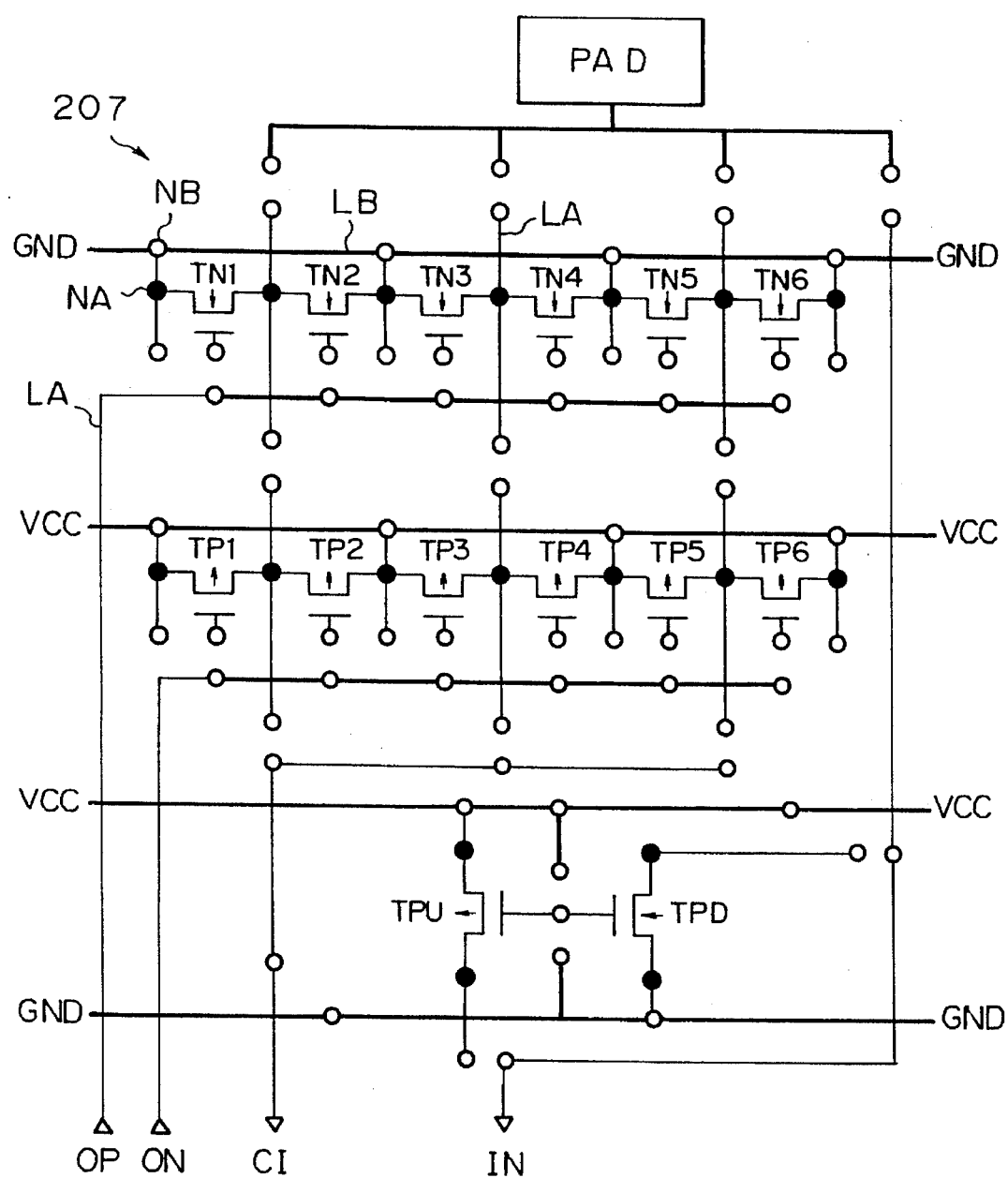
FIG. 17 is an equivalent circuit diagram symbolically illustrating transistor regions shown in FIG. 16A.
Figure 18:
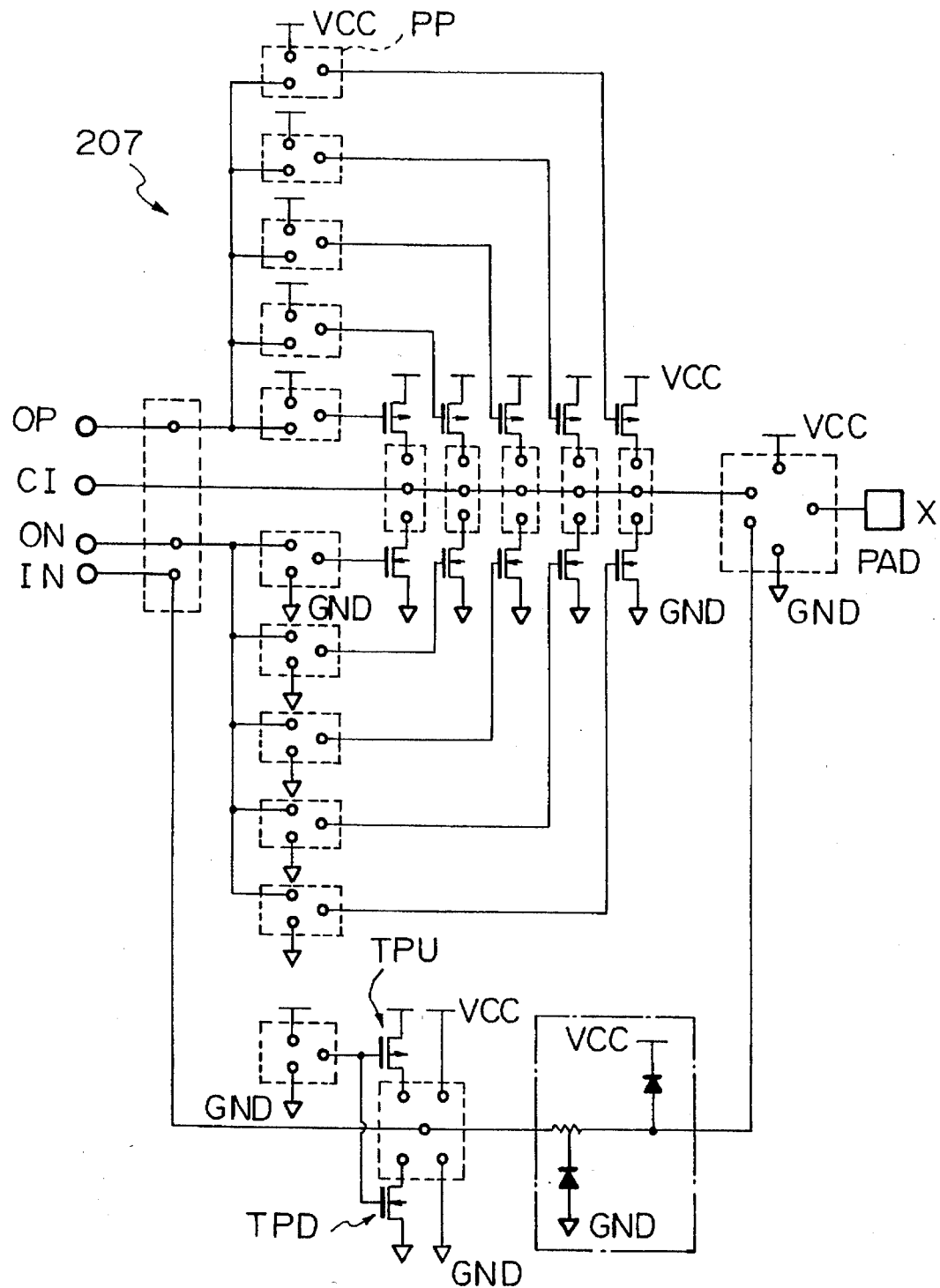
FIG. 18 is a circuit diagram equivalently illustrating the pattern of FIG. 16A, together with program points.

FIG. 17 illustrates an equivalent circuit, symbolically showing transistor diffusion regions TN1~TN6, TP1~TP6, TPU and TPD in FIG. 16A. Also, FIG. 18 illustrates an equivalent circuit of the pattern shown in FIG. 16A, together with program points. Each of the program points is shown by a block PP indicated by a dotted line, and corresponds to a region in which a correction between wirings is effected in the second wiring layer in accordance with demanded conditions of a given circuit. Also, the portion surrounded by a dot-dash line indicates an input protection circuit.

Next, various applications of the I/O cell in the master slice type LSI device according to the second aspect of the present invention will be explained with reference to FIGS. 19 to 34.

Figure 19:
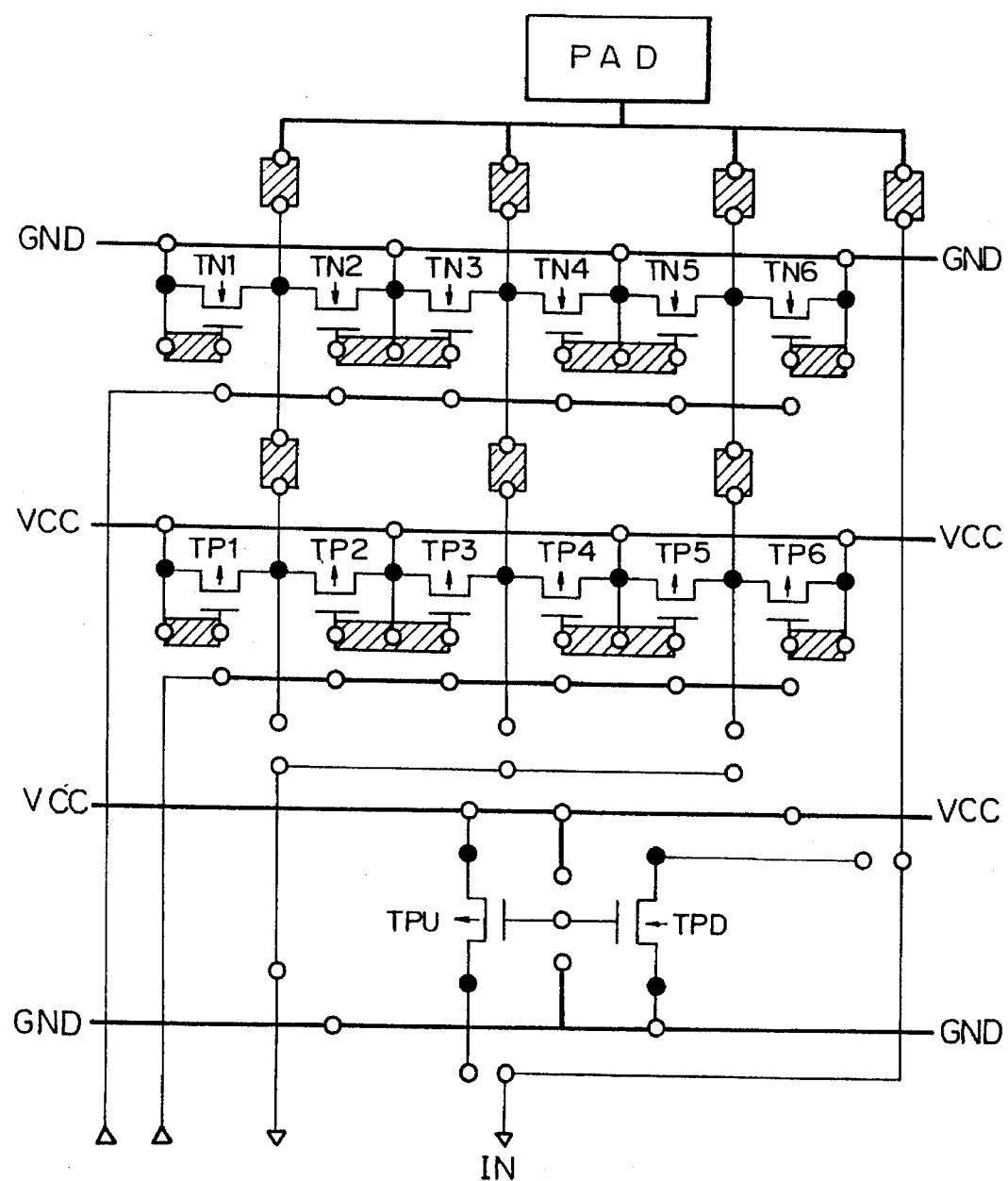
FIG. 19 is a pattern diagram of an input buffer circuit as a first application of the I/O cell.
Figure 20:
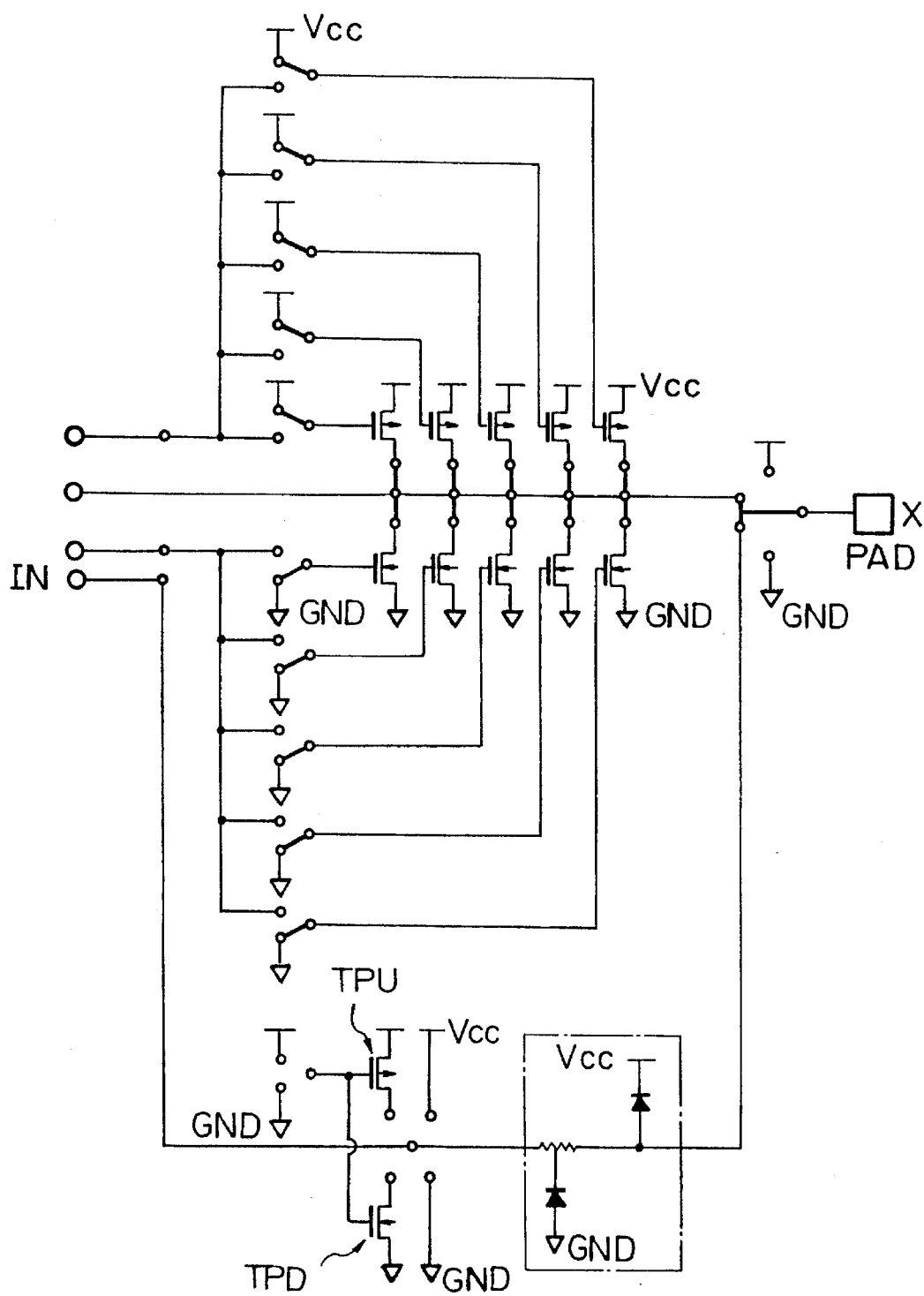
FIG. 20 is a circuit diagram equivalently illustrating the pattern of FIG. 19.

FIG. 19 illustrates a pattern diagram of an input buffer circuit as a first application, and FIG. 20 illustrates an equivalent circuit thereof.

The connection portion (program point) formed by the custom pattern mask is indicated by a hatched portion in FIG. 19, and by a thick solid line in FIG. 20. Note, the manner of the indication of connection portion (program point) is common to other applications described later.

In FIGS. 19 and 20, a signal input through the pad PAD is directly output to the terminal IN. Also, the p-channel MOS transistors TP1~TP6, each being brought to OFF state, and the n-channel MOS transistors TN1~TN6, each being brought to OFF state, are connected each other. Thus, a PN junction between the source and drain of the corresponding pair of p-channel and n-channel MOS transistors constitutes a parasitic diode, which functions as a protection circuit against static electricity.

Figure 21:
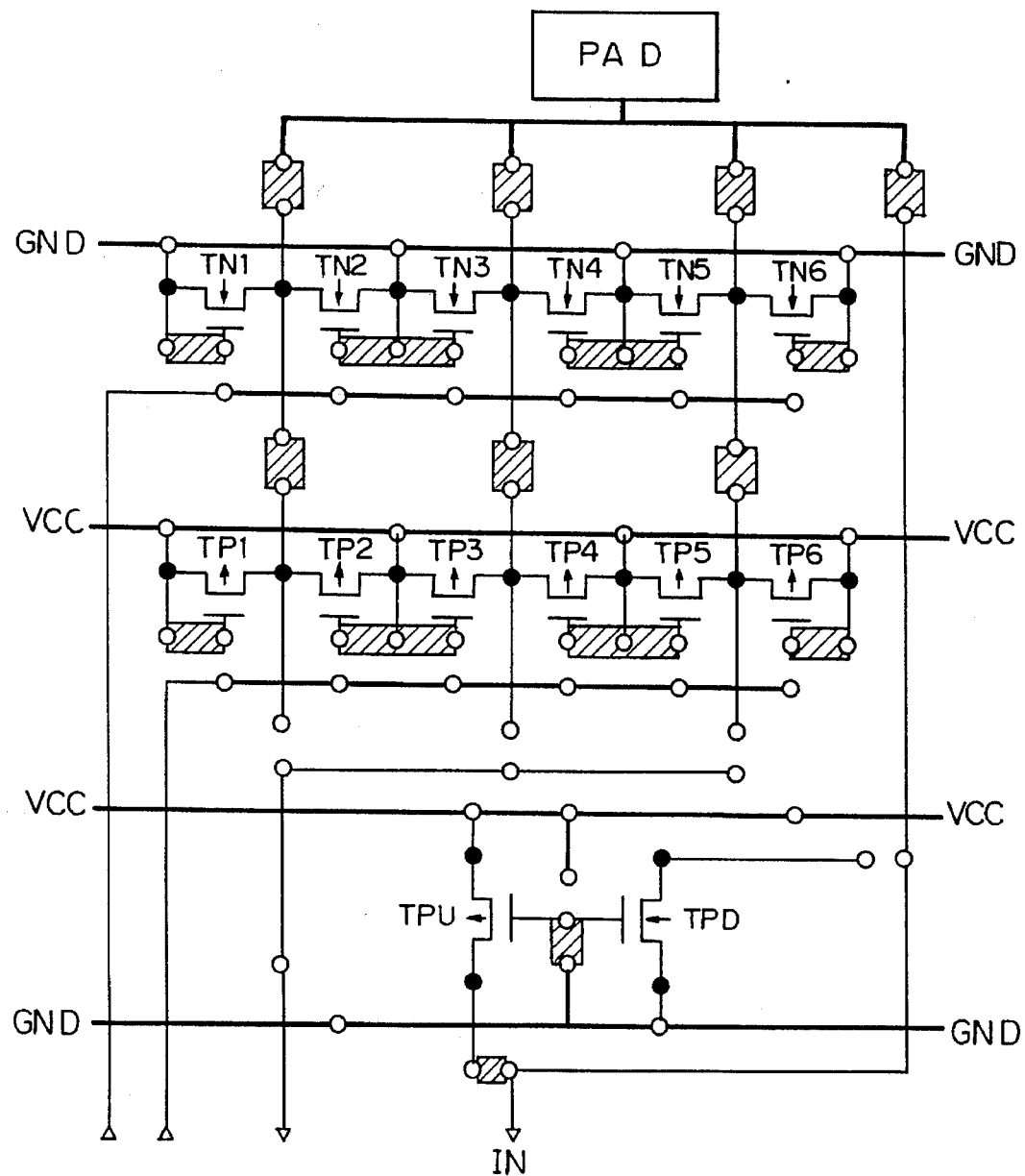
FIG. 21 is a pattern diagram of an input buffer circuit with a pull-up resistor as a second application of the I/O cell.
Figure 22:
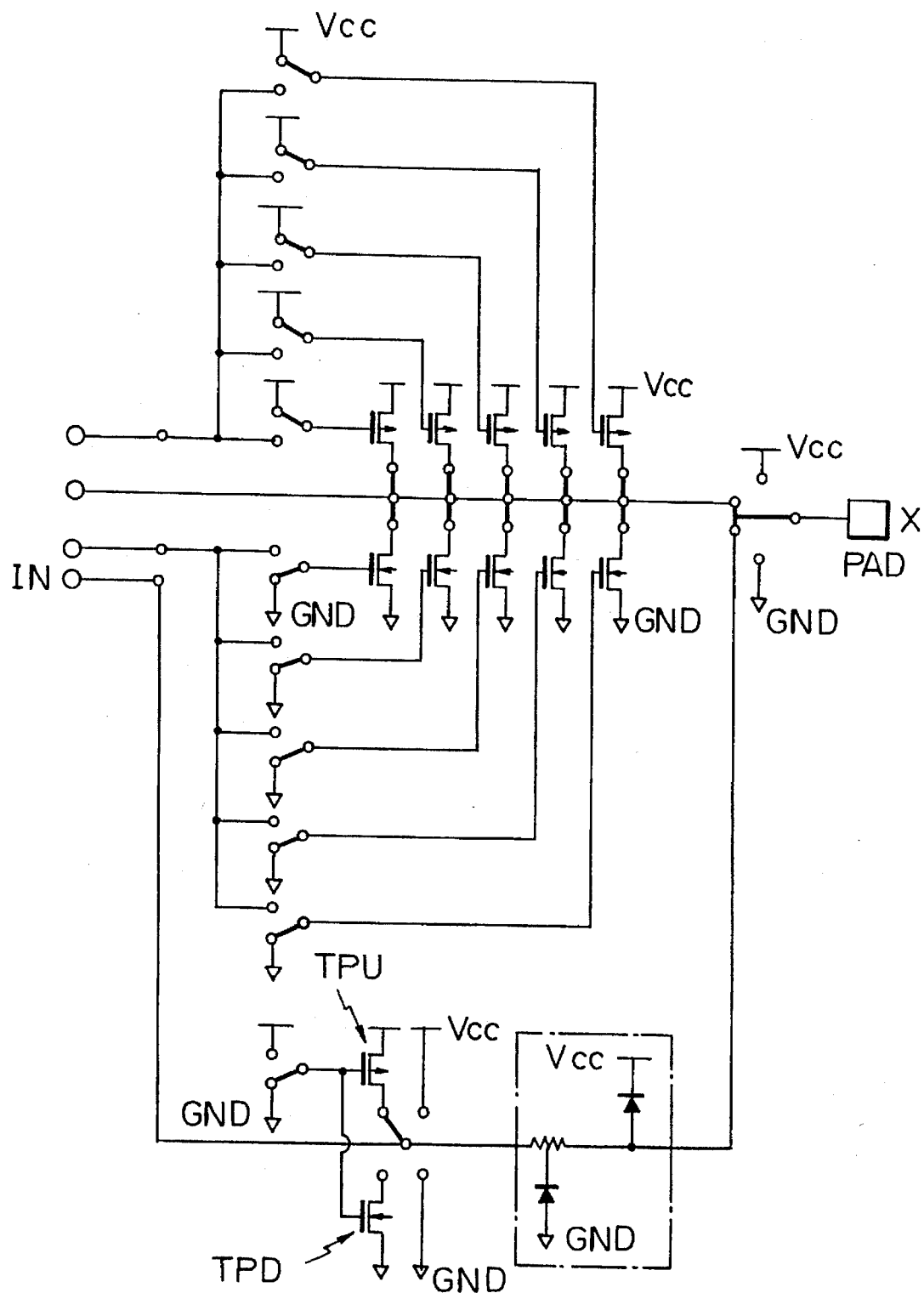
FIG. 22 is a circuit diagram equivalently illustrating the pattern of FIG. 21.
Figure 23:
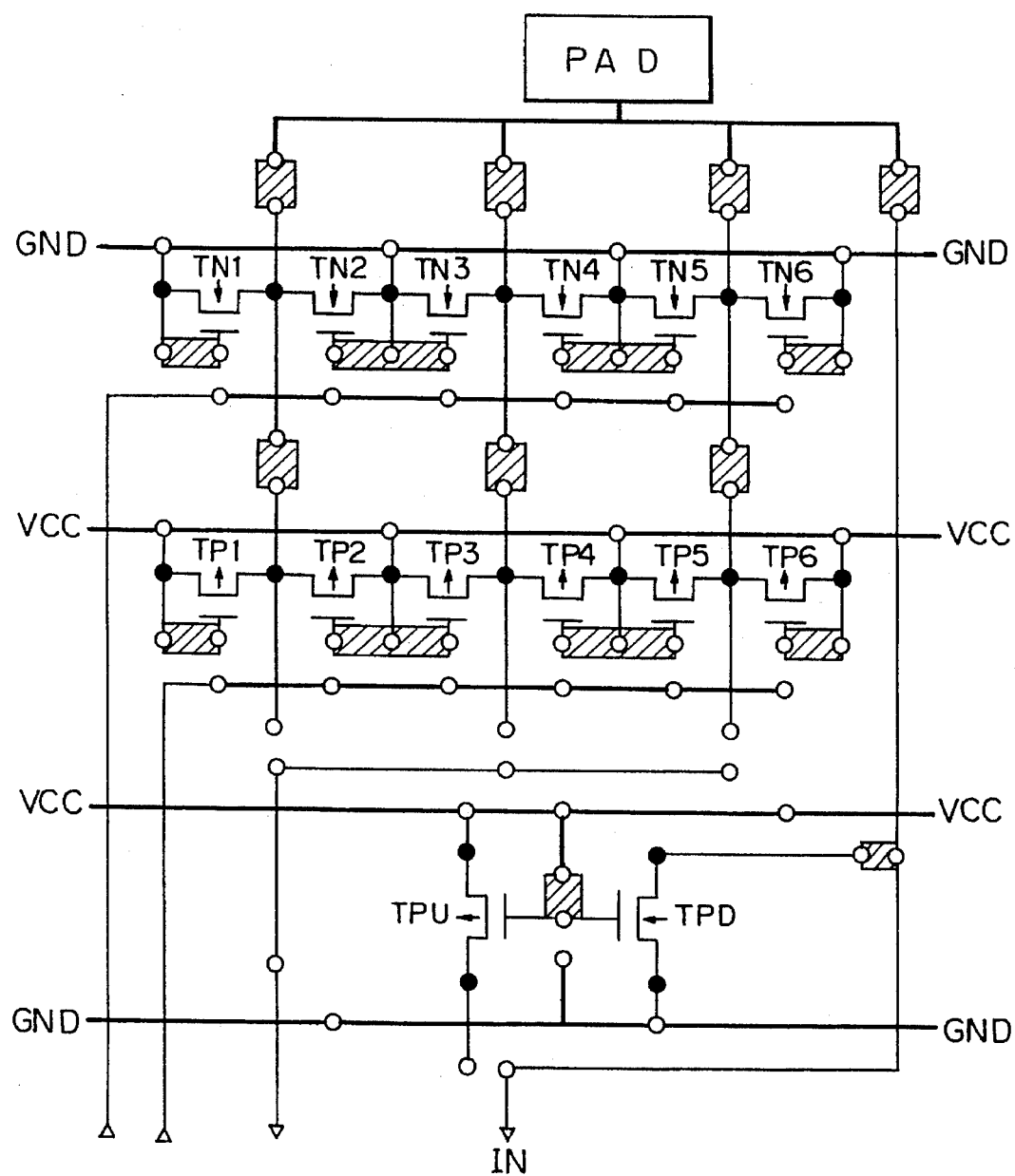
FIG. 23 is a pattern diagram of an input buffer circuit with a pull-down resistor as a third application of the I/O cell.
Figure 24:
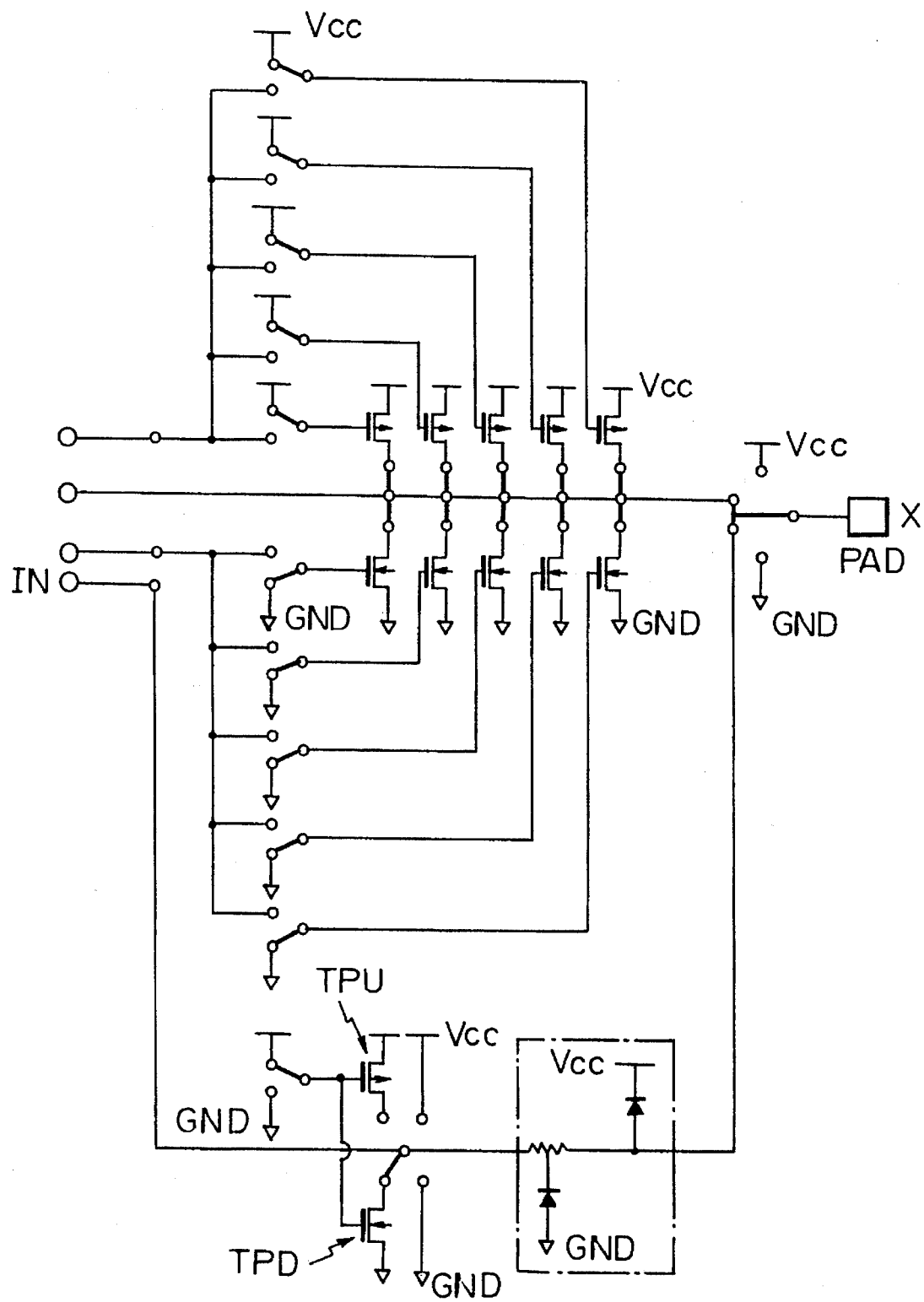
FIG. 24 is a circuit diagram equivalently illustrating the pattern of FIG. 23.

FIG. 21 illustrates a pattern diagram of an input buffer circuit with a pull-up resistor as a second application, and FIG. 22 illustrates an equivalent circuit thereof. Also, FIG. 23 illustrates a pattern diagram of an input buffer circuit with a pull-down resistor as a third application, and FIG. 24 illustrates an equivalent circuit thereof. The MOS transistor TPU in FIGS. 21, 22 is connected so as to be brought to normally-ON state and, accordingly, employed as a pull-up resistor. In the same manner, the MOS transistor TPD in FIGS. 23, 24 is connected so as to be brought to normally-ON state and, accordingly, employed as a pull-down resistor. Each resistance value of the pull-up resistor and pull-down resistor is appropriately selected according to the size of each transistor.

Figure 25:
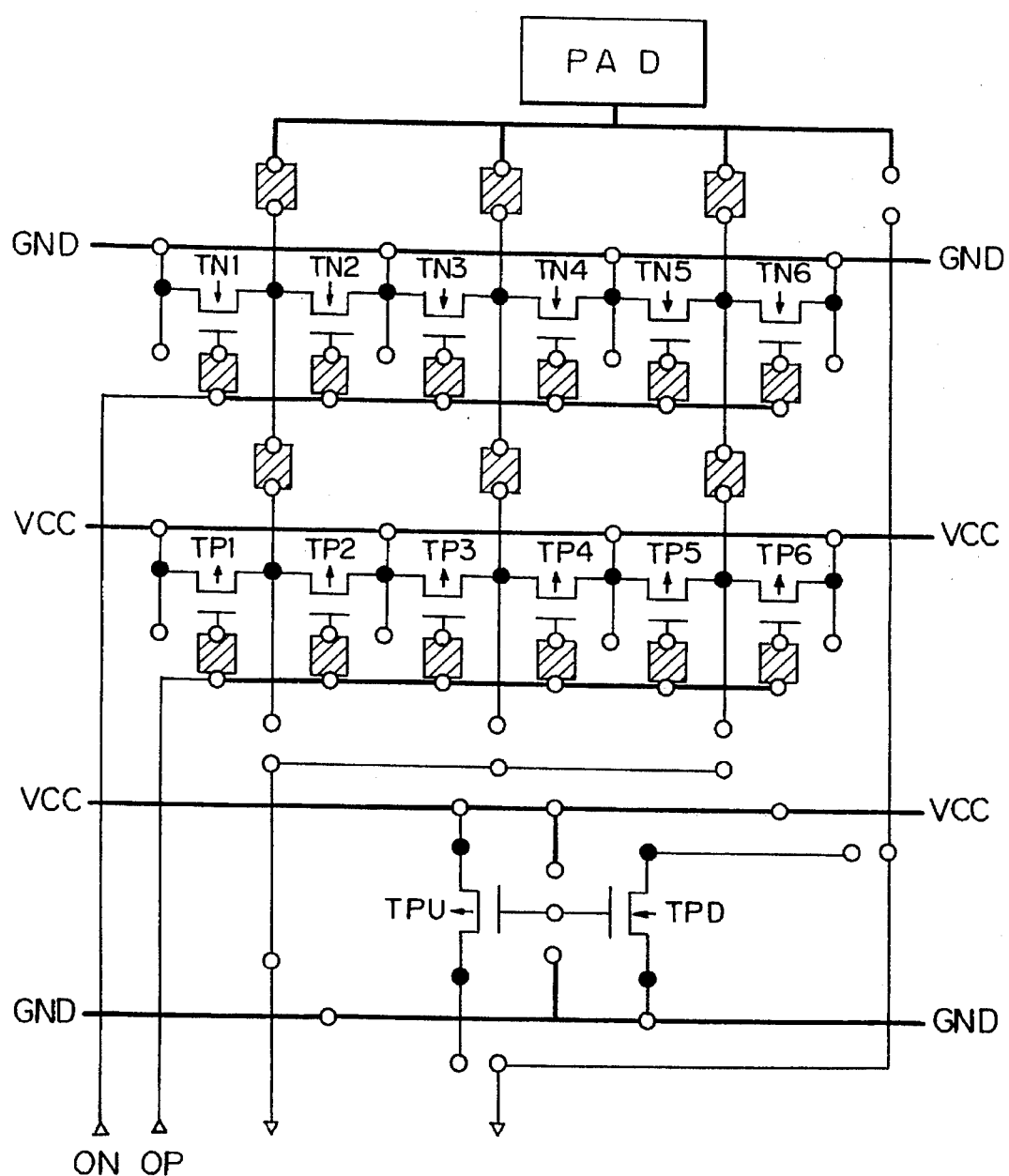
FIG. 25 is a pattern diagram of an output buffer circuit as a fourth application of the I/O cell.
Figure 26:
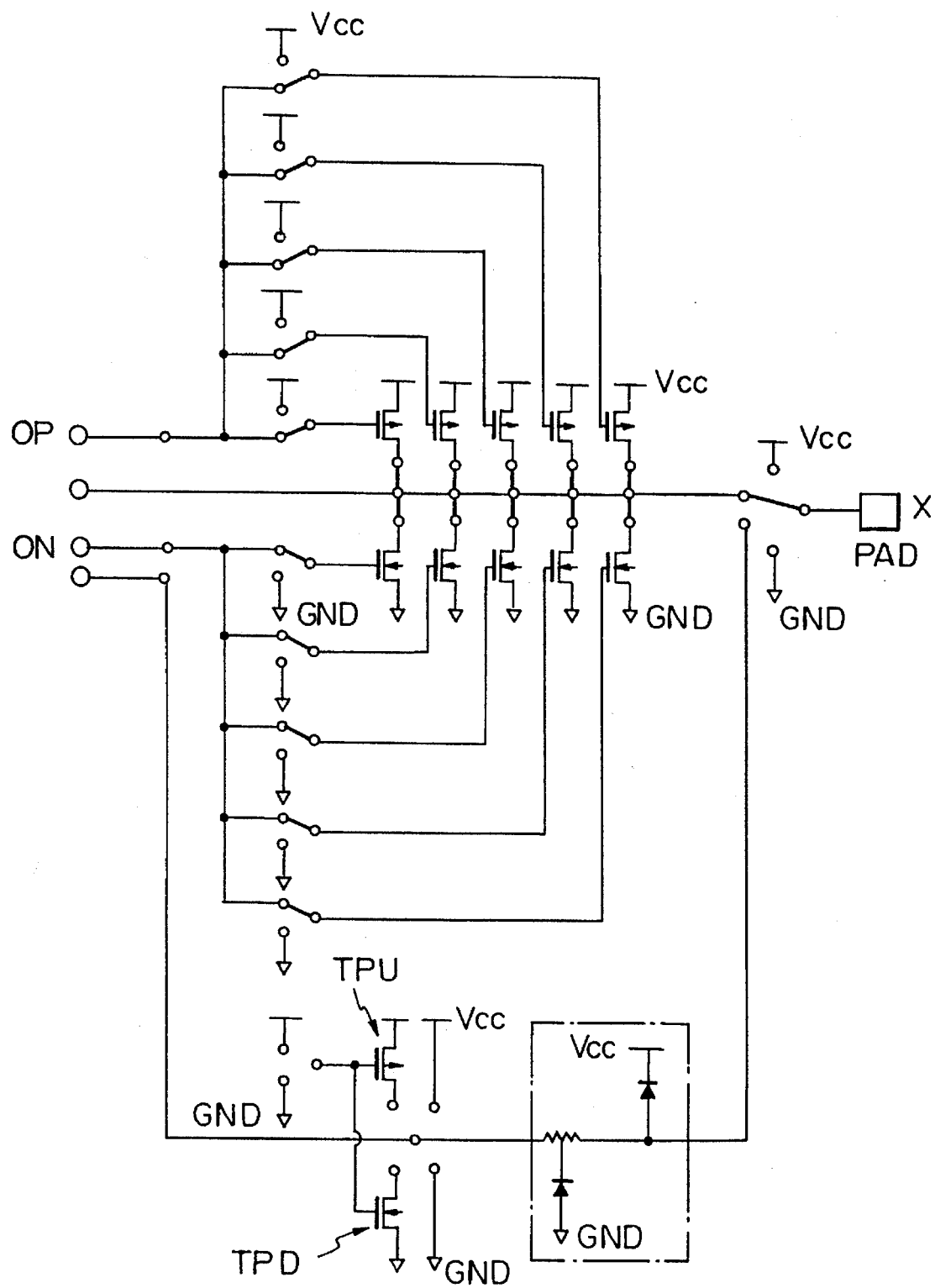
FIG. 26 is a circuit diagram equivalently illustrating the pattern of FIG. 25.

FIG. 25 illustrates a pattern diagram of an output buffer circuit as a fourth application, and FIG. 26 illustrates an equivalent circuit thereof.

In FIGS. 25 and 26, output signals from internal cells are fed through the terminals OP and ON. By bringing the p-channel and n-channel MOS transistors TP1~TP6, TN1~TN6 receiving the output signals to OFF state, it is possible to gain a desired driving ability.

Figure 27:
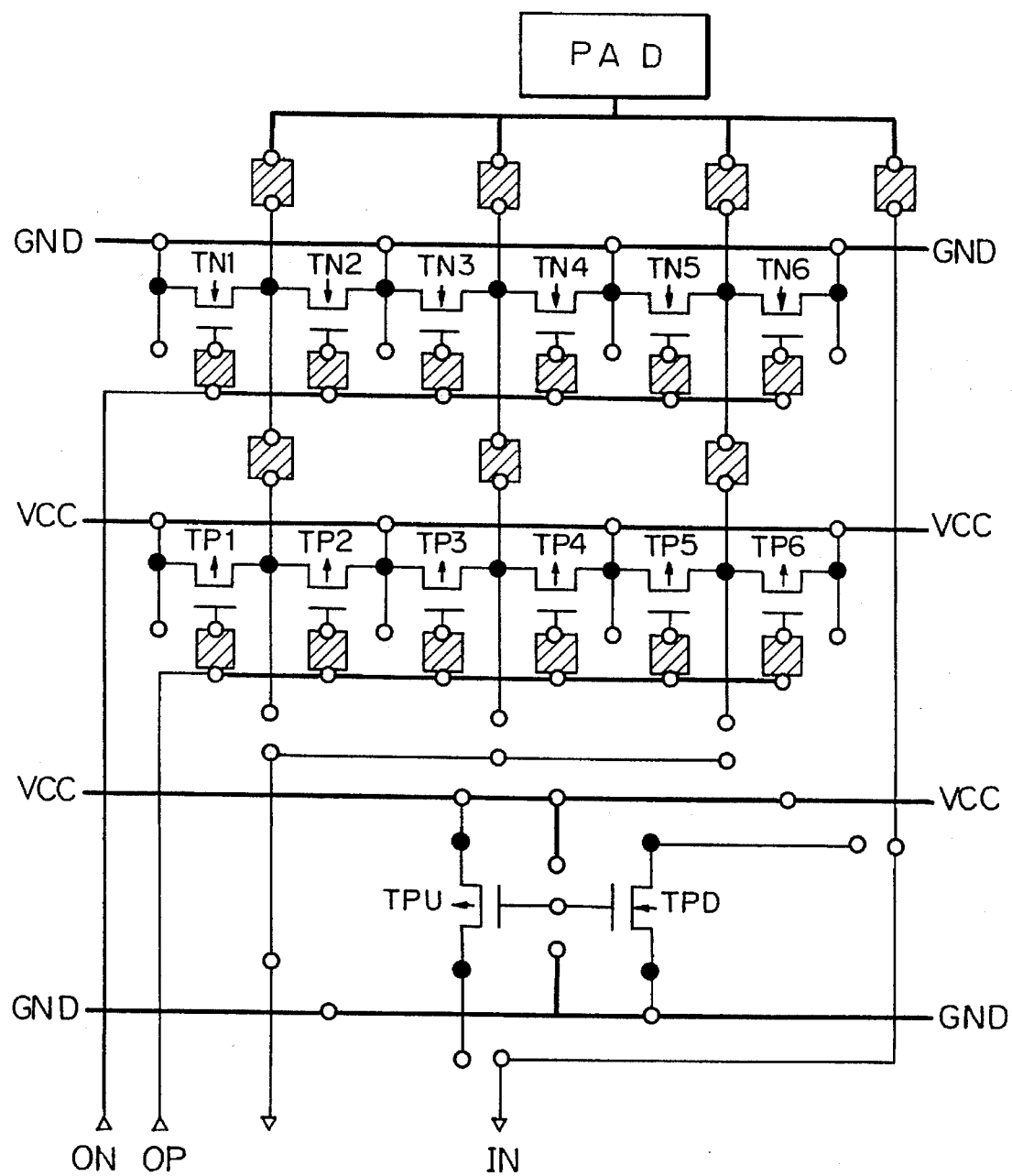
FIG. 27 is a pattern diagram of a bidirectional buffer circuit as a fifth application of the I/O cell.
Figure 28:
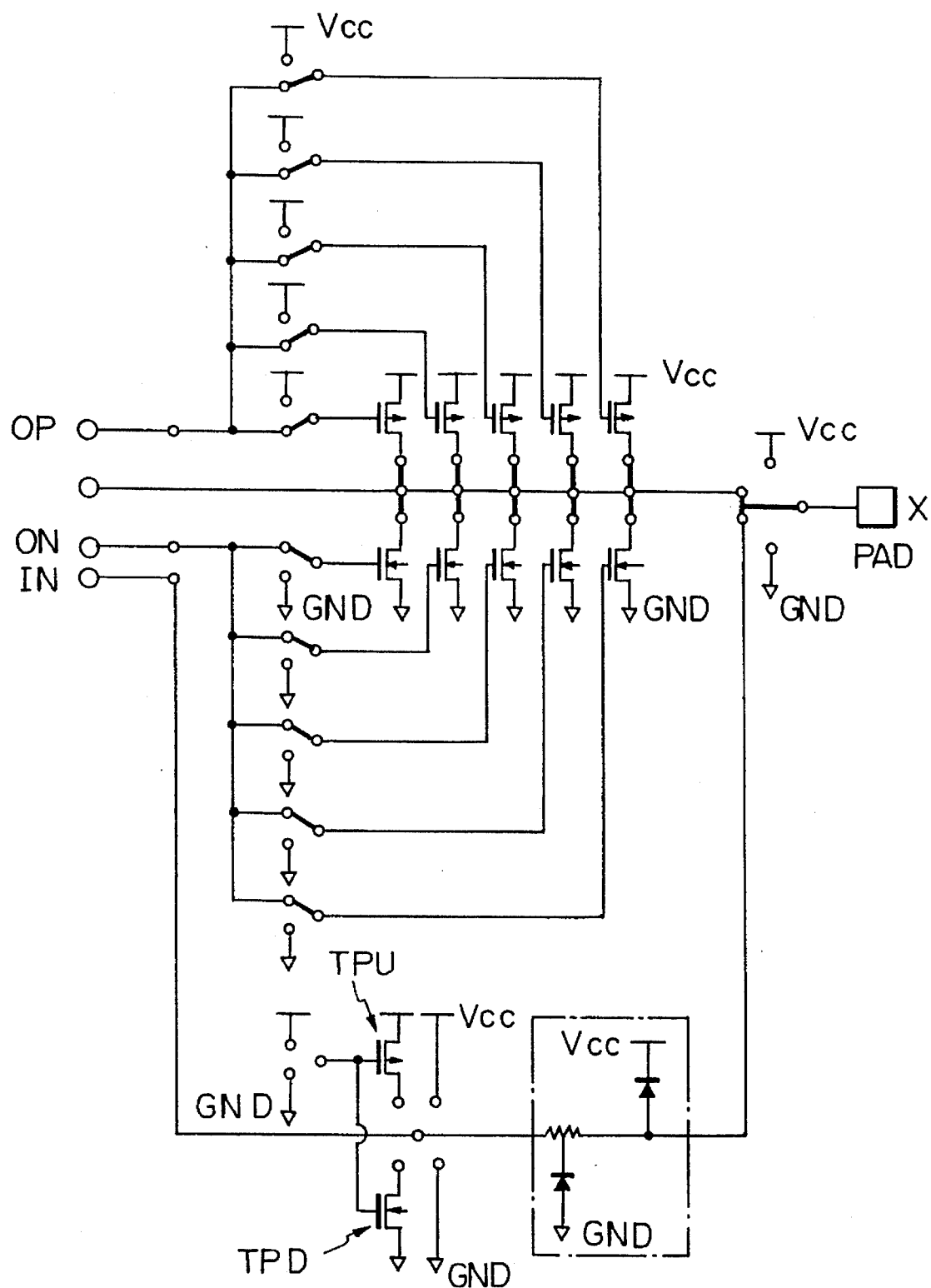
FIG. 28 is a circuit diagram equivalently illustrating the pattern of FIG. 27.

FIG. 27 illustrates a pattern diagram of a bidirectional buffer circuit as a fifth application, and FIG. 28 illustrates an equivalent circuit thereof. The illustrated bidirectional buffer circuit is a combination of the input buffer circuit shown in FIGS. 19, 20 and the output buffer circuit shown in FIGS. 25, 26. Also, the pull-up resistor or pull-down resistor can be provided with the bidirectional buffer circuit, if necessary.

Figure 29:
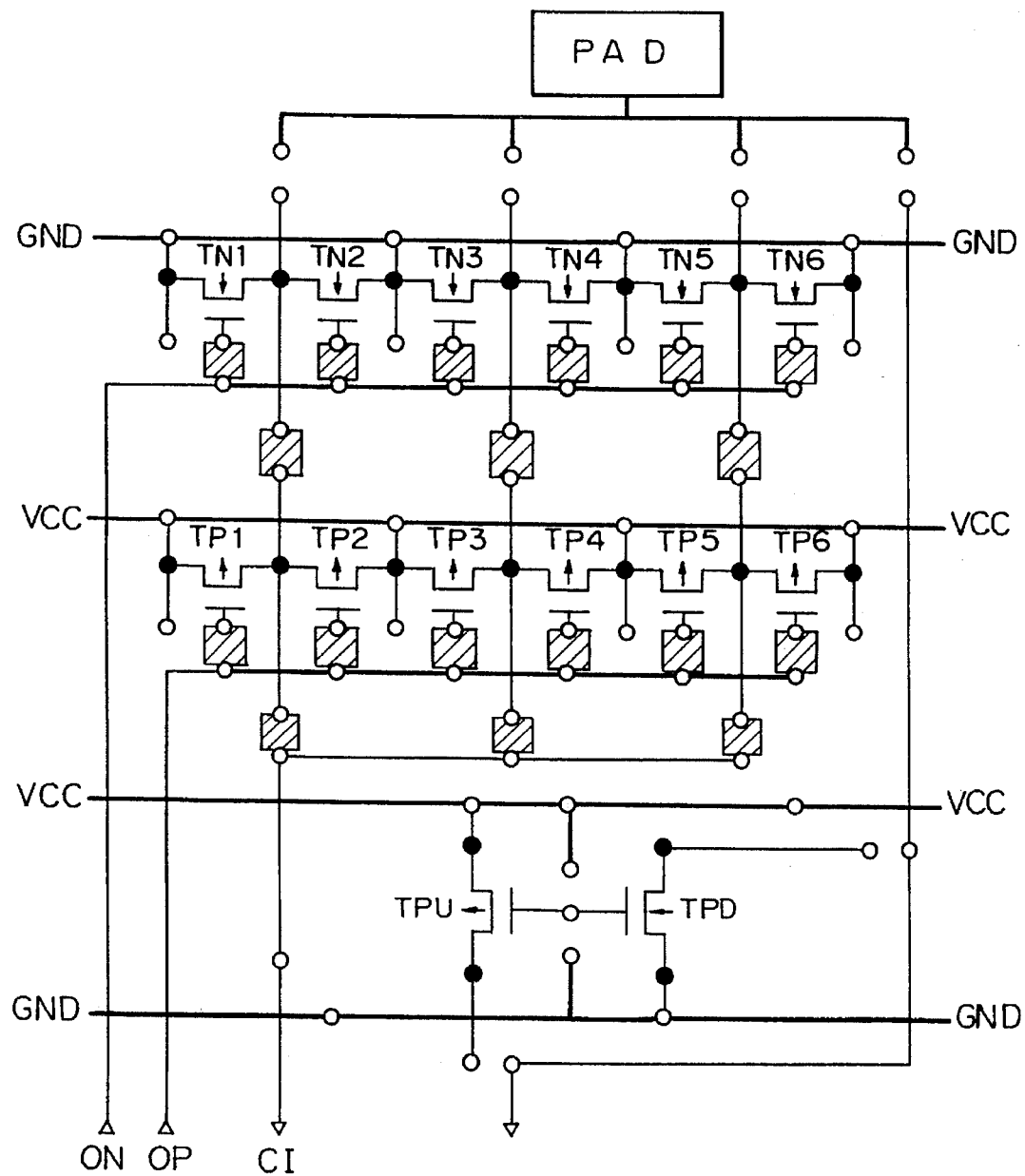
FIG. 29 is a pattern diagram of a clock buffer circuit as a sixth application of the I/O cell.
Figure 30:
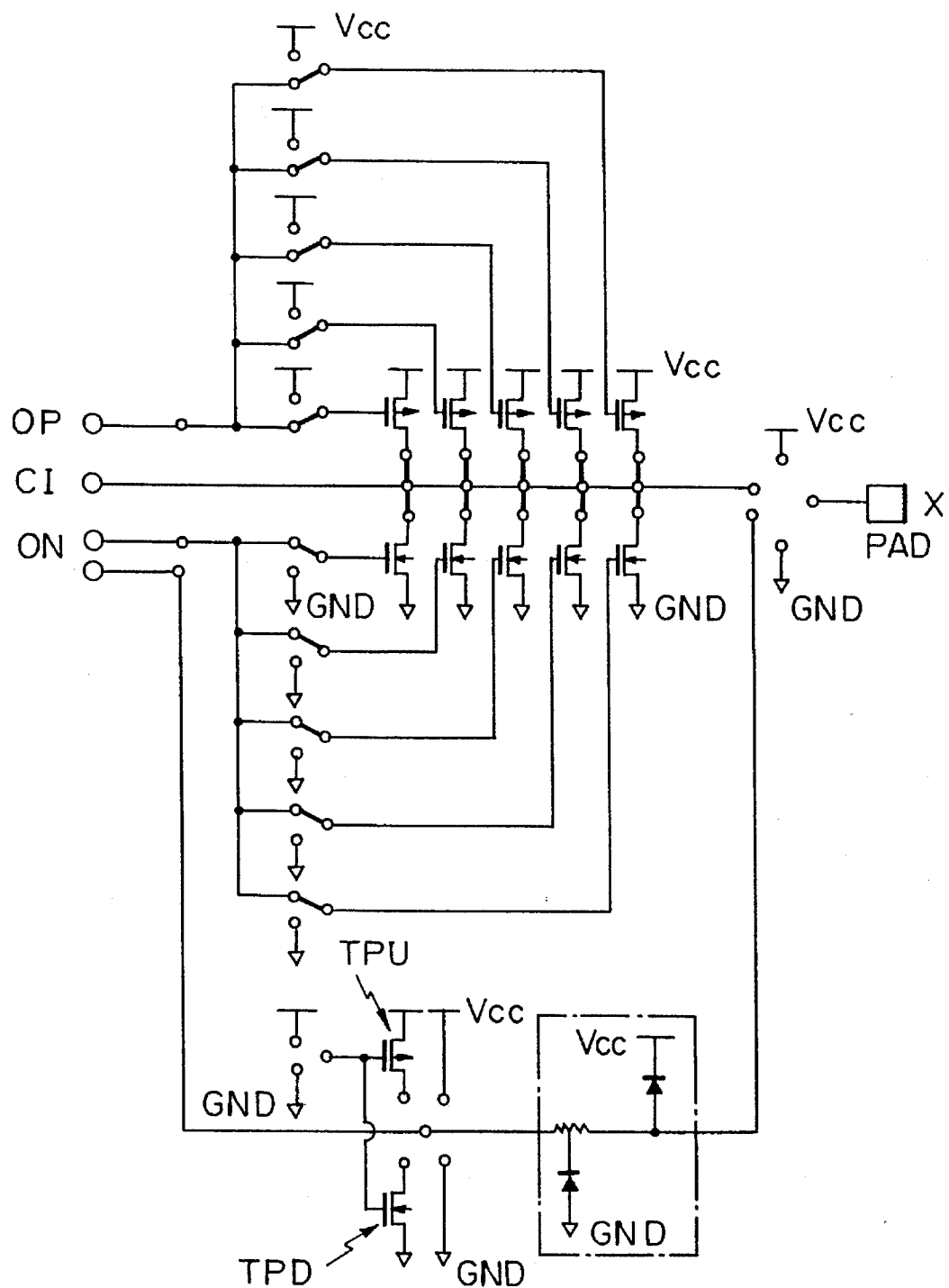
FIG. 30 is a circuit diagram equivalently illustrating the pattern of FIG. 29.

FIG. 29 illustrates a pattern diagram of a clock buffer circuit as a sixth application, and FIG. 30 illustrates an equivalent circuit thereof.

In FIGS. 29 and 30, output signals from internal cells are fed through the terminals OP and ON, and a clock signal is fed through the terminal CI to the internal cells. Since the clock buffer circuit drives the internal cells of heavy load, its scale or size inevitably becomes large. As a result, it is difficult to constitute the clock buffer circuit by the internal cells. Contrary to this, since the clock buffer circuit according to the present embodiment is constituted by I/O cells provided in the periphery on the chip, it is possible to prevent increase in the size of the chip.

Figure 31:
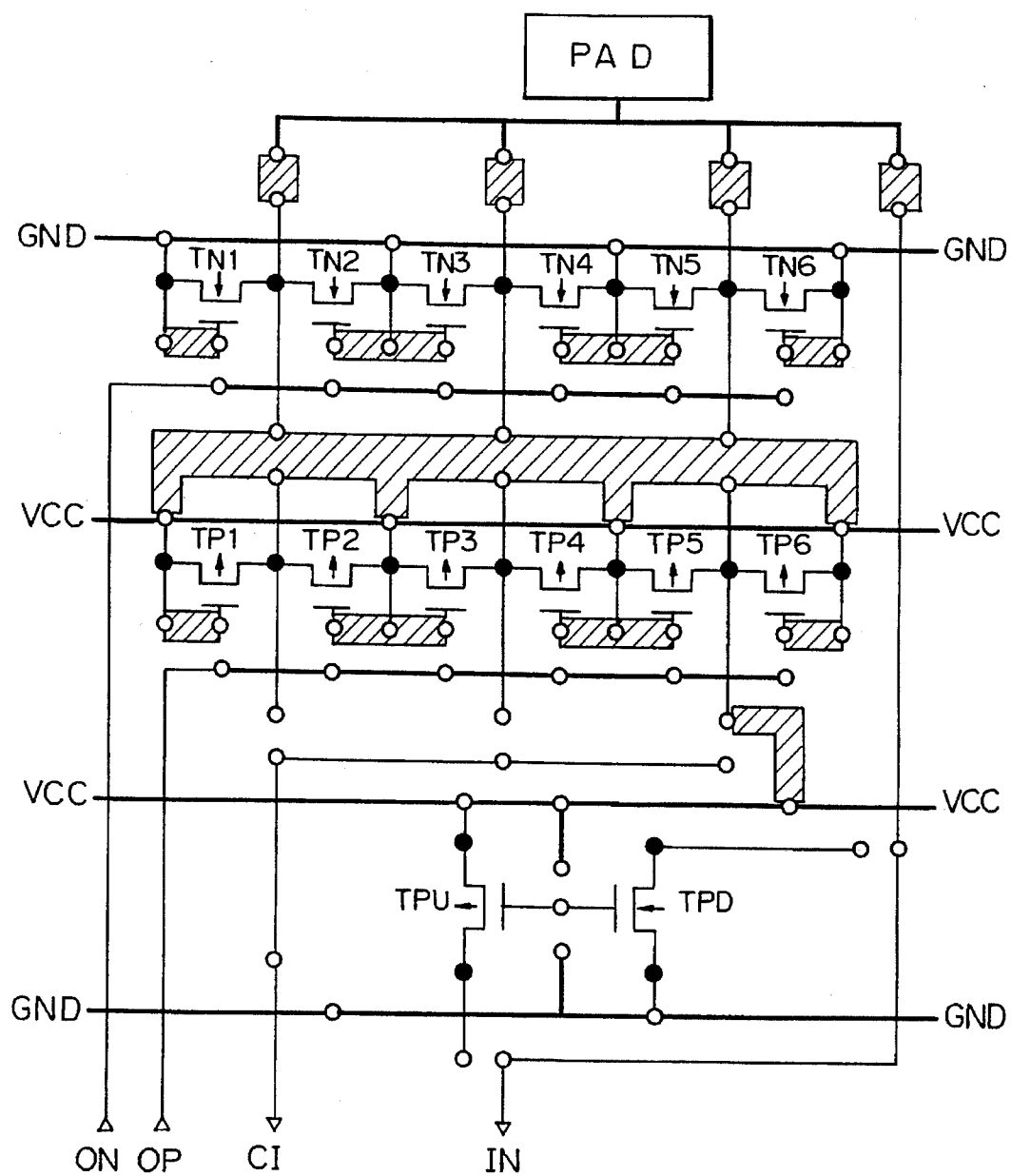
FIG. 31 is a pattern diagram of a power voltage supply circuit as a seventh application of the I/O cell.
Figure 32:
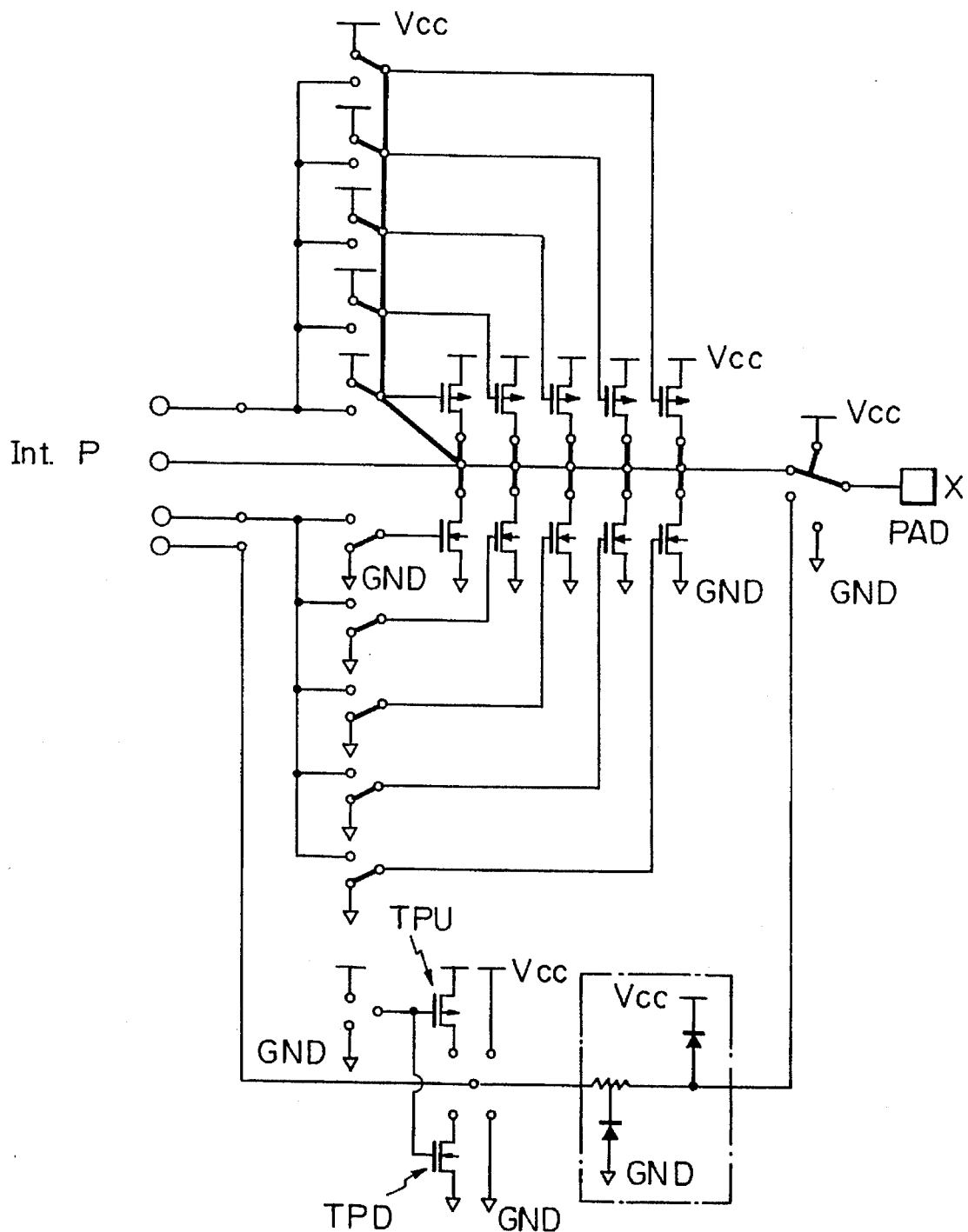
FIG. 32 is a circuit diagram equivalently illustrating the pattern of FIG. 31.
Figure 33:
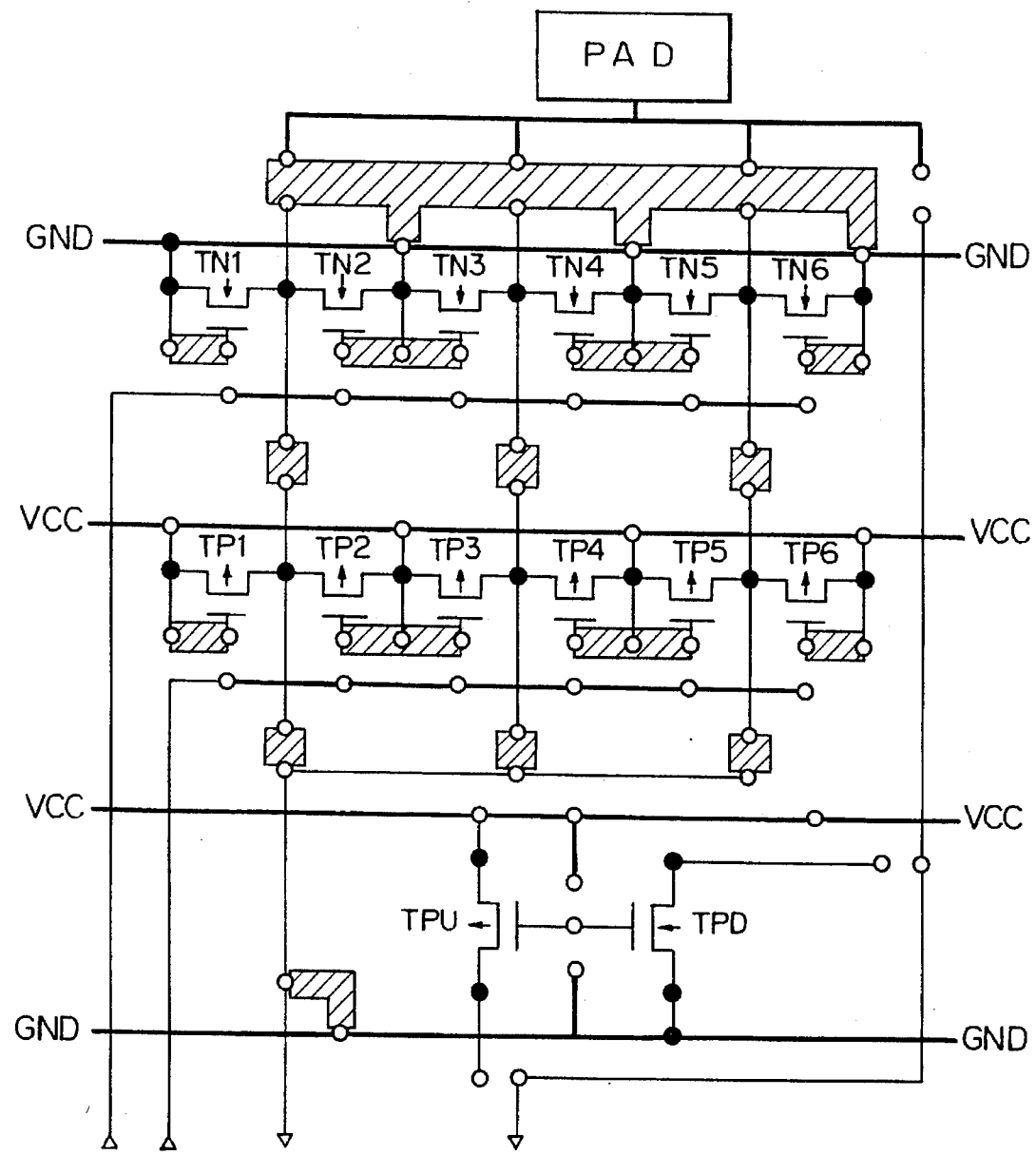
FIG. 33 is a pattern diagram of a ground voltage supply circuit as a eighth application of the I/O cell.
Figure 34:
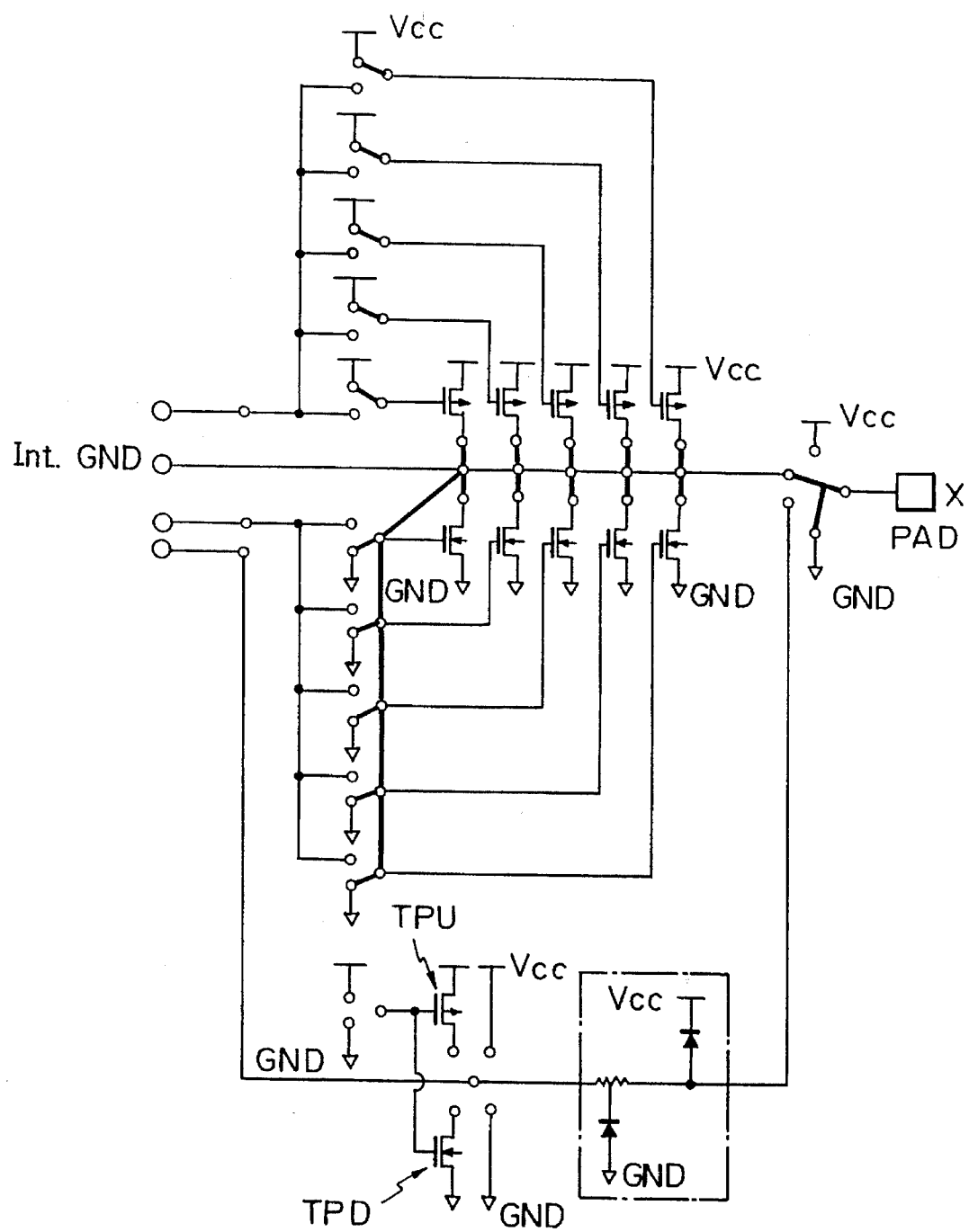
FIG. 34 is a circuit diagram equivalently illustrating the pattern of FIG. 33.

FIG. 31 illustrates a pattern diagram of a power voltage supply circuit as a seventh application, and FIG. 32 illustrates an equivalent circuit thereof. Also, FIG. 33 illustrates a pattern diagram of a ground voltage supply circuit as a eighth application, and FIG. 34 illustrates an equivalent circuit thereof.

Figure 35:
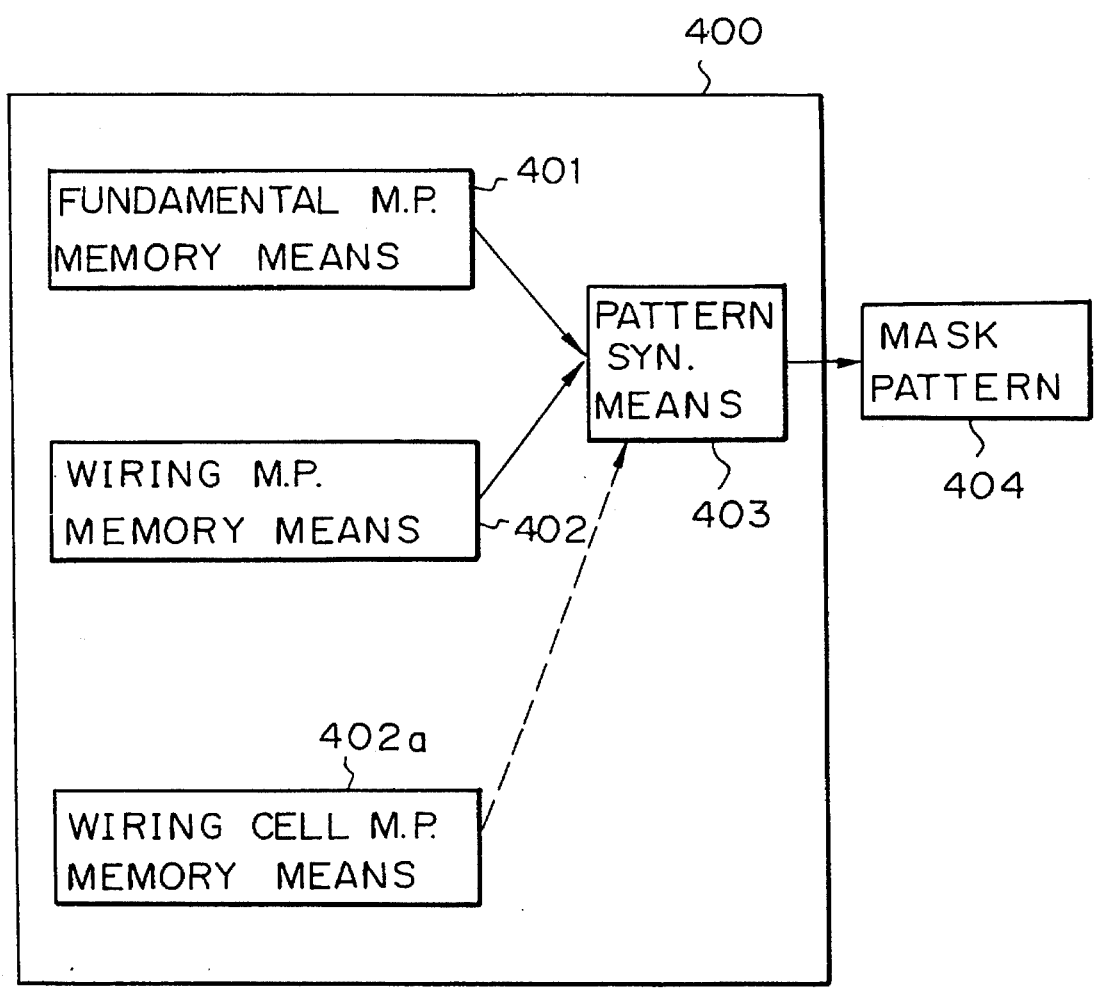
FIG. 35 is a block diagram for explaining the concept of designing the master slice type LSI device.

Next, a constitution of the apparatus of designing the master slice type LSI device will be described with reference to FIG. 35.

The illustrated designing apparatus 400 comprises a fundamental mask pattern memory means 401, a wiring mask pattern memory means 402 and a pattern synthesizing means 403.

The fundamental mask pattern memory means 401 stores two kinds of fundamental mask pattern information. One is a first fundamental mask pattern information consisting of four kinds of mask patterns, i.e., contact holes NA, first wiring layer(wirings) LA, through holes NB and second wiring layer(wirings) LB, necessary for forming a demanded connection between constituent elements in the basic cell region. Another is a second fundamental mask pattern information consisting of four kinds of mask patterns, i.e., contact holes NA, first wiring layer(wirings) LA, through holes NB and second wiring layer(wirings) LB, necessary for foxing a demanded connection between constituent elements in the I/O circuits provided on the master chip.

Also, the wiring mask pattern memory means 402 stores two kinds of wiring mask pattern information. One is a first plurality of wiring mask patterns with respect to one wiring layer to be combined on the fundamental mask patterns, and another is a second plurality of wiring mask patterns necessary for forming one wiring layer in the program points in accordance with the kind of the I/O circuit to constitute the connection portions. The I/O circuit corresponds to the input buffer circuit, output buffer circuit, bidirectional buffer circuit, power voltage supply circuit or the like, as shown in FIGS. 19~34.

The mask pattern of the internal circuit (basic cells) in the LSI is generated based on the first fundamental mask pattern information stored in the fundamental mask pattern memory means 401 and the first wiring mask pattern information stored in the wiring mask pattern memory means 402. On the other hand, the mask pattern of the I/O circuit in the LSI is generated based on the second fundamental mask pattern information and the second wiring mask pattern information. Namely, according to the second aspect of the present invention, the second fundamental mask pattern information and the second wiring mask pattern information corresponding to the kind of the I/O circuit are read out by the pattern synthesizing means 403, where both groups of pattern information are synthesized to generate the mask pattern 404 of the I/O circuit. Thus, the designing of the mask pattern of the I/O circuit can be facilitated and, accordingly, it is possible to greatly reduce time needed for the designing, compared with the prior art designing apparatus.

Next, a method of producing the master slice type LSI device will be explained with reference to FIGS. 36A to 36C.

The method of producing the master slice type LSI device, roughly classifying, includes the steps of forming the basic cell regions 201 together with the I/O cell regions 202 (see FIG. 1) and forming the wiring pattern using a custom mask on the cell regions.

Figure 36A:
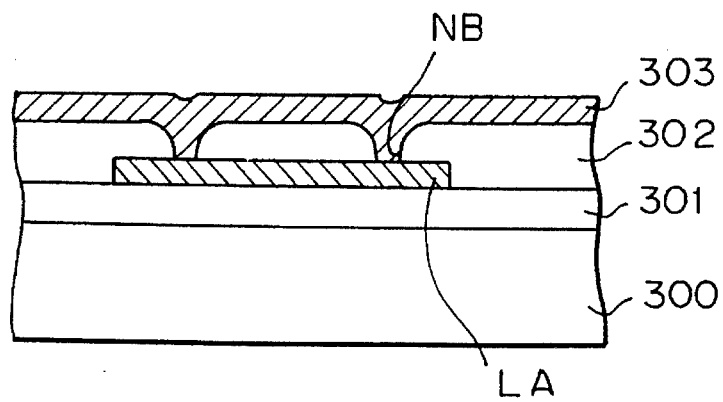
FIGS. 36A to 36C are sectional views for explaining a process of producing the master slice type LSI device.

As shown in FIG. 36A, the basic cell regions and I/O cell regions are produced by: forming an insulation layer 301 consisting of silicon oxide and including contact holes NA (not shown) on a semiconductor substrate 300; forming thereon the first wiring layer LA by aluminium(Al) evaporation; forming thereon an insulation layer 302 consisting of silicon oxide; forming through holes NB in the insulation layer 302 so that they contact the first wiring layer LA; and forming thereon a conduction layer 303.

Figure 36B:
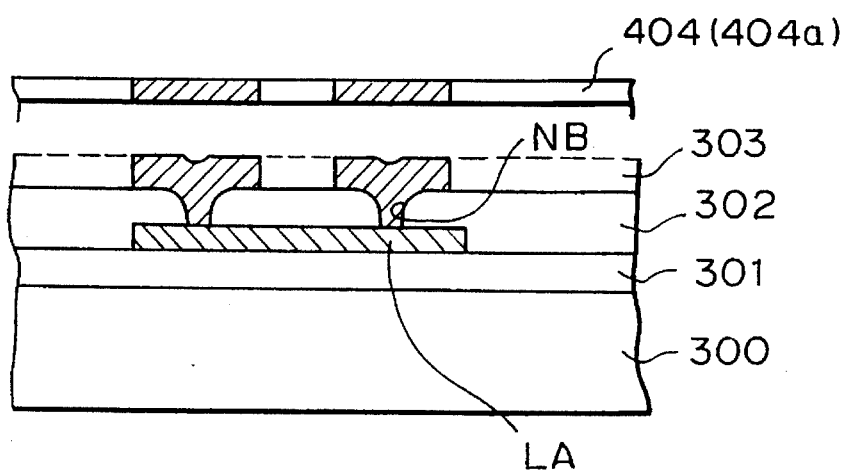

Next, the mask pattern (including the mask pattern 404 of the I/O circuit) is designed by the designing apparatus 400 (see FIG. 35) in accordance with the user's specification and then a desired wiring patterning is effected on the conduction layer 303 by etching process using the designed mask pattern (see FIG. 36B).

Figure 36C:
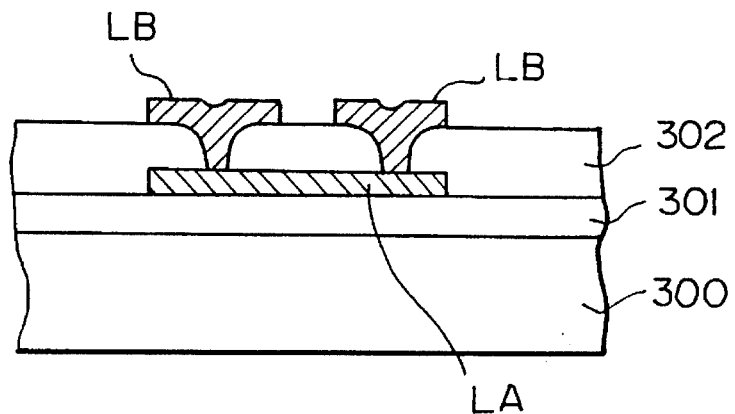

As a result of the above steps, a desired second wiring layer LB is formed as shown in FIG. 36C, and the master slice type LSI device according to the user's specification can be produced.

As explained above, it is possible to produce a desired master slice type LSI device easily and in a short period by suitably desiring only the mask pattern of the second wiring layer, Especially, since one custom mask approach is applied to the I/O cell region, it is possible to greatly reduce the turnaround time of the device. Also, since the conduction layer is formed on the entire insulation layer in forming the master chip, the subsequent process of wiring patterning can be omitted. This simplifies a process of producing the LSI device and, accordingly, contributes to the reduction in the turnaround time.

Next, preferred embodiments according to the third aspect of the present invention will be explained with reference to FIGS. 37A to 41 and 15A to 15C.

For a better understanding of the preferred embodiment according to the third aspect, the problem in the prior art will be explained with reference to FIGS. 37A to 37C.

Figure 37A:
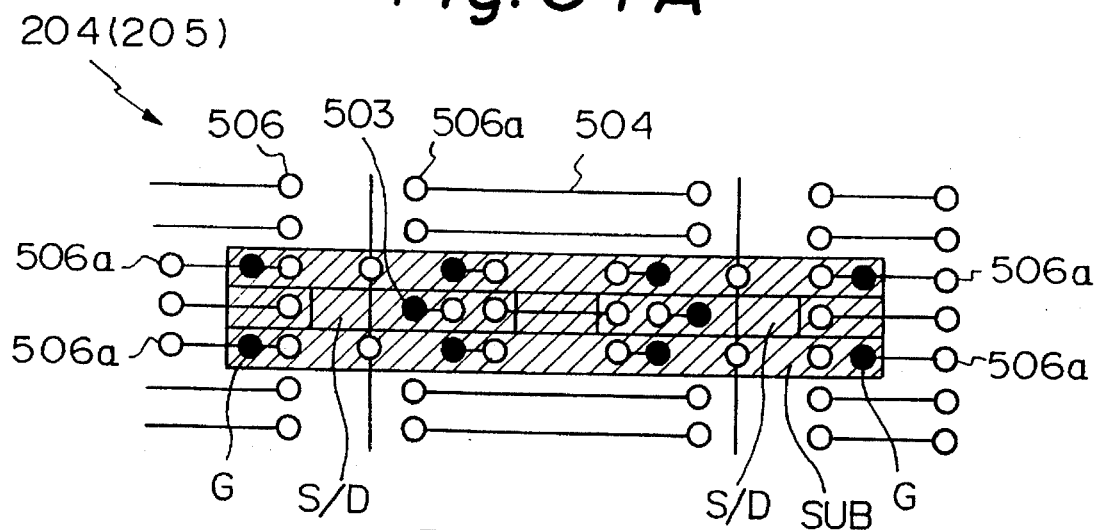
FIGS. 37A to 37C are views for explaining a problem in the prior art master slice approach.
Figure 37B:
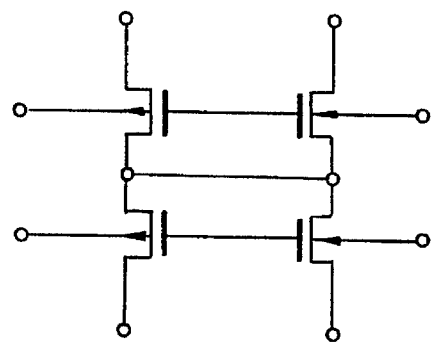
Figure 37C:
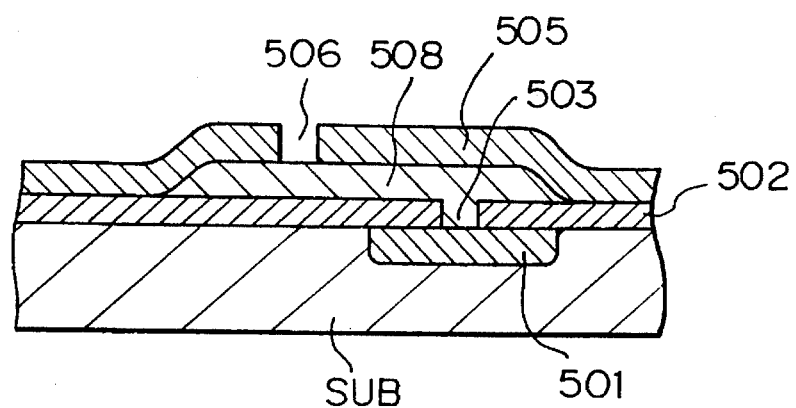

FIGS. 37A to 37C illustrate a detailed plan view of the basic cell 204(205), an equivalent circuit and a sectional structure thereof, respectively. In FIG. 37A, the basic cell is indicated by a hatched portion.

Referring to FIG. 37C, a diffusion layer 501 of a MOS transistor formed on a substrate SUB is connected via a contact hole 503 formed in an insulation layer 502 to a first wiring layer 508. The first wiring layer 508 is insulated by an insulation layer 505, which includes a through hole 506 at a predetermined position. On the other hand, referring to FIG. 37A, it is obvious that a through hole 506 (except for a through hole 506a) formed outside the basic cell cannot be connected to the first wiring layer(wirings) 508 connected to the diffusion layer 501 of the MOS transistor formed inside the basic cell. Accordingly, even if a second wiring layer is formed on the through hole 506, it is not short-circuited to the first wiring layer 508. As a result, a through hole 506 formed inside the basic cell and the above through hole 506a formed outside the basic cell constitutes a wiring obstruction pattern, where a connection between them is unnecessary.

Therefore, in forming a wiring pattern of one layer using one custom mask approach, a wiring pattern which bypasses the wiring obstruction pattern needs to be employed. Conventionally, in forming one layer wiring in the basic cell region according to one custom mask approach, other region such as the bypass wiring region 240 (see FIG. 15A) has been used for bypassing the wiring obstruction pattern. This is because, in the prior art designing apparatus, it has been difficult to utilize an unused region on the basic cell region and design a wiring pattern for bypassing the wiring obstruction pattern, in the efficiency and speed of processing.

However, where one layer wiring is formed using a region for private use of bypass, such bypass private region must be secured between basic cells. Thus, it is difficult to fore a basic cell array in which a plurality of basic cells are densely arranged. On the other hand, to realize a basic cell array of double column structure, it becomes necessary to form another wiring pattern of one layer (corresponding to a third wiring layer) as the bypass private region. As a result, there occurs a problem in that one custom mask approach cannot be utilized. Also, where a connection is effected between each side of the basic cell array of coyle column structure, the wiring must be formed via the bypass private region. Accordingly, there occurs another problem in that the wiring is unnecessarily lengthened and its resistance is increased.

Figure 38:
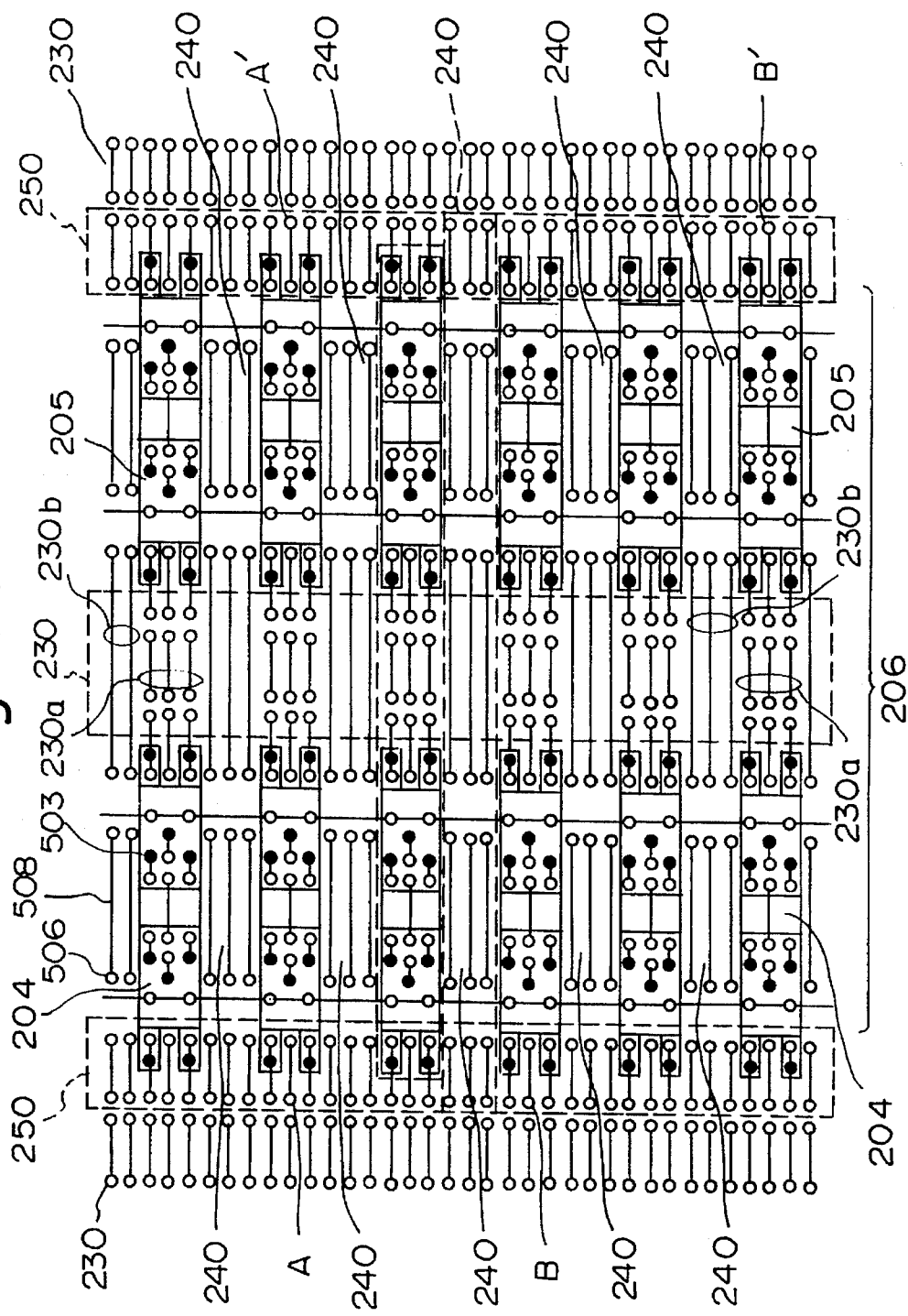
FIG. 38 is a pattern diagram illustrating a detailed arrangement of the basic cells shown in FIG. 15A, with relation to the third aspect of the present invention.
Figure 39:
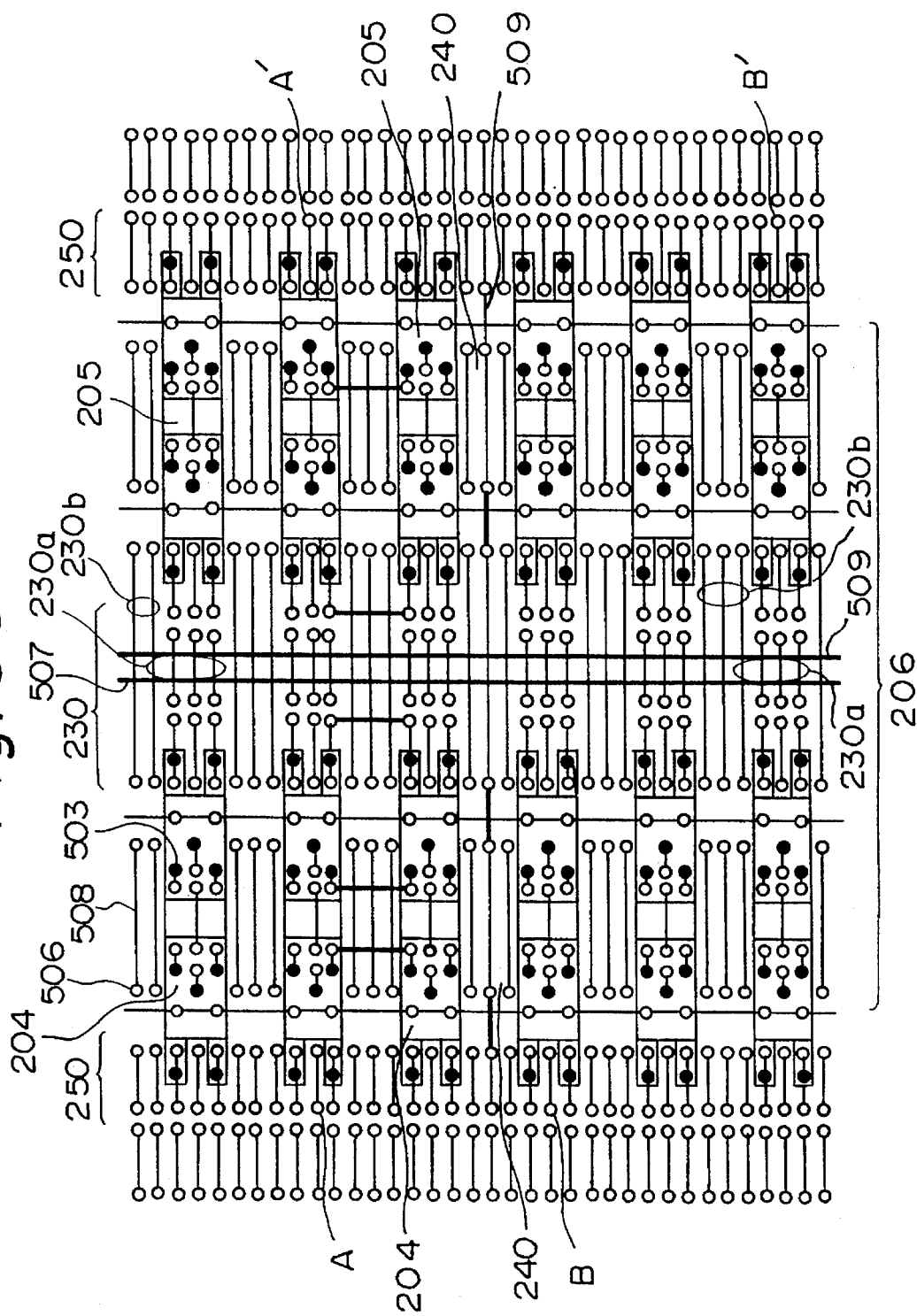
FIG. 39 is a pattern connection diagram illustrating an example of the use of the bypass wiring regions shown in FIG. 38.

FIG. 38 illustrates a pattern diagram of a detailed arrangement of the basic cells shown in FIG. 15A, and FIG. 39 illustrates an example of connection in the bypass wiring regions 240 shown in FIG. 38.

Referring to FIGS. 38 and 39, the diffusion layer of MOS transistors formed in each basic cell 204, 205 is connected via contact holes 503 to the first wiring layer(wirings) 508. The first wiring layer(wirings)508 is connected via through holes 506 to the second wiring layer(wirings)507 formed according to the one custom mask approach.

FIGS. 40A to 40H illustrate various patterns of a wiring cell, corresponding to the pattern of the basic cell 204, 205 shown in FIG. 37A.

As is explained with reference to FIGS. 37A to 37C, the through hole 506 formed inside the basic cell and the through hole 506a formed outside the basic cell constitutes a wiring obstruction pattern, where a connection between them is unnecessary. In view of this, each pattern of the wiring cell 510a to 510h shown in FIGS. 40A to 40H is formed so as to bypass the wiring obstruction pattern.

Figure 40A:
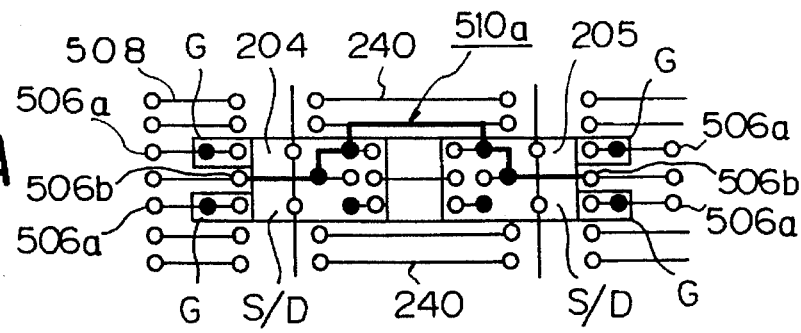
FIGS. 40A to 40H are pattern diagrams illustrating examples of a wiring cell applied to the third aspect of the present invention.
Figure 40B:
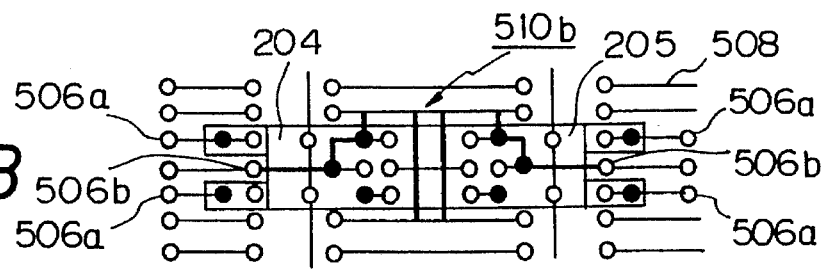
Figure 40C:
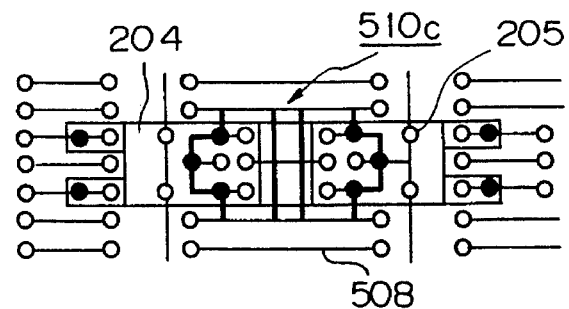
Figure 40D:
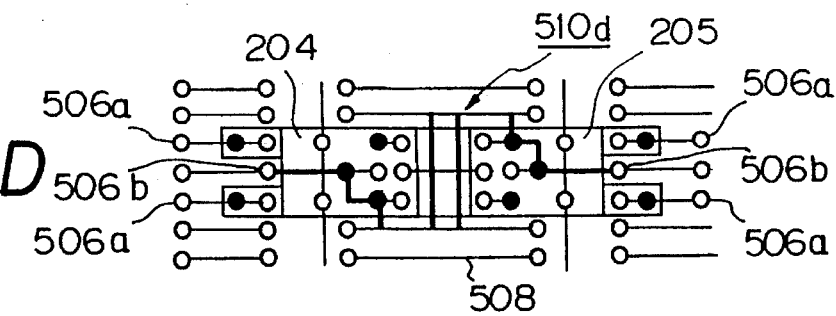
Figure 40E:
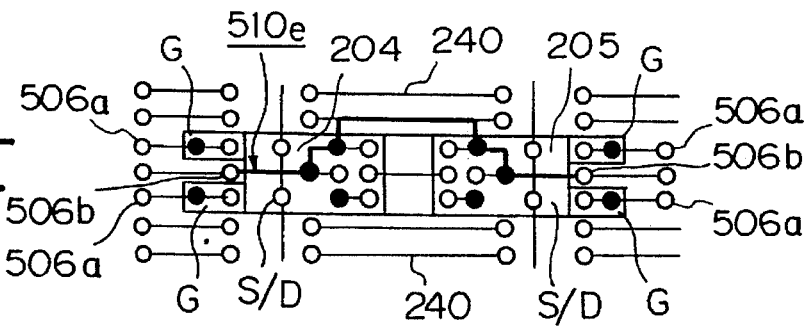
Figure 40F:
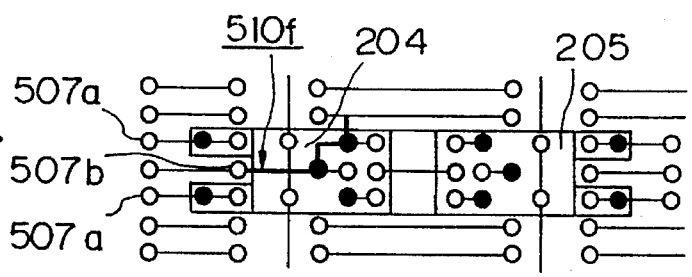
Figure 40G:
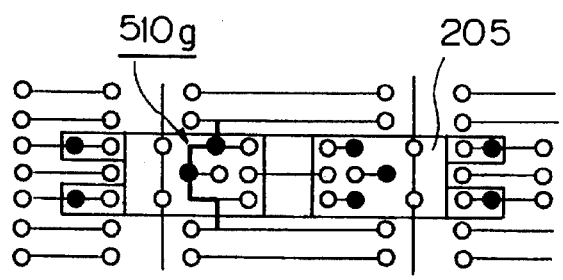
Figure 40H:
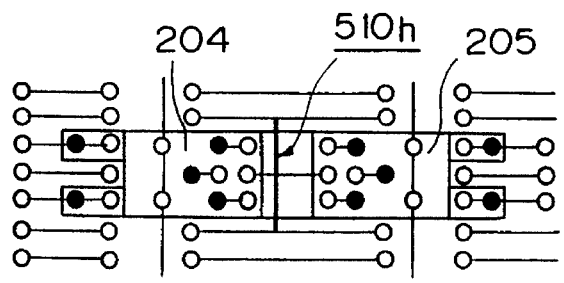

The wiring cell 510a shown in FIG. 40A is used for connecting a through hole 506b provided at the left end of the basic cell 204 (205) to another through hole 506b provided at the right end thereof. The wiring cell 510b shown in FIG. 40B is used for connecting each through hole 506b provided at the left and right ends of the basic cell 204 (205) to the first wiring layer(wirings) provided in the upper side thereof and connecting the first wiring layer(wirings) provided in the upper side thereof to the first wiring layer(wirings) provided in the lower side thereof. The wiring cell 510c shown in FIG. 40C is used for connecting the first wiring layer(wirings) provided in the upper side thereof to the first wiring layer(wirings) provided in the lower side thereof. The wiring cell 510d shown in FIG. 40D is used for connecting the through hole 506b provided at the left end thereof to the first wiring layer(wirings) provided in the lower side thereof, connecting the through hole 506b provided at the right end thereof to the first wiring layer(wirings) provided in the upper side thereof and connecting the first wiring layer(wirings) provided in the upper side thereof to the first wiring layer(wirings) provided in the lower side thereof.

Also, the wiring cells 510e to 510h shown in FIGS. 40E to 40H include an elemental pattern of the wiring cells 510a to 510d, respectively. By applying a symmetrical designing with respect to the central point, X-axis and Y-axis to the elemental pattern and overlapping the designed patterns so as to use as a wiring cell, it is possible to decrease the number of patterns to be prepared.

Figure 41:
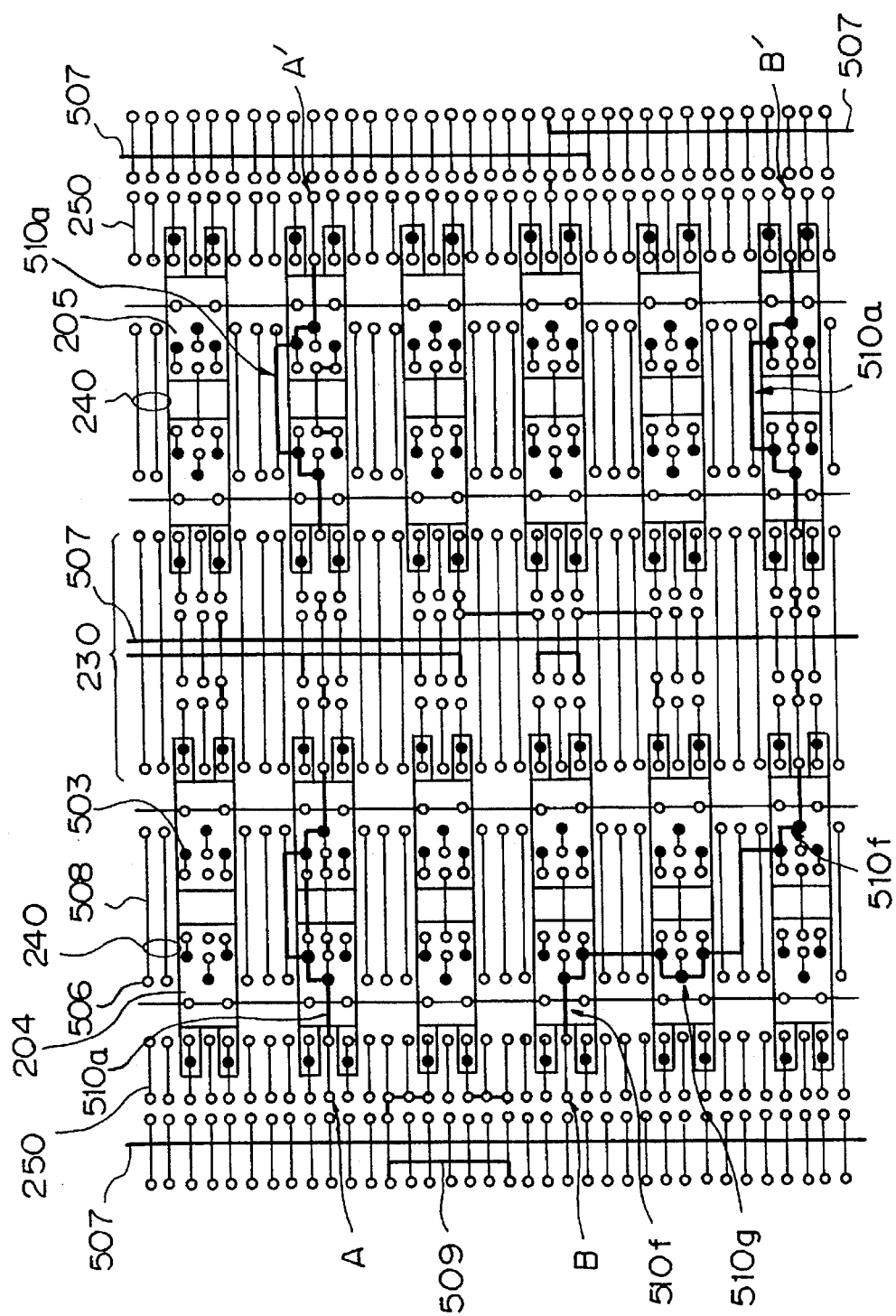
FIG. 41 is a pattern diagram illustrating an example of the wiring in the basic cell region.

FIG. 41 illustrates a wiring pattern of an example using each wiring cell shown in FIGS. 40A to 40H in the basic cell region.

In FIG. 41, the second wiring layer(wirings) 507 is formed according to the one custom mask approach and constituted by a suitable combination of the wiring cells 510a to 510h. Namely, the pattern between points A—A' is a combination of two wiring cells 510a, and the pattern between points B—B' is a combination of a cell symmetrical to the wiring cell 510f with respect to X-axis, the wiring cell 510g, a cell symmetrical to the wiring cell 510f with respect to Y-axis, and the wiring cell 510a, from the left.

Next, a method of designing the wiring in the basic cell region with relation to the third aspect of the present invention will be explained with reference to FIG. 35.

The designing apparatus 400 employed in the third aspect is different from that employed in the second aspect in that a wiring cell mask pattern memory means 402a is provided in place of the wiring mask pattern memory means 402, and them ask pattern 404a of the basic cell region is generated in place of the mask pattern 404 of the I/O cell region. Other constitution and the operation thereof are the same as those in the second aspect and, accordingly, the explanation thereof is omitted.

The wiring cell mask pattern memory means 402a stores a plurality of wiring cell mask pattern information concerning each pattern of the wiring cell 510a to 510h shown in FIGS. 40A to 40H.

Assuming that the fundamental mask pattern memory means 401 stores a fundamental mask pattern information concerning the basic cell array 206 shown in FIG. 39. When a command instructing each connection between points A—A' and points B—B' is input to the designing apparatus 400, the pattern synthesizing means 403 reads out a wiring cell mask pattern information having the shortest length for bypassing the wiring obstruction pattern, from among the plurality of wiring cell mask pattern information stored in the wiring cell mask pattern memory means 402a. The read out wiring cell mask pattern information is combined with the fundamental mask pattern information by the pattern synthesizing means 403, which generates the wiring mask pattern 404 of the basic cell array (region).

Thus, the designing of the wiring mask pattern of the basic cell region can be facilitated and, accordingly, it is possible to greatly reduce time needed for the designing. Accordingly, it is possible to form the wiring in the basic cell region using one custom mask approach and, accordingly, to greatly reduce time necessary for producing the master slice type LSI device. Also, since the length of the wiring to be formed is restricted to a minimum length, the wiring resistance can be decreased.

The method of producing the master slice type LSI device with relation to the third aspect of the present invention is the same as that in the second aspect thereof and, accordingly, the explanation thereof is omitted.

As explained above, it is possible to produce a desired master slice type LSI device easily and in a short period by suitably designing only the mask pattern of the second wiring layer including the bypass wiring region. Especially, since one custom mask approach is applied to the basic cell region, it is possible to greatly reduce the turnaround time of the device. Also, since unused regions in the basic cell region are effectively utilized by the one custom mask approach, it is possible to heighten the efficiency in wiring in the bypass wiring region.

Although the present invention has been disclosed and described by way of various embodiments, it is apparent to those skilled in the art that other embodiments and modifications of the present invention are possible without departing from the spirit or essential features thereof.

We claim:

1. A method of producing a semiconductor integrated circuit device using a master slice approach and employing a common master chip in which a plurality of different kinds of circuits may be formed in accordance with wiring changes on said master chip, said method comprising the steps of:

(a) forming a master chip, said master chip having a main surface and including a plurality of basic cells arrayed on said main surface, each basic cell having a fixed pattern regardless of the kind of circuit to be formed and including:

a pair of electrodes formed on said main surface and extending in spaced, parallel relationship in a longitudinal direction, each electrode having opposite end portions and a central portion, the central portions of said electrodes defining a separation region;

a p-type impurity region formed in said master chip on a first side of said separation region in the longitudinal direction of said electrodes;

an n-type impurity region formed in said master chip on a second, opposite side of said separation region; and a lead portion formed in each end portion and each central portion of each of said pair of electrodes;

(b) forming a first insulation layer on said master chip over at least said impurity regions and then forming contact holes at positions in said first insulation layer which are fixed regardless of the kind of circuit to be formed;

(c) forming a first wiring layer on said first insulation layer, the first wiring layer having a fixed wiring pattern regardless of the kind of circuit to be formed;

(d) forming a second insulation layer on said first wiring layer and then forming through holes at positions in said second insulation layer which are fixed regardless of the kind of circuit to be formed; and (e) forming a second wiring layer on said second insulation layer using a wiring pattern mask programmable in accordance with a specific kind of circuit to be formed and thereby defining the specific kind of circuit.

2. A method as set forth in claim 1, wherein said forming the second wiring layer in step (e) programs the master chip to a specific kind of circuit.

3. A method of set forth in claim 1, wherein said forming of said step (c) comprises the substep of (c1) forming the first wiring layer on the first insulation layer, the fixed wiring pattern of the first wiring layer including continuous wiring strips extending in a first direction substantially across the basic cells arrayed on the main surface of the master chip and serving as a power supply line.

4. A method of producing a semiconductor integrated circuit device using a master slice approach and employing a common master chip in which a plurality of different kinds of circuits may be formed in accordance with wiring changes on said master chip, said method comprising the steps of:

(a) forming a master chip, said master chip having a main surface and including a plurality of basic cells arrayed on said main surface, each basic cell having a fixed pattern regardless of the kind of circuit to be formed, at least one basic cell constituting a basic block, the basic block having fourteen wiring channels extending in parallel along a first direction and at least three wiring channels extending in parallel along a second direction perpendicular to said first direction and at least one cell-to-cell wiring channel adjacent to the at least one basic cell and including:

a pair of electrodes formed on said main surface and extending in spaced, parallel relationship along said second direction, each electrode having opposite end portions and a central portion, the central portions of said electrodes defining a separation region;

a p-type impurity region formed in said master chip on a first side of said separation region with respect to said first direction, having first, second and third impurity regions formed on a first side of said electrodes with respect to said second direction, on a second, opposite side thereof and therebetween, respectively;

an n-type impurity region formed in said chip on a second, opposite side of said separation region, having fourth, fifth and sixth impurity regions formed on a first side of said electrodes with respect to said second direction, on a second, opposite side thereof and therebetween, respectively; and six lead portions, four lead portions formed in each end portion thereof and two lead portions formed in each central portion thereof;

(b) forming a first insulation layer on said master chip and then forming contact holes at positions in said first insulation layer which are fixed regardless of the kind of circuit to be formed, said first insulation layer including at least one contact hole in each end portion and the first to sixth impurity regions;

(c) forming a first wiring layer having a fixed wiring pattern on said first insulation layer, said first wiring layer having a fixed pattern regardless of the kind of circuit to be formed and connecting a contact hole to a through hole in each end portion; connecting a pair of through holes between each said first and second impurity regions, between each said fourth and fifth impurity regions, respectively, along one of said fourteen wiring channels, and mainly serving as a power supply line; connecting a contact hole to a through hole in each first to sixth impurity regions; connecting a through hole in said third impurity region to a corresponding through hole in said sixth impurity region; and connecting through holes provided in said cell-to-cell wiring channel in an intermittent pattern so as to be out of contact with the connection serving as the power supply line;

(d) forming a second insulation layer on said first wiring layer and then forming through holes at positions in said second insulation layer which are fixed regardless of the kind of circuit to be formed, said second insulation layer including: at least one through hole in each end portion; at least two through holes in each said first to sixth impurity regions; and at least four through holes in said cell-to-cell wiring channel; and (e) forming a second wiring layer on said second insulation layer using a wiring pattern mask programmable in accordance with and thereby defining a separate kind of circuit to be formed.

5. A method as set forth in claim 4, wherein said forming the second wiring layer in step (e) programs the master chip to a specific kind of circuit.

6. A method as set forth in claim 4, wherein said forming said first wiring layer in step (c) comprises the steps of (c1) forming wirings used for the connections serving as the power supply line along said first direction; and (c2) forming wirings used for other connections along said second direction.

7. A method of producing a semiconductor integrated circuit device using a master slice approach and employing a common master chip in which a plurality of different kinds of circuits may be formed, said method comprising the steps of:

(a) forming on the master chip the following:
diffusion regions for transistors,
a first insulation layer on the master chip and over the diffusion regions and including contact holes at positions which are fixed regardless of the kind of circuit to be formed,
a first wiring layer on the first insulation layer having a fixed wiring pattern regardless of the kind of circuit to be formed, and
a second insulation layer on the first wiring layer, the Second insulation layer including through holes at positions which are fixed regardless of the kind of circuit to be formed; and (b) forming a second wiring layer connecting said through holes using a wiring pattern mask programmable in accordance with a specific kind of circuit to be formed.

8. A method as set forth in claim 7, further comprising a step of (c) forming a conduction layer on the second insulation layer prior to said forming the second wiring layer in step (b).

9. A method as set forth in claim 8, wherein said forming the second wiring layer in step (b) programs the master chip to a specific kind of circuit.

10. A method as set forth in claim 7, wherein said forming the first wiring layer in said step (a) comprises the substep of (a1) forming the first wiring layer on the first insulation layer, the fixed wiring pattern of the first wiring layer including continuous wiring strips extending in a first direction substantially across an array of the transistors on the master chip and serving as a power supply line.

11. A method of forming a customized semiconductor integrated circuit device, said method comprising the steps of:

(a) forming a master chip commonly employed for forming a plurality of different kinds of circuits, comprising the substeps of:

(a1) forming a plurality of basic cells in an array with regions therebetween, each basic cell including at least one transistor and terminal portions connected to the transistor, each basic cell having a fixed wiring pattern regardless of the kind of circuit to be formed;

(a2) forming, after said step (a1), a first wiring layer including a plurality of wiring strips above the basic cells and above the regions between adjacent basic cells, each wiring strip having a fixed pattern and including a terminal portion at each respective, opposite end of each wiring strip, wherein positions of the terminal portions of each basic cell are aligned below positions of the terminal portions of each wiring strip of the first wiring layer;

(a3) forming, after said step (a2), an insulation layer covering the first wiring layer, the insulation layer including through holes at positions which are fixed regardless of the kind of circuit to be formed; and (b) customizing the master chip, thus formed, by forming a second wiring layer on the insulation layer using a wiring pattern mask changeable in accordance with the kind of a circuit to be formed, the second wiring layer connecting the terminal portions of each basic cell to portions of each wiring strip and connecting basic cells to one another.

12. A method as set forth in claim 11, wherein said forming of said step (a2) comprises the substep of (a2i) forming the first wiring layer above the basic cells and above the regions between adjacent cells, the fixed wiring pattern including continuous wiring strips extending in a first direction substantially across the array of the basic cells of the master chip and serving as a power supply line.

* * * * *

UNITED STATES PATENT AND TRADEMARK OFFICE
CERTIFICATE OF CORRECTION

PATENT NO.  : 5,506,162
DATED       : April 9, 1996
INVENTOR(S) : Yoshio HIROSE et al.

It is certified that error appears in the above-indentified patent and that said Letters Patent is hereby corrected as shown below:

<u>Title Page</u>, Item 75, change "Shigeki Kawahara" to --Kawahara Shigeki--.

<u>Col. 1</u>,
    line 40, change "Layer" to --layer--; and
    line 53, delete ":".

<u>Col. 6</u>,  line 13, change "wining" to --wiring--.
<u>Col. 10</u>, line 14, change "Fig. 11" to --Fig. 11--.
<u>Col. 11</u>, line 38, change "con, on" to --common--.
<u>Col. 15</u>, line 40, change "," (first occurrence) to --.--.
<u>Col. 16</u>, line 21, change "fore" to --form--;
    line 29, change "coyle" to --double--.
<u>Col. 20</u>, line 35, change "Second" to --second--.

Signed and Sealed this

Third Day of September, 1996

BRUCE LEHMAN

*Attest:*

*Attesting Officer*   Commissioner of Patents and Trademarks